US012647103B2

(12) United States Patent　　(10) Patent No.: US 12,647,103 B2

Kuroyanagi et al.　　(45) Date of Patent:　Jun. 2, 2026

(54) ACOUSTIC WAVE DEVICE, RADIO FREQUENCY MODULE, AND COMMUNICATION DEVICE

(71) Applicant: Murata Manufacturing Co., Ltd., Nagaokakyo (JP)

(72) Inventors: Takuma Kuroyanagi, Nagaokakyo (JP); Yoshihiro Yoshimura, Nagaokakyo (JP); Kiyoshi Aikawa, Nagaokakyo (JP); Takahiro Yamashita, Nagaokakyo (JP); Yuusuke Suzuki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 71 days.

(21) Appl. No.: 18/826,217

(22) Filed: Sep. 6, 2024

(65) Prior Publication Data

US 2025/0007496 A1　　Jan. 2, 2025

Related U.S. Application Data

(63) Continuation of application No. PCT/JP2023/014389, filed on Apr. 7, 2023.

(30) Foreign Application Priority Data

Apr. 12, 2022　(JP) ................................. 2022-065871

(51) Int. Cl.
　　*H03H 9/64*　　(2006.01)
　　*H03H 9/13*　　(2006.01)
　　(Continued)

(52) U.S. Cl.
　　CPC .......... *H03H 9/6483* (2013.01); *H03H 9/133* (2013.01); *H03H 9/145* (2013.01);
　　(Continued)

(58) Field of Classification Search
　　CPC ........ H03H 9/6483; H03H 9/725; H03H 9/25; H03H 9/64; H03H 9/72; H03H 9/145;
　　(Continued)

(56) References Cited

U.S. PATENT DOCUMENTS 9,634,641 B2 * 4/2017 Nishimura ........... H03H 9/0566
12,471,206 B2 * 11/2025 Hanaoka .............. H03H 9/0566
(Continued)

FOREIGN PATENT DOCUMENTS

JP　　2000-236230 A　　8/2000
JP　　2020-014094 A　　1/2020
(Continued)

OTHER PUBLICATIONS

International Search Report and Written Opinion mailed on Jun. 20, 2023, received for PCT Application PCT/JP2023/014389, filed on Apr. 7, 2023, 9 pages including English Translation.

*Primary Examiner* — Lincoln D Donovan
*Assistant Examiner* — Tyler J Pereny
(74) *Attorney, Agent, or Firm* — XSENSUS LLP

(57) ABSTRACT

An acoustic wave device includes a first transmission filter; and a second transmission filter stacked on the first transmission filter so that a first functional surface of the first transmission filter and a second functional surface of the second transmission filter face each other at a predetermined distance. The first transmission filter includes a first input terminal and a first acoustic wave resonator. The second transmission filter includes a second input terminal and a second acoustic wave resonator. The first acoustic wave resonator includes a first functional electrode formed on the first functional surface. The second acoustic wave resonator includes a second functional electrode formed on the second functional surface. In a plan view along a thickness direction of the first and second transmission filters, a first formation (Continued)

region of the first functional electrode and a second formation region of the second functional electrode do not overlap each other.

17 Claims, 25 Drawing Sheets

(51) Int. Cl.

| | | |
|---|---|---|
| *H03H 9/145* | (2006.01) | |
| *H03H 9/22* | (2006.01) | |
| *H03H 9/25* | (2006.01) | |
| *H03H 9/56* | (2006.01) | |

(52) U.S. Cl.
CPC ................ *H03H 9/22* (2013.01); *H03H 9/25* (2013.01); *H03H 9/568* (2013.01)

(58) Field of Classification Search
CPC .... H03H 9/706; H03H 9/568; H03H 9/02559; H03H 9/542; H03H 9/205; H03H 9/02574; H03H 9/54; H03H 9/605; H03H 9/0009; H03H 9/02535; H03H 9/02834; H03H 9/70; H03H 9/02007; H03H 9/0576; H03H 9/1092; H03H 9/14541; H03H 9/0014; H03H 9/058; H03H 9/059; H03H 9/105; H03H 9/1071; H03H 9/171; H03H 9/174; H03H 9/02086; H03H 9/02992; H03H 9/0566; H03H 9/0571; H03H 3/08; H03F 2200/451; H03F 3/21; H03F 3/195; H03F 3/245; H04B 1/40; H04B 1/0057; H04B 1/38; H04B 1/50

See application file for complete search history.

(56) References Cited

U.S. PATENT DOCUMENTS

| | | | | |
|---|---|---|---|---|
| 2019/0245514 A1* | 8/2019 | Takata | ............... | H03H 9/02858 |
| 2022/0263535 A1* | 8/2022 | Tani | ......................... | H04B 1/00 |

FOREIGN PATENT DOCUMENTS

| | | | |
|---|---|---|---|
| JP | 2020-155967 | A | 9/2020 |
| JP | 2021-034745 | A | 3/2021 |
| JP | 2021-158655 | A | 10/2021 |
| WO | 2020261777 | A1 | 12/2020 |

* cited by examiner

ACOUSTIC WAVE DEVICE, RADIO FREQUENCY MODULE, AND COMMUNICATION DEVICE

CROSS-REFERENCE TO RELATED APPLICATIONS

The present application is a continuation application of PCT International Application No. PCT/JP2023/014389 filed on Apr. 7, 2023, designating the United States of America, which is based on and claims priority to Japanese patent application JP 2022-065871, filed Apr. 12, 2022. The entire disclosures of the above-identified applications, including the specifications, the drawings, and the claims are incorporated herein by reference in their entirety.

BACKGROUND

A radio frequency module may include a mounting substrate, a first transmission filter, a second transmission filter, and a power amplifier.

The mounting substrate has a first main surface and a second main surface. The first transmission filter and the second transmission filter are provided on the first main surface of the mounting substrate, in a state of being stacked in a thickness direction of the mounting substrate in an order of the first transmission filter and the second transmission filter from the first main surface side of the mounting substrate.

SUMMARY OF DISCLOSURE

The present disclosure generally relates to an acoustic wave device, a radio frequency module, and a communication device, and more specifically, to an acoustic wave device including a first transmission filter and a second transmission filter, a radio frequency module including the acoustic wave device, and a communication device including the radio frequency module.

One aspect of the present disclosure provides an acoustic wave device includes a first transmission filter; and a second transmission filter stacked on the first transmission filter so that a first functional surface of the first transmission filter and a second functional surface of the second transmission filter face each other at a predetermined distance. The first transmission filter includes a first input terminal and a first acoustic wave resonator. The second transmission filter includes a second input terminal and a second acoustic wave resonator. The first acoustic wave resonator includes a first functional electrode formed on the first functional surface. The second acoustic wave resonator includes a second functional electrode formed on the second functional surface. In a plan view along a thickness direction of the first and second transmission filters, a first formation region of the first functional electrode and a second formation region of the second functional electrode do not overlap each other.

One aspect of the present disclosure provides a radio frequency module including a mounting substrate, and the acoustic wave device. The mounting substrate includes a main surface. The acoustic wave device is disposed on the main surface of the mounting substrate.

One aspect of the present disclosure provides a radio frequency module including a mounting substrate, a first transmission filter disposed on the mounting substrate, a second transmission filter disposed above the first transmission filter, and a conductive connection member connected to the mounting substrate and separating the second transmission filter from the substrate. The first transmission filter includes a first input terminal connected to a first power amplifier, and a first acoustic wave resonator. The second transmission filter includes a second input terminal connected to a second power amplifier, and a second acoustic wave resonator. The first acoustic wave resonator includes a first functional electrode formed on a first functional surface. The second acoustic wave resonator includes a second functional electrode formed on a second functional surface. The second transmission filter is disposed to face the first transmission filter in a thickness direction of the second transmission filter. In a plan view along a thickness direction of the first and second transmission filters, a first formation region of the first functional electrode and a second formation region of the second functional electrode do not overlap each other.

One aspect of the present disclosure provides a communication device including the radio frequency module and a signal processing circuit. The signal processing circuit is connected to the radio frequency module.

Advantageous Effects of Disclosure

In the acoustic wave device, the radio frequency module, and the communication device according to the above-described aspects of the present disclosure, it is possible to suppress the deterioration in the filter characteristics of each of the first transmission filter and the second transmission filter due to the temperature rise in the first transmission filter and the second transmission filter.

DETAILED DESCRIPTION OF EXEMPLARY EMBODIMENTS

Figure 1:
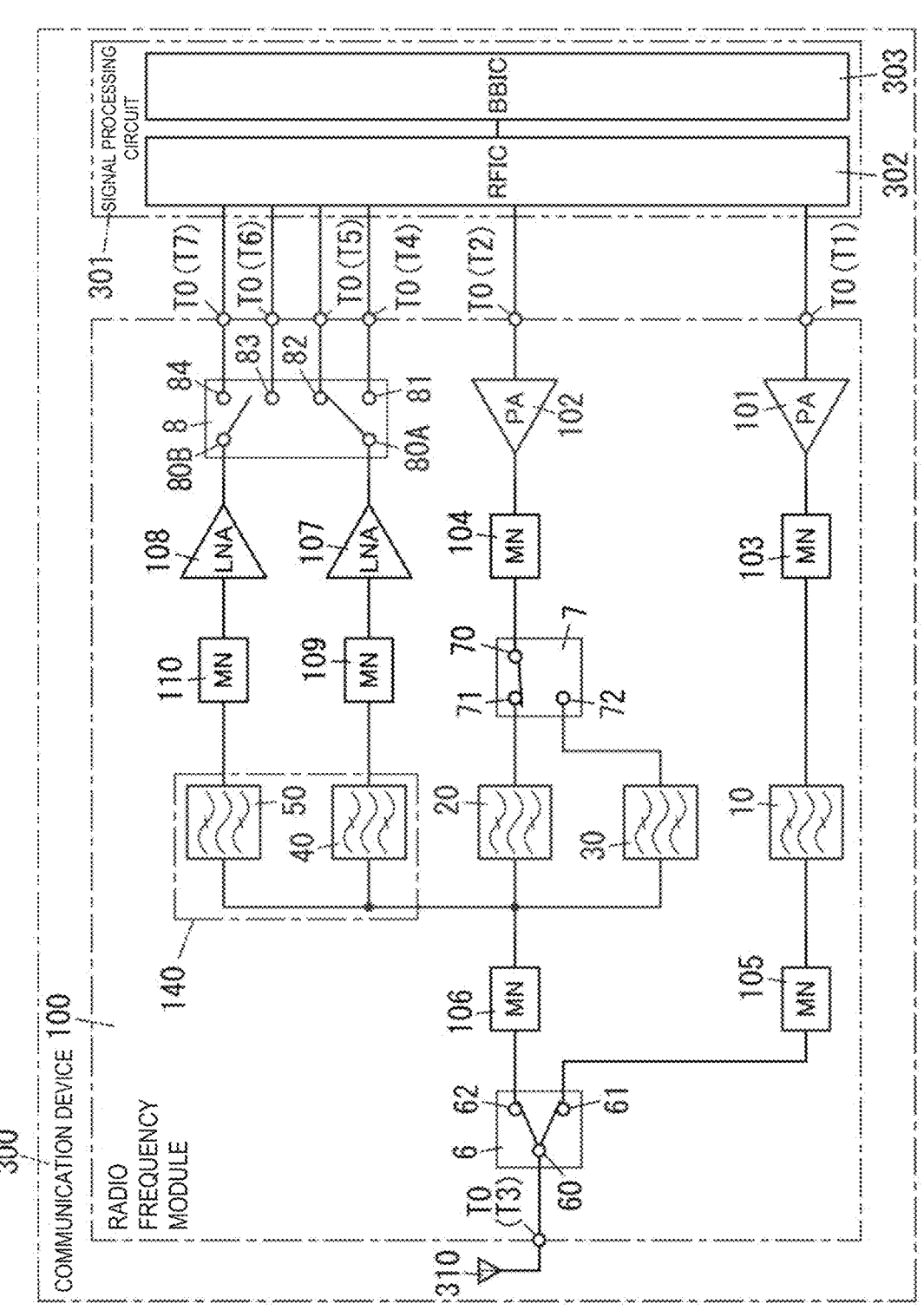
FIG. 1 is a circuit configuration diagram of a radio frequency module and a communication device according to Exemplary embodiment 1.

The drawings, which are referred to in Exemplary embodiments 1 to 4 and the like described below, are all schematic diagrams, and a ratio of respective sizes or thicknesses of the constituent elements in the drawing does not necessarily reflect an actual dimensional ratio.

Exemplary Embodiment 1

In a case where, for example, two transmission filters (first transmission filter and second transmission filter) used for simultaneous communication, such as carrier aggregation, are disposed to overlap each other in the thickness direction of the mounting substrate in the radio frequency module, it is necessary to prevent a deterioration in filter characteristics due to a temperature rise in the first transmission filter and the second transmission filter.

An object of the present disclosure is to provide an acoustic wave device, a radio frequency module, and a communication device, which can suppress a deterioration in filter characteristics of each of a first transmission filter and a second transmission filter due to a temperature rise in the first transmission filter and the second transmission filter.

Hereinafter, an acoustic wave device ST1 (see FIGS. 5 and 8), a radio frequency module 100, and a communication device 300 according to Exemplary embodiment 1 will be described based on FIGS. 1 to 8.

(1) Overview

Figure 8:
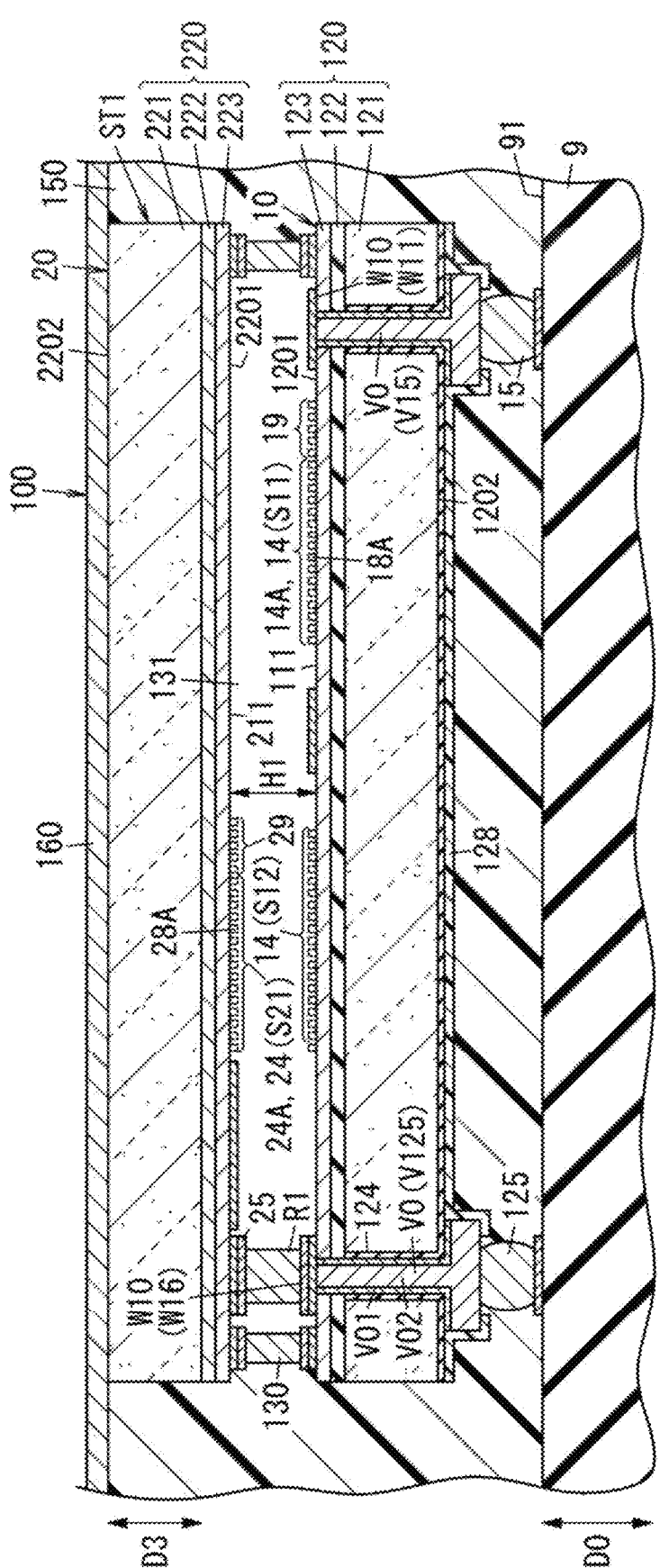
FIG. 8 is a cross-sectional view illustrating the acoustic wave device, which is taken along a line X2-X2 of FIG. 6 and FIG. 7.

The acoustic wave device ST1 according to Exemplary embodiment 1 includes a first transmission filter 10 and a second transmission filter 20. In the acoustic wave device ST1, as illustrated in FIG. 8, the first transmission filter 10 and the second transmission filter 20 are stacked. The radio frequency module 100 according to Exemplary embodiment 1 includes a mounting substrate 9 and the acoustic wave device ST1, as illustrated in FIG. 8. Therefore, the radio frequency module 100 includes the mounting substrate 9, the first transmission filter 10, and the second transmission filter 20. The mounting substrate 9 includes a main surface 91. The first transmission filter 10 is disposed on the main surface 91 of the mounting substrate 9. The first transmission filter 10 includes a first input terminal 15. The first input terminal 15 of the first transmission filter 10 is connected to a first power amplifier 101 (see FIG. 3). The second transmission filter 20 is located on a side of the first transmission filter 10 opposite to the mounting substrate 9 side. The second transmission filter 20 includes a second input terminal 25. The second input terminal 25 of the second transmission filter 20 is connected to a second power amplifier 102 (see FIG. 3). The first transmission filter 10 includes a first acoustic wave filter including a first acoustic wave resonator 14A closest to the first input terminal 15 and having a pass band including a frequency band of a first communication band. The second transmission filter 20 includes a second acoustic wave filter including a second acoustic wave resonator 24A closest to the second input terminal 25 and having a pass band including a frequency band of a second communication band. The first communication band and the second communication band are communication bands available for simultaneous communication. The first acoustic wave resonator 14A and the second acoustic wave resonator 24A do not overlap each other in plan view in a thickness direction D0 of the mounting substrate 9. In the radio frequency module 100 according to Exemplary embodiment 1, the second communication band is a communication band different from the first communication band.

The radio frequency module 100 is used, for example, in the communication device 300 (see FIG. 1). The communication device 300 is, for example, a cellular phone (for example, a smartphone), but the communication device 300 is not limited to this and may be, for example, a wearable terminal (for example, a smart watch). The radio frequency module 100 is, for example, a module that is compatible with a fourth generation mobile communication (4G) standard or a fifth generation mobile communication (5G) standard. The 4G standard is, for example, a third generation partnership project (3GPP) (registered trademark) long term evolution (LTE) standard (registered trademark). The 5G standard is, for example, 5G new radio (NR). The radio frequency module 100 is, for example, a module that is compatible with carrier aggregation and dual connectivity.

The radio frequency module 100 is also compatible with two-uplink carrier aggregation, in which two frequency bands are used simultaneously in the uplink.

As illustrated in FIG. 1, the communication device 300 includes the radio frequency module 100 and a signal processing circuit 301. The communication device 300 further includes an antenna 310. The communication device 300 may include a circuit board on which the radio frequency module 100 is mounted. The circuit board is, for example, a printed wiring board. The circuit board includes a ground electrode to which a ground potential is applied.

(2) Details

Hereinafter, circuit configurations of the radio frequency module 100 and the communication device 300 will be described, and then a structure of each of the acoustic wave device ST1 and the radio frequency module 100 will be described in more detail.

(2.1) Circuit Configuration of Radio Frequency Module

The circuit configuration of the radio frequency module 100 according to Exemplary embodiment 1 will be described with reference to FIG. 1.

The radio frequency module 100 is, for example, configured to amplify a reception signal input from the antenna 310 and output the amplified reception signal to the signal processing circuit 301. Further, the radio frequency module 100 is, for example, configured to amplify a transmission signal input from the signal processing circuit 301 and output the amplified transmission signal to the antenna 310. The signal processing circuit 301 is not a constituent element of the radio frequency module 100, but is a constituent element of the communication device 300 including the radio frequency module 100. The radio frequency module 100 is controlled by, for example, the signal processing circuit 301 provided in the communication device 300.

The radio frequency module 100 includes a plurality of (for example, three) transmission filters (first transmission filter 10, second transmission filter 20, and third transmission filter 30). Further, the radio frequency module 100 includes a plurality of (for example, two) power amplifiers (first power amplifier 101 and second power amplifier 102), a plurality of (for example, two) reception filters (first reception filter 40 and second reception filter 50), a plurality of (for example, two) low noise amplifiers (first low noise amplifier 107 and second low noise amplifier 108), a first switch 6, a second switch 7, a third switch 8, and a plurality of external connection terminals T0. The plurality of external connection terminals T0 include an antenna terminal T3, a plurality of signal input terminals (first signal input terminal T1 and second signal input terminal T2), a plurality of signal output terminals (first signal output terminal T4, second signal output terminal T5, third signal output terminal T6, and fourth signal output terminal T7), and a plurality of external ground terminals T8 (see FIG. 5). Further, the radio frequency module 100 includes a plurality of (for example, two) output matching circuits (first output matching circuit 103 and second output matching circuit 104), a plurality of (for example, two) input matching circuits (first input matching circuit 109 and second input matching circuit 110), and a plurality of (for example, two) matching circuits (first matching circuit 105 and second matching circuit 106).

Hereinafter, the circuit configuration of the radio frequency module 100 will be described in more detail.

The first transmission filter 10, the second transmission filter 20, and the third transmission filter 30 are transmission filters of which pass bands are different frequency bands from each other. The first transmission filter 10 has a pass band including a transmission band of the first communication band. The second transmission filter 20 has a pass band including a transmission band of the second communication band different from the first communication band. The third transmission filter 30 has a pass band including a transmission band of a third communication band different from the first communication band and the second communication band. The first communication band is, for example, Band 41 of the 3GPP LTE standard or n41 of the 5G NR standard. The second communication band is, for example, Band 3 of the 3GPP LTE standard or n3 of the 5G NR standard. The third communication band is, for example, Band 1 of the 3GPP LTE standard or n1 of the 5G NR standard. The first communication band is a communication band used for communication compatible with time division duplex (TDD) as a communication method, but is not limited to this, and may be a communication band used for communication compatible with frequency division duplex (FDD) as a communication method. The second communication band is a communication band used for communication compatible with FDD as a communication method, but is not limited to this, and may be a communication band used for communication compatible with TDD as a communication method. The third communication band is a communication band used for communication compatible with FDD as a communication method, but is not limited to this, and may be a communication band used for communication compatible with TDD as a communication method. The first transmission filter 10 includes the first input terminal 15 and a first output terminal 16 (see FIG. 2A). The second transmission filter 20 includes the second input terminal 25 and a second output terminal 26 (see FIG. 2B). The third transmission filter 30 includes a third input terminal 35 and a third output terminal 36 (see FIG. 3).

The first reception filter 40 and the second reception filter 50 are reception filters of which pass bands are different frequency bands from each other. The first reception filter 40 has a pass band including a reception band of the second communication band. The second reception filter 50 has a pass band including a reception band of the third communication band. The second communication band is, for example, Band 3 of the 3GPP LTE standard or n3 of the 5G NR standard. The third communication band is, for example, Band 1 of the 3GPP LTE standard or n1 of the 5G NR standard.

The first power amplifier 101 includes an input terminal and an output terminal. The first power amplifier 101 amplifies the transmission signal input to the input terminal of the first power amplifier 101 and outputs the amplified transmission signal from the output terminal of the first power amplifier 101. The input terminal of the first power amplifier 101 is connected to the first signal input terminal T1. The first signal input terminal T1 is a terminal for inputting a radio frequency signal (transmission signal) from an external circuit (for example, signal processing circuit 301) to the radio frequency module 100. The input terminal of the first power amplifier 101 is connected to the signal processing circuit 301 via, for example, the first signal input terminal T1. The output terminal of the first power amplifier 101 is connected to the first input terminal 15 of the first transmission filter 10 via the first output matching circuit 103.

The second power amplifier 102 includes an input terminal and an output terminal. The second power amplifier 102 amplifies the transmission signal input to the input terminal of the second power amplifier 102 and outputs the amplified transmission signal from the output terminal of the second power amplifier 102. The input terminal of the second power amplifier 102 is connected to the second signal input terminal T2. The second signal input terminal T2 is a terminal for inputting the radio frequency signal (transmission signal) from the external circuit (for example, signal processing circuit 301) to the radio frequency module 100. The input terminal of the second power amplifier 102 is connected to the signal processing circuit 301 via, for example, the second signal input terminal T2. The output terminal of the second power amplifier 102 is connected to a common terminal 70 of the second switch 7 via the second output matching circuit 104, and can be connected to the second transmission filter 20 and the third transmission filter 30 via the second switch 7. The second power amplifier 102 is a power amplifier capable of amplifying the radio frequency signal in the pass band of the second transmission filter 20 and the radio frequency signal in the pass band of the third transmission filter 30.

The first power amplifier 101 and the second power amplifier 102 are compatible with different power classes. The "power class" means a classification of output power of a terminal (communication device 300) (user equipment power class) defined by the maximum output power and the like, the output power is higher as the number described next to the "power class" is smaller. For example, the maximum output power (29 dBm) of power class 1 is higher than the maximum output power (26 dBm) of power class 2, and the maximum output power (26 dBm) of power class 2 is higher than the maximum output power (23 dBm) of power class 3. The measurement of the maximum output power is performed by using a method defined by, for example, 3GPP. The first power amplifier 101 is compatible with a first power class (for example, power class 3), and the second power amplifier 102 is compatible with a second power class (for example, power class 2) of which the maximum output power is higher than that of the first power class.

The radio frequency module 100 may further include a controller. The controller controls the first power amplifier 101 and the second power amplifier 102, for example, in response to a control signal from the signal processing circuit 301.

Figure 2A:
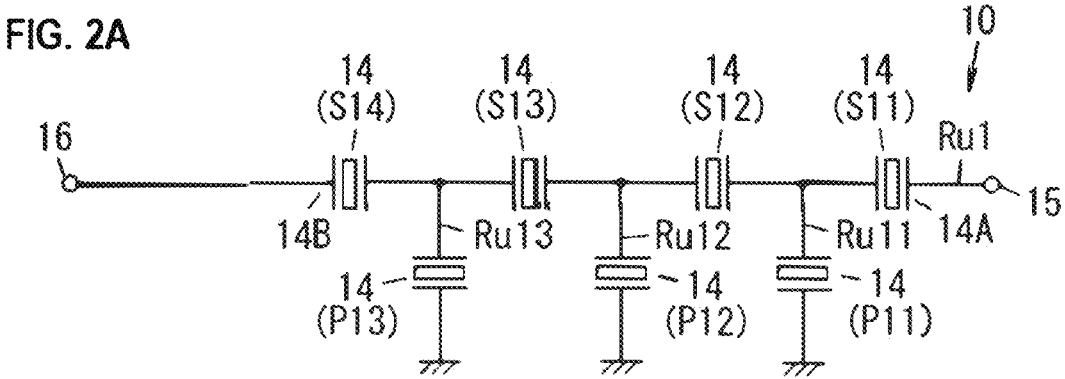
FIG. 2A is a circuit diagram of a first transmission filter in the radio frequency module.

The first output matching circuit 103 is connected between the output terminal of the first power amplifier 101 and the first input terminal 15 of the first transmission filter 10 (see FIG. 2A). The first output matching circuit 103 is a circuit for achieving impedance matching between the first power amplifier 101 and the first transmission filter 10, and includes, for example, a plurality of inductors and a plurality of capacitors. The second output matching circuit 104 is connected between the output terminal of the second power amplifier 102 and the common terminal 70 of the second switch 7. The second output matching circuit 104 is a circuit for achieving impedance matching between the second power amplifier 102, the second transmission filter 20, and the third transmission filter 30, and includes, for example, a plurality of inductors and a plurality of capacitors.

The first low noise amplifier 107 includes an input terminal and an output terminal. The first low noise amplifier 107 amplifies the reception signal input to the input terminal of the first low noise amplifier 107 and outputs the amplified reception signal from the output terminal of the first low noise amplifier 107. The input terminal of the first low noise amplifier 107 is connected to the first reception filter 40 via the first input matching circuit 109. The output terminal of the first low noise amplifier 107 is connected to a first common terminal 80A of the third switch 8. The output terminal of the first low noise amplifier 107 is connected to the signal processing circuit 301 via, for example, the first signal output terminal T4 or the second signal output terminal T5. The first signal output terminal T4 and the second signal output terminal T5 are terminals for outputting the radio frequency signal (reception signal) from the first low noise amplifier 107 to the external circuit (for example, the signal processing circuit 301).

The second low noise amplifier 108 includes an input terminal and an output terminal. The second low noise amplifier 108 amplifies the reception signal input to the input terminal of the second low noise amplifier 108 and outputs the amplified reception signal from the output terminal of the second low noise amplifier 108. The input terminal of the second low noise amplifier 108 is connected to the second reception filter 50 via the second input matching circuit 110. The output terminal of the second low noise amplifier 108 is connected to a second common terminal 80B of the third switch 8. The output terminal of the second low noise amplifier 108 is connected to the signal processing circuit 301 via, for example, the third signal output terminal T6 or the fourth signal output terminal T7. The third signal output terminal T6 and the fourth signal output terminal T7 are terminals for outputting the radio frequency signal (reception signal) from the second low noise amplifier 108 to the external circuit (for example, the signal processing circuit 301).

The first input matching circuit 109 is a circuit for achieving impedance matching between the first low noise amplifier 107 and the first reception filter 40. The first input matching circuit 109 includes, for example, an inductor L9 (see FIG. 3). The second input matching circuit 110 is a circuit for achieving impedance matching between the second low noise amplifier 108 and the second reception filter 50. The second input matching circuit 110 includes, for example, an inductor L10 (see FIG. 3).

The first switch 6 includes a common terminal 60 and a plurality of (for example, two) selection terminals 61 and 62. In the first switch 6, the common terminal 60 is connected to the antenna terminal T3. The radio frequency module 100 is not limited to a case where the common terminal 60 and the antenna terminal T3 are connected directly not via another circuit element, the common terminal 60 and the antenna terminal T3 may also be connected via, for example, a low pass filter and a coupler. The selection terminal 61 is connected to the first output terminal 16 (see FIG. 2A) of the first transmission filter 10 via the first matching circuit 105. The selection terminal 62 is connected to a node between the second output terminal 26 (see FIG. 2) of the second transmission filter 20, the third output terminal 36 (see FIG. 3) of the third transmission filter 30, the first reception filter 40, and the second reception filter 50 via the second matching circuit 106. The first switch 6 is, for example, a switch capable of connecting at least one or more of the plurality of selection terminals 61 and 62 to the common terminal 60. Here, the first switch 6 is, for example, a switch capable of one-to-one and one-to-many connections. The first switch 6 is, for example, a switch integrated circuit (IC).

The first switch 6 is controlled by, for example, the signal processing circuit 301. The first switch 6 switches the connection state between the common terminal 60 and the plurality of selection terminals 61 and 62 in response to a control signal from an RF signal processing circuit 302 of the signal processing circuit 301.

The second switch 7 includes the common terminal 70 and a plurality of (for example, two) selection terminals 71 and 72. In the second switch 7, the common terminal 70 is connected to the output terminal of the second power amplifier 102 via the second output matching circuit 104. The selection terminal 71 is connected to the second input terminal 25 (see FIG. 2B) of the second transmission filter 20. The selection terminal 72 is connected to the third input terminal 35 (see FIG. 3) of the third transmission filter 30. The second switch 7 is, for example, a switch capable of connecting at least one or more of the plurality of selection terminals 71 and 72 to the common terminal 70. Here, the second switch 7 is, for example, a switch capable of one-to-one and one-to-many connections. The second switch 7 is, for example, a switch IC.

The second switch 7 is controlled by, for example, the signal processing circuit 301. The second switch 7 switches the connection state between the common terminal 70 and the plurality of selection terminals 71 and 72 in response to a control signal from the RF signal processing circuit 302 of the signal processing circuit 301.

The third switch 8 includes the first common terminal 80A, a second common terminal 80B, a plurality of (for example, two) first selection terminals 81 and 82 that can be connected to the first common terminal 80A, and a plurality of (for example, two) second selection terminals 83 and 84 that can be connected to the second common terminal 80B. In the third switch 8, the first common terminal 80A is connected to the output terminal of the first low noise amplifier 107. Further, in the third switch 8, the second common terminal 80B is connected to the output terminal of the second low noise amplifier 108. Further, in the third switch 8, the first selection terminal 81 is connected to the first signal output terminal T4. Further, in the third switch 8, the first selection terminal 82 is connected to the second signal output terminal T5. Further, in the third switch 8, the second selection terminal 83 is connected to the third signal output terminal T6. Further, in the third switch 8, the second selection terminal 84 is connected to the fourth signal output terminal T7. The third switch 8 is, for example, a switch capable of simultaneously performing the connection between the first common terminal 80A and one of the two first selection terminals 81 and 82, and the connection between the second common terminal 80B and one of the two second selection terminals 83 and 84. In addition, the third switch 8 is, for example, a switch capable of performing only the connection between the first common terminal 80A and one of the plurality of (four) selection terminals (first selection terminals 81 and 82 and second selection terminals 83 and 84). In addition, the third switch 8 is a switch capable of performing only the connection between the second common terminal 80B and one of the plurality of (four) selection terminals (first selection terminals 81 and 82 and second selection terminals 83 and 84). The third switch 8 is, for example, a switch IC.

The third switch 8 is controlled by, for example, the signal processing circuit 301. In this case, the third switch 8 switches the connection state between the first common terminal 80A and the second common terminal 80B, and the four selection terminals (first selection terminal 81, first selection terminal 82, second selection terminal 83, and second selection terminal 84) in response to the control signal from the RF signal processing circuit 302 of the signal processing circuit 301.

(2.2) Circuit Configurations of First Transmission Filter and Second Transmission Filter As illustrated in FIG. 2A, the first transmission filter 10 includes the first acoustic wave filter including a plurality of (seven in the illustrated example) acoustic wave resonators 14. The first acoustic wave filter included in the first transmission filter 10 is, for example, a ladder filter. The seven acoustic wave resonators 14 include four series arm resonators S11 to S14 and three parallel arm resonators P11 to P13. The four series arm resonators S11, S12, S13, and S14 are provided on a first signal route Ru1 (hereinafter, also referred to as a series arm route Ru1) between the first input terminal 15 and the first output terminal 16. The four series arm resonators S11, S12, S13, and S14 are connected in series on the series arm route Ru1. In the first acoustic wave filter, on the series arm route Ru1, the series arm resonator S11, the series arm resonator S12, the series arm resonator S13, and the series arm resonator S14 are arranged in order of the series arm resonator S11, the series arm resonator S12, the series arm resonator S13, and the series arm resonator S14 from the first input terminal 15 side. The parallel arm resonator P11 is provided on a route Ru11 between a route between the series arm resonator S11 and the series arm resonator S12 in the series arm route Ru1 and the ground. The parallel arm resonator P12 is provided in a route Ru12 between a route between the series arm resonator S12 and the series arm resonator S13 in the series arm route Ru1 and the ground. The parallel arm resonator P13 is provided on a route Ru13 between a route between the series arm resonator S13 and the series arm resonator S14 in the series arm route Ru1 and the ground.

The plurality of acoustic wave resonators 14 include the first acoustic wave resonator 14A. The first acoustic wave resonator 14A is the acoustic wave resonator 14 closest to the first input terminal 15 among the plurality of acoustic wave resonators 14. The "acoustic wave resonator 14 closest to the first input terminal 15" means the acoustic wave resonator 14 that is directly connected to the first input terminal 15 not via any other acoustic wave resonators 14. In other words, the "acoustic wave resonator 14 closest to the first input terminal 15" means the acoustic wave resonator 14 that is electrically closest to the first input terminal 15 regardless of a physical distance. In a case where the series arm resonator S11 closest to the first input terminal 15 and the parallel arm resonator P11 closest to the first input terminal 15 are present, at least one of the series arm resonator S11 closest to the first input terminal 15 or the parallel arm resonator P11 closest to the first input terminal 15 is the first acoustic wave resonator 14A. Further, the plurality of acoustic wave resonators 14 include a third acoustic wave resonator 14B closest to the first output terminal 16 of the first transmission filter 10.

Figure 2B:
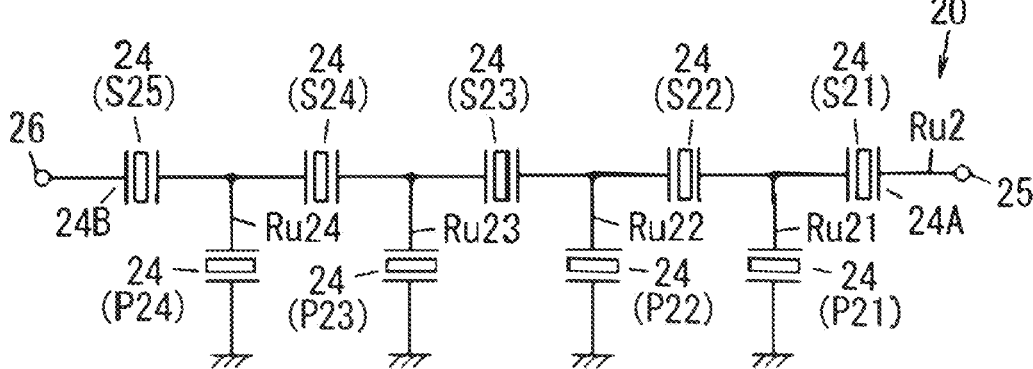
FIG. 2B is a circuit diagram of a second transmission filter in the radio frequency module.

As illustrated in FIG. 2B, the second transmission filter 20 includes the second acoustic wave filter including a plurality of (nine in the illustrated example) acoustic wave resonators 24. The second acoustic wave filter included in the second transmission filter 20 is, for example, a ladder filter. The nine acoustic wave resonators 24 include five series arm resonators S21 to S25 and four parallel arm resonators P21 to P24. The five series arm resonators S21, S22, S23, S24, and S25 are provided on a second signal route Ru2 (hereinafter, also referred to as a series arm route Ru2) between the second input terminal 25 and the second output terminal 26. The five series arm resonators S21, S22, S23, S24, and S25 are connected in series on the series arm route Ru2. In the second acoustic wave filter, on the series arm route Ru2, the series arm resonator S21, the series arm resonator S22, the series arm resonator S23, the series arm resonator S24, and the series arm resonator S25 are arranged in an order of the series arm resonator S21, the series arm resonator S22, the series arm resonator S23, the series arm resonator S24, and the series arm resonator S25 from the second input terminal 25 side. The parallel arm resonator P21 is provided on a route Ru21 between a route between the series arm resonator S21 and the series arm resonator S22 in the series arm route Ru2 and the ground. The parallel arm resonator P22 is provided in a route Ru22 between a route between the series arm resonator S22 and the series arm resonator S23 in the series arm route Ru2 and the ground. The parallel arm resonator P23 is provided in a route Ru23 between a route between the series arm resonator S23 and the series arm resonator S24 in the series arm route Ru2 and the ground. The parallel arm resonator P24 is provided on a route Ru24 between a route between the series arm resonator S24 and the series arm resonator S25 and the ground.

The plurality of acoustic wave resonators 24 include the second acoustic wave resonator 24A. The second acoustic wave resonator 24A is the acoustic wave resonator 24 closest to the second input terminal 25 among the plurality of acoustic wave resonators 24. The "acoustic wave resonator 24 closest to the second input terminal 25" means the acoustic wave resonator 24 that is directly connected to the second input terminal 25 not via any other acoustic wave resonators 24. In a case where the series arm resonator S21 closest to the second input terminal 25 and the parallel arm resonator P21 closest to the second input terminal 25 are present, at least one of the series arm resonator S21 closest to the second input terminal 25 or the parallel arm resonator P21 closest to the second input terminal 25 is the second acoustic wave resonator 24A. Further, the plurality of acoustic wave resonators 24 include a fourth acoustic wave resonator 24B closest to the second output terminal 26 of the second transmission filter 20.

(2.3) Circuit Configuration of Communication Device

As illustrated in FIG. 1, the communication device 300 includes the radio frequency module 100 and the signal processing circuit 301. The signal processing circuit 301 is connected to the radio frequency module 100. The communication device 300 further includes the antenna 310. The communication device 300 further includes the circuit board on which the radio frequency module 100 is mounted. The circuit board is, for example, the printed wiring board. The circuit board includes the ground electrode to which the ground potential is applied.

The signal processing circuit 301 includes, for example, the RF signal processing circuit 302 and a baseband signal processing circuit 303. The RF signal processing circuit 302 is, for example, a radio frequency integrated circuit (RFIC) and performs signal processing on the radio frequency signal. The RF signal processing circuit 302 performs, for example, the signal processing such as up-conversion on the radio frequency signal (transmission signal) output from the baseband signal processing circuit 303, and outputs the radio frequency signal on which the signal processing is performed. In addition, the RF signal processing circuit 302 performs, for example, the signal processing such as down-conversion on the radio frequency signal (reception signal) output from the radio frequency module 100, and outputs the radio frequency signal on which the signal processing is performed to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal or an image signal input from an outside. The baseband signal processing circuit 303 performs IQ modulation processing by combining the I-phase signal and the Q-phase signal, and outputs the transmission signal. In this case, the transmission signal is generated as a modulation signal (IQ signal) by amplitude-modulating a carrier wave signal of a predetermined frequency in a period longer than a period of the carrier wave signal. The reception signal processed by the baseband signal processing circuit 303 is used, for example, as an image signal for image display or as an audio signal for a call by a user of the communication device 300. The radio frequency module 100 transmits the radio frequency signal (reception signal and transmission signal) between the antenna 310 and the RF signal processing circuit 302 of the signal processing circuit 301.

(2.4) Structure of Radio Frequency Module

Hereinafter, the structure of the radio frequency module 100 will be described with reference to FIGS. 3 to 8.

Figure 3:
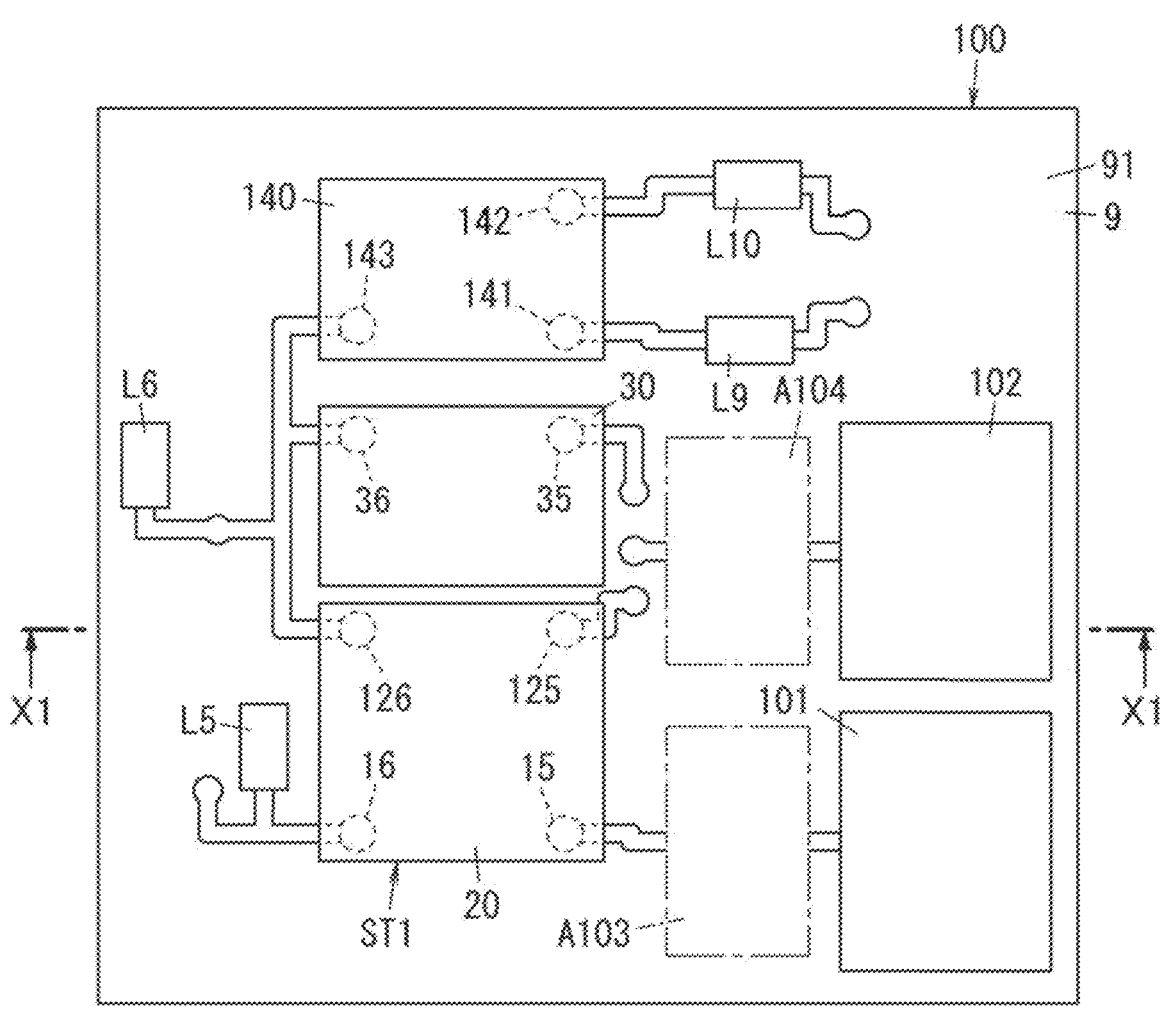
FIG. 3 is a plan view of the radio frequency module.
Figure 4:
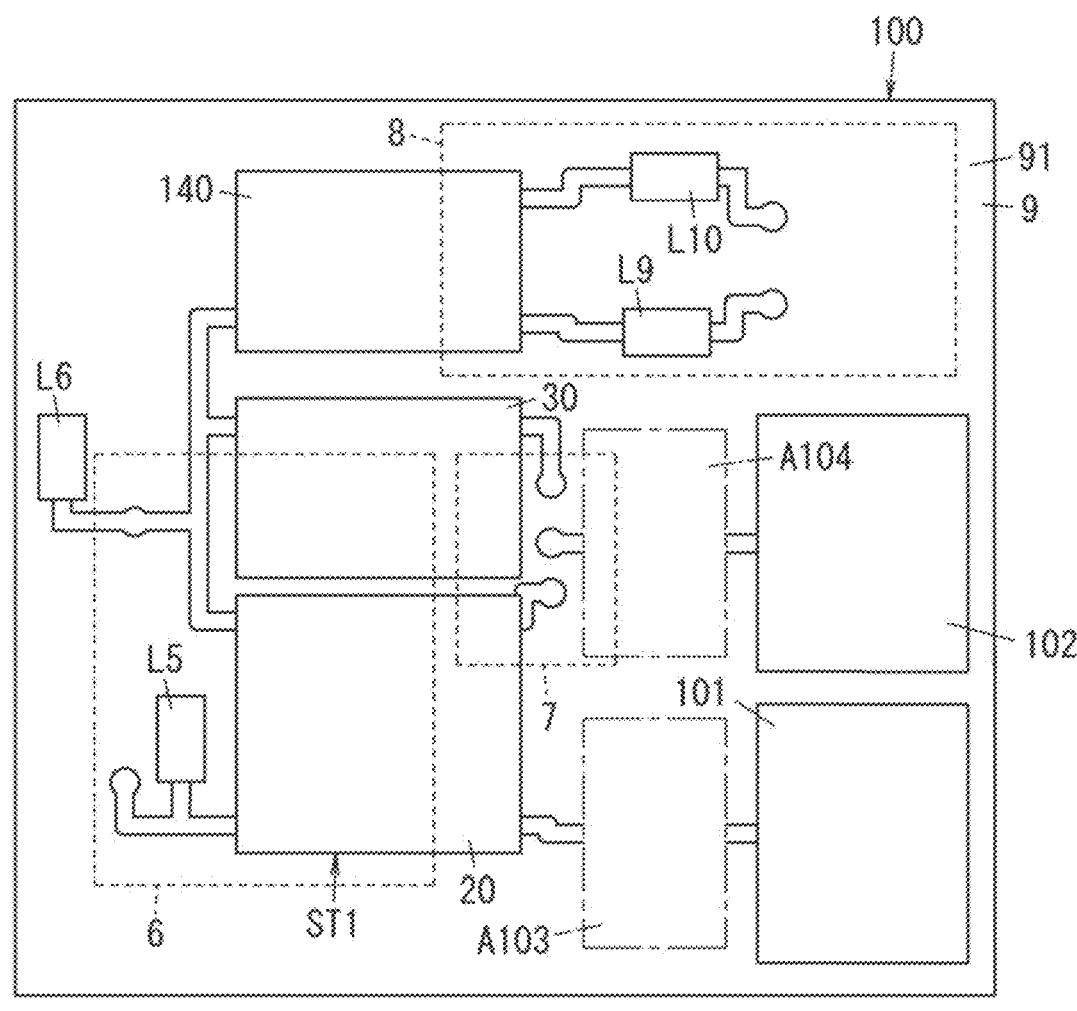
FIG. 4 is a plan view of the radio frequency module.
Figure 5:
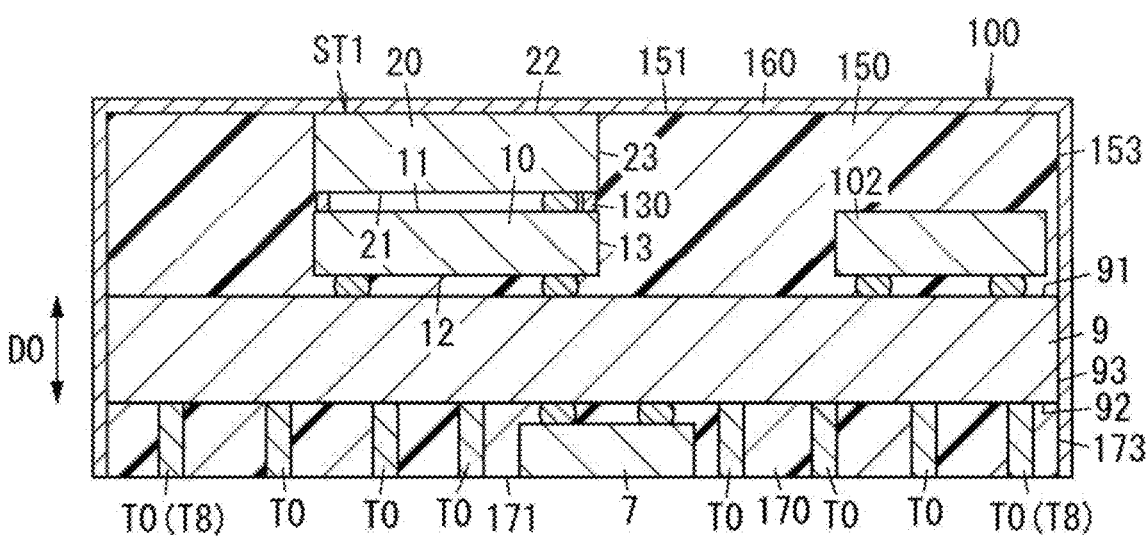
FIG. 5 is a cross-sectional view illustrating the radio frequency module, which is taken along a line X1-X1 in FIG. 3.

As illustrated in FIGS. 3 and 4, the radio frequency module 100 includes the mounting substrate 9, the first transmission filter 10 (see FIGS. 5 and 8), the second transmission filter 20, and the third transmission filter 30. Further, the radio frequency module 100 includes the first power amplifier 101 and the second power amplifier 102. Further, the radio frequency module 100 includes an electronic component 140. The electronic component 140 includes the first reception filter 40 (see FIG. 1) and the second reception filter 50 (see FIG. 1). The electronic component 140 includes a common input terminal 143 to which the input terminal of the first reception filter 40 and the input terminal of the second reception filter 50 are commonly connected, an output terminal 141 of the first reception filter 40, and an output terminal 142 of the second reception filter 50 (see FIG. 3). Further, the radio frequency module 100 includes the first output matching circuit 103 (see FIG. 1), the second output matching circuit 104 (see FIG. 1), the first switch 6 (see FIG. 4), the second switch 7 (see FIGS. 4 and 5), and the third switch 8 (see FIG. 4). Further, the radio frequency module 100 includes the plurality of external connection terminals T0 (see FIGS. 1 and 5). Further, as illustrated in FIG. 5, the radio frequency module 100 includes a resin layer 150 (hereinafter, also referred to as a first resin layer 150), a metal electrode layer 160, and a second resin layer 170. In FIGS. 3 and 4, the first resin layer 150 and the metal electrode layer 160 are not illustrated.

The mounting substrate 9 includes the main surface 91. An outer edge of the mounting substrate 9 has a quadrangular shape in plan view in the thickness direction D0 (see FIGS. 5 and 8) of the mounting substrate 9. As illustrated in FIGS. 5 and 8, the mounting substrate 9 includes the main surface 91 (hereinafter, also referred to as a first main surface 91) and a second main surface 92 facing each other in the thickness direction D0 of the mounting substrate 9. Here, "facing" means facing geometrically rather than physically. Further, the mounting substrate 9 includes an outer peripheral surface 93. The outer peripheral surface 93 of the mounting substrate 9 includes, for example, four side surfaces connecting the outer edge of the first main surface 91 and the outer edge of the second main surface 92 of the mounting substrate 9, and does not include the first main surface 91 and the second main surface 92. That is, the mounting substrate 9 is, for example, a multilayer substrate including a plurality of dielectric layers and a plurality of conductive layers. The plurality of dielectric layers and the plurality of conductive layers are stacked in the thickness direction D0 of the mounting substrate 9. The plurality of conductive layers are formed in a predetermined pattern determined for each layer. Each of the plurality of conductive layers includes one or a plurality of conductor portions in a plane orthogonal to the thickness direction D0 of the mounting substrate 9. A material of each conductive layer is, for example, copper. The plurality of conductive layers include a ground layer. In the radio frequency module 100, the plurality of external ground terminals T8 and the ground layer are electrically connected via a via conductor or the like included in the mounting substrate 9. The mounting substrate 9 is, for example, a low temperature co-fired ceramics (LTCC) substrate. The mounting substrate is not limited to the printed wiring board, and may be, for example, the printed wiring board, a high temperature co-fired ceramics (HTCC) substrate, or a resin multilayer substrate.

The mounting substrate 9 is not limited to the LTCC substrate, and may be, for example, a wiring structure. The wiring structure is, for example, a multilayer structure. The multilayer structure includes at least one insulating layer and at least one conductive layer. The insulating layer is formed in a predetermined pattern. In a case where a plurality of insulating layers are present, the plurality of insulating layers are formed in a predetermined pattern determined for each layer. The conductive layer is formed in a predetermined pattern different from the predetermined pattern of the insulating layer. In a case where a plurality of conductive layers are present, the plurality of conductive layers are formed in a predetermined pattern determined for each layer. The conductive layer may include one or a plurality of rewiring portions. In the wiring structure, among two surfaces facing each other in a thickness direction of the multilayer structure, a first surface is the first main surface 91 of the mounting substrate 9, and a second surface is the second main surface 92 of the mounting substrate 9. The wiring structure may be, for example, an interposer. The interposer may be an interposer using a silicon substrate or may be a multilayer substrate.

The first main surface 91 and the second main surface 92 of the mounting substrate 9 are spaced apart from each other in the thickness direction D0 of the mounting substrate 9, and cross the thickness direction D0 of the mounting substrate 9. The first main surface 91 of the mounting substrate 9 is, for example, orthogonal to the thickness direction D0 of the mounting substrate 9, and may include, for example, a side surface of the conductor portion as a surface that is not orthogonal to the thickness direction D0. In addition, for example, the second main surface 92 of the mounting substrate 9 is orthogonal to the thickness direction D0 of the mounting substrate 9, but the second main surface 92 may include, for example, a side surface of the conductor portion as a surface that is not orthogonal to the thickness direction D0. Further, the first main surface 91 and the second main surface 92 of the mounting substrate 9 may be formed with a fine uneven portion, a recess portion, or a protrusion portion. For example, in a case where the recess portion is formed on the first main surface 91 of the mounting substrate 9, an inner surface of the recess portion is included in the first main surface 91.

In the radio frequency module 100, a plurality of first electronic components are mounted on the first main surface 91 of the mounting substrate 9. The "first electronic components are mounted on the first main surface 91 of the mounting substrate 9" includes that the first electronic components are disposed on (mechanically connected to) the first main surface 91 of the mounting substrate 9 and that the first electronic components are electrically connected to the mounting substrate 9 (appropriate conductor portion thereof). An outer edge of each of the plurality of first electronic components has, for example, a quadrangular shape in plan view in the thickness direction D0 of the mounting substrate 9. The plurality of first electronic components include the first transmission filter 10, the third transmission filter 30, the first power amplifier 101, the second power amplifier 102, and the electronic component 140. The second transmission filter 20 is disposed on the first transmission filter 10. That is, the acoustic wave device ST1 including the first transmission filter 10 and the second transmission filter 20 is mounted on the first main surface 91 of the mounting substrate 9. Further, the plurality of first electronic components include a plurality of circuit elements (plurality of inductors and plurality of capacitors) of the first output matching circuit 103 (see FIG. 1) and a plurality of circuit elements (plurality of inductors and plurality of capacitors) of the second output matching circuit 104 (see FIG. 1). Further, the plurality of first electronic components include the inductor L9 of the first input matching circuit 109 (see FIG. 1), the inductor L10 of the second input matching circuit 110 (see FIG. 1), an inductor L5 of the first matching circuit 105 (see FIG. 1), and an inductor L6 of the second matching circuit 106 (see FIG. 1). In FIGS. 3 and 4, an area A103 in which the plurality of circuit elements of the first output matching circuit 103 are disposed on the first main surface 91 of the mounting substrate 9 is illustrated by a one-dot chain line. Some circuit elements of the plurality of circuit elements of the first output matching circuit 103 may be built in the mounting substrate 9. In addition, in FIGS. 3 and 4, an area A104 in which the plurality of circuit elements of the second output matching circuit 104 are disposed on the first main surface 91 of the mounting substrate 9 is illustrated by a one-dot chain line. Some circuit elements of the plurality of circuit elements of the second output matching circuit 104 may be built in the mounting substrate 9. Further, in FIG. 5, the conductor portion of the mounting substrate 9 is not illustrated.

The first transmission filter 10 includes the first acoustic wave filter. The second transmission filter 20 includes the second acoustic wave filter. The third transmission filter 30 includes a third acoustic wave filter. Each of the first acoustic wave filter, the second acoustic wave filter, and the third acoustic wave filter is, for example, a surface acoustic wave filter that utilizes a surface acoustic wave. Each of the first power amplifier 101 and the second power amplifier 102 is a power amplification IC chip. The power amplification IC chip is, for example, a GaAs-based IC chip in a case where an amplification transistor is a Heterojunction Bipolar Transistor (HBT). In addition, the power amplification IC chip is, for example, a Si-based IC chip, for example, in a case where the amplification transistor is a bipolar transistor or a field effect transistor (FET). The first reception filter 40 includes a fourth acoustic wave filter. The second reception filter 50 includes a fifth acoustic wave filter. Each of the fourth acoustic wave filter and the fifth acoustic wave filter is, for example, a surface acoustic wave filter that utilizes a surface acoustic wave.

In the radio frequency module 100, a plurality of second electronic components are mounted on the second main surface 92 of the mounting substrate 9. The plurality of second electronic components include the first switch 6, the second switch 7, and the third switch 8. The "second electronic components are mounted on the second main surface 92 of the mounting substrate 9" includes that the second electronic components are disposed on (mechanically connected to) the second main surface 92 of the mounting substrate 9 and that the second electronic components are electrically connected to the mounting substrate 9 (appropriate conductor portion thereof). An outer edge of each of the plurality of second electronic components has, for example, a quadrangular shape in plan view in the thickness direction D0 of the mounting substrate 9.

Each of the first switch 6, the second switch 7, and the third switch 8 is, for example, a Si-based IC chip including a switch integrated circuit (IC).

The plurality of external connection terminals T0 (see FIGS. 1 and 5) are disposed on the second main surface 92 of the mounting substrate 9. The "external connection terminals T0 are disposed on the second main surface 92 of the mounting substrate 9" includes that the external connection terminals T0 are mechanically connected to the second main surface 92 of the mounting substrate 9 and that the external connection terminals T0 are electrically connected to the mounting substrate 9 (appropriate conductor portion thereof).

The plurality of external connection terminals T0 include the antenna terminal T3, the first signal input terminal T1, the second signal input terminal T2, the first signal output terminal T4, the second signal output terminal T5, the third signal output terminal T6, the fourth signal output terminal T7, and the plurality of external ground terminals T8 (see FIG. 5). The plurality of external ground terminals T8 are electrically connected to the ground layer of the mounting substrate 9. The ground layer is a circuit ground of the radio frequency module 100, and the plurality of first electronic components of the radio frequency module 100 include electronic components that are electrically connected to the ground layer. Further, the plurality of second electronic components of the radio frequency module 100 include electronic components that are electrically connected to the ground layer.

Materials of the plurality of external connection terminals T0 are, for example, metal (for example, copper or copper alloy). The plurality of external connection terminals T0 are not constituent elements of the mounting substrate 9, but may be constituent elements of the mounting substrate 9. Each of the plurality of external connection terminals T0 is a columnar electrode (for example, a cylindrical electrode). The plurality of external connection terminals T0 are bonded to the conductor portion of the mounting substrate 9, for example, by soldering, but the present disclosure is not limited to this, and the external connection terminals T0 may be bonded by, for example, using a conductive adhesive (for example, a conductive paste) or may be directly bonded to the conductor portion of the mounting substrate 9. Each of the plurality of external connection terminals T0 has a circular shape in plan view in the thickness direction D0 of the mounting substrate 9.

As illustrated in FIG. 5, the first resin layer 150 is disposed on the first main surface 91 of the mounting substrate 9. The first resin layer 150 includes resin (for example, epoxy resin). The first resin layer 150 may include a filler in addition to the resin. The first resin layer 150 has an electrical insulating property.

The first resin layer 150 covers at least a part of each of the plurality of first electronic components disposed on the first main surface 91 of the mounting substrate 9. The first resin layer 150 covers at least a part of an outer peripheral surface 13 of the first transmission filter 10 and at least a part of an outer peripheral surface 23 of the second transmission filter 20. The outer peripheral surface 13 of the first transmission filter 10 includes, for example, four side surfaces connecting a first main surface 11 on the second transmission filter 20 side and a second main surface 12 on the side opposite to the second transmission filter 20 side, and does not include the first main surface 11 and the second main surface 12. The outer peripheral surface 23 of the second transmission filter 20 includes, for example, four side surfaces connecting a third main surface 21 on the first transmission filter 10 side and a fourth main surface 22 on the side opposite to the first transmission filter 10 side, and does not include the third main surface 21 and the fourth main surface 22.

The second resin layer 170 is disposed on the second main surface 92 of the mounting substrate 9. The second resin layer 170 covers an outer peripheral surface of each of the plurality of (for example, three) second electronic components mounted on the second main surface 92 of the mounting substrate 9 and an outer peripheral surface of each of the plurality of external connection terminals T0. The outer peripheral surface of each of the plurality of second electronic components includes four side surfaces of the second electronic component. The second resin layer 170 does not cover a main surface of each of the three second electronic components, the main surface being on the side opposite to the mounting substrate 9 side. The three second electronic components include, as described above, the first switch 6, the second switch 7, and the third switch 8. The second resin layer 170 includes resin (for example, epoxy resin). The second resin layer 170 may include a filler in addition to the resin. A material of the second resin layer 170 may be the same as or different from the material of the first resin layer 150.

The metal electrode layer 160 covers at least a part of the resin layer 150. The metal electrode layer 160 is in contact with the fourth main surface 22 which is the main surface of the second transmission filter 20 on the side opposite to the first transmission filter 10 side.

The metal electrode layer 160 has conductivity. In the radio frequency module 100, the metal electrode layer 160 is a shield layer provided for the purpose of electromagnetic shielding inside and outside the radio frequency module 100. The metal electrode layer 160 is in contact with at least a part of the outer peripheral surface of the ground layer provided in the mounting substrate 9. As a result, the potential of the metal electrode layer 160 can be made the same as the potential of the ground layer. Although the metal electrode layer 160 has a multilayer structure with a plurality of stacked metal layers, the metal electrode layer 160 is not limited to this and may be a single metal layer. The metal layer includes one or a plurality of types of metal. In a case where the metal electrode layer 160 has a multilayer structure with a plurality of stacked metal layers, the metal electrode layer 160 includes, for example, a first metal layer (for example, a first stainless steel layer), a second metal layer (for example, a Cu layer) on the first metal layer, and a third metal layer (for example, a second stainless steel layer) on the second metal layer. A material of each of the first stainless steel layer and the second stainless steel layer is an alloy including Fe, Ni, and Cr. In addition, in a case of a single metal layer, the metal electrode layer 160 is, for example, a Cu layer.

The metal electrode layer 160 covers a main surface 151 of the first resin layer 150 on the side opposite to the mounting substrate 9 side, an outer peripheral surface 153 of the first resin layer 150, the outer peripheral surface 93 of the mounting substrate 9, and an outer peripheral surface 173 of the second resin layer 170. The main surface 171 of the second resin layer 170 on the side opposite to the mounting substrate 9 side is exposed without being covered by the metal electrode layer 160.

Hereinafter, an acoustic wave device (stacked structure) ST1 including the first transmission filter 10 and the second transmission filter 20 will be described with reference to FIGS. 6 to 8.

Figure 6:
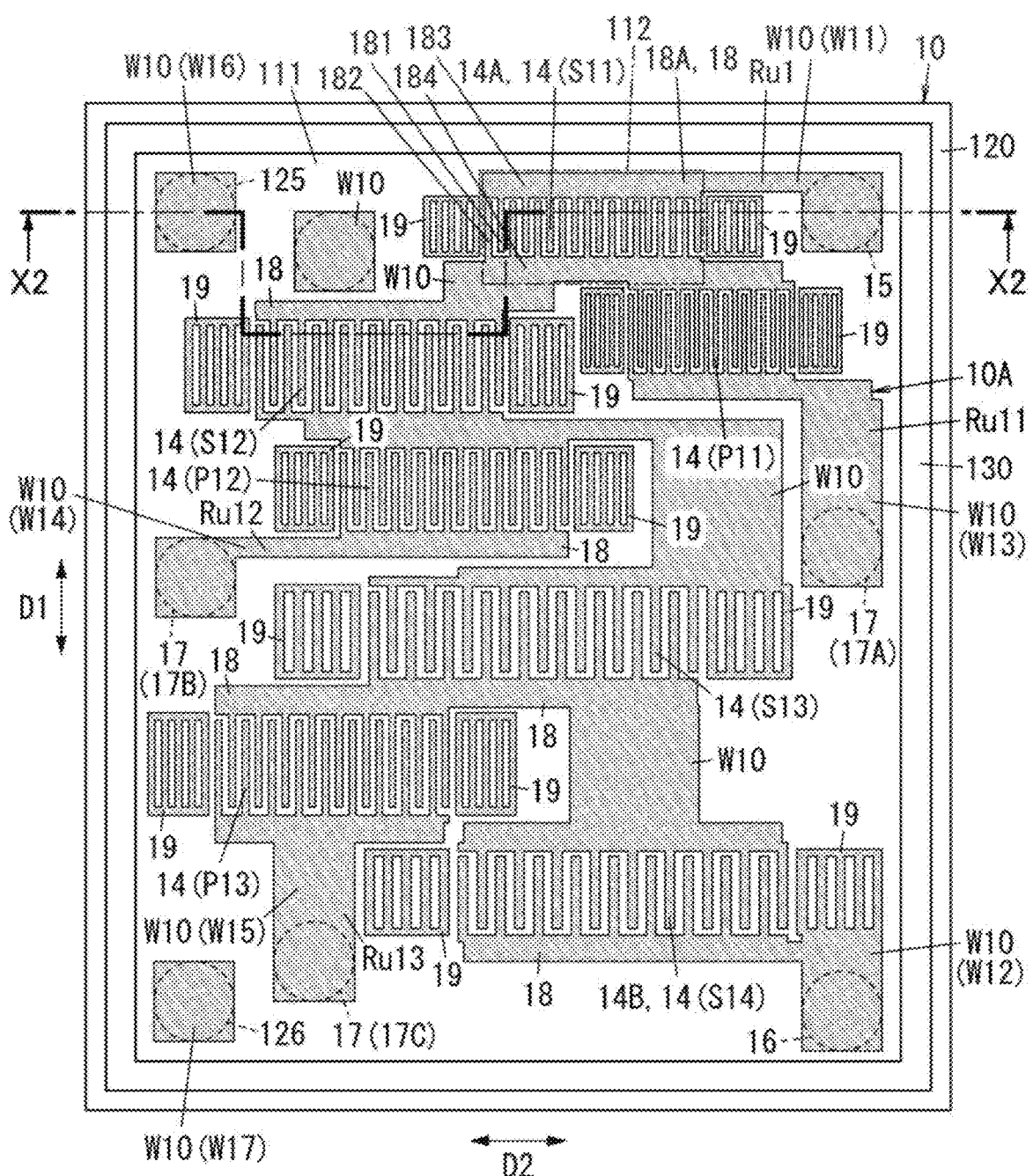
FIG. 6 is a plan view of a first transmission filter in an acoustic wave device according to Exemplary embodiment 1.

As illustrated in FIG. 6, the first transmission filter 10 includes the first input terminal 15, the first output terminal 16, and a plurality of (for example, three) ground terminals 17. As illustrated in FIGS. 6 and 8, a first acoustic wave filter 10A of the first transmission filter 10 includes a first substrate 120 and a plurality of functional electrodes 18 that are provided on the first substrate 120 and that constitute a part of each of the plurality of acoustic wave resonators 14. In the radio frequency module 100, the first acoustic wave filter 10A is an acoustic wave filter that utilizes a surface acoustic wave, and each of the plurality of functional electrodes 18 is an interdigital transducer (IDT) electrode. Therefore, each of the plurality of acoustic wave resonators 14 is a surface acoustic wave (SAW) resonator. In the first transmission filter 10, in a first direction D1 orthogonal to the thickness direction D0 of the mounting substrate 9, the series arm resonator S11, the series arm resonator S12, the series arm resonator S13, and the series arm resonator S14 are arranged in an order of the series arm resonator S11, the series arm resonator S12, the series arm resonator S13, and the series arm resonator S14. In addition, in the first transmission filter 10, in the first direction D1, the parallel arm resonator P11, the parallel arm resonator P12, and the parallel arm resonator P13 are arranged in an order of the parallel arm resonator P11, the parallel arm resonator P12, and the parallel arm resonator P13. Further, the first transmission filter 10 includes a plurality of reflectors 19 disposed on the first substrate 120. The plurality of reflectors 19 include two reflectors 19 that are disposed adjacent to each IDT electrode for each of the plurality of IDT electrodes in a second direction D2 orthogonal to the first direction D1. The two reflectors 19 reflect an acoustic wave having a direction in which a plurality of electrode fingers of the adjacent IDT electrodes are arranged, as an acoustic wave propagation direction. Further, the first transmission filter 10 includes a plurality of wiring portions W10 disposed on the first substrate 120. In FIG. 6, each functional electrode (IDT electrode) 18, each reflector 19, and each wiring portion W10 are hatched with dots, but the hatching does not represent a cross section, and is only to make a relationship among each functional electrode (IDT electrode) 18, each reflector 19, each wiring portion W10, and the first substrate 120 easier to understand. In the first transmission filter 10, among the plurality of functional electrodes 18, the functional electrode 18 constituting a part of the first acoustic wave resonator 14A (series arm resonator S11) is a first functional electrode 18A.

As illustrated in FIG. 8, the first substrate 120 includes a piezoelectric layer 123 (hereinafter, also referred to as a first piezoelectric layer 123) and a high acoustic velocity member 121 (hereinafter, also referred to as a first high acoustic velocity member 121). The high acoustic velocity member 121 is a high acoustic velocity support substrate located to face the functional electrode 18 with the piezoelectric layer 123 interposed therebetween. In the high acoustic velocity member 121, the acoustic velocity of the bulk wave propagating through the high acoustic velocity member 121 is higher than the acoustic velocity of the acoustic wave propagating through the piezoelectric layer 123. Here, the bulk wave propagating through the high acoustic velocity member 121 is the bulk wave with the lowest acoustic velocity among a plurality of bulk waves propagating through the high acoustic velocity member 121. The first substrate 120 further includes a low acoustic velocity film 122 (hereinafter, also referred to as a first low acoustic velocity film 122) interposed between the high acoustic velocity member 121 and the piezoelectric layer 123. The low acoustic velocity film 122 is a film in which the acoustic velocity of the bulk wave propagating through the low acoustic velocity film 122 is lower than the acoustic velocity of the bulk wave propagating through the piezoelectric layer 123.

Figure 7:
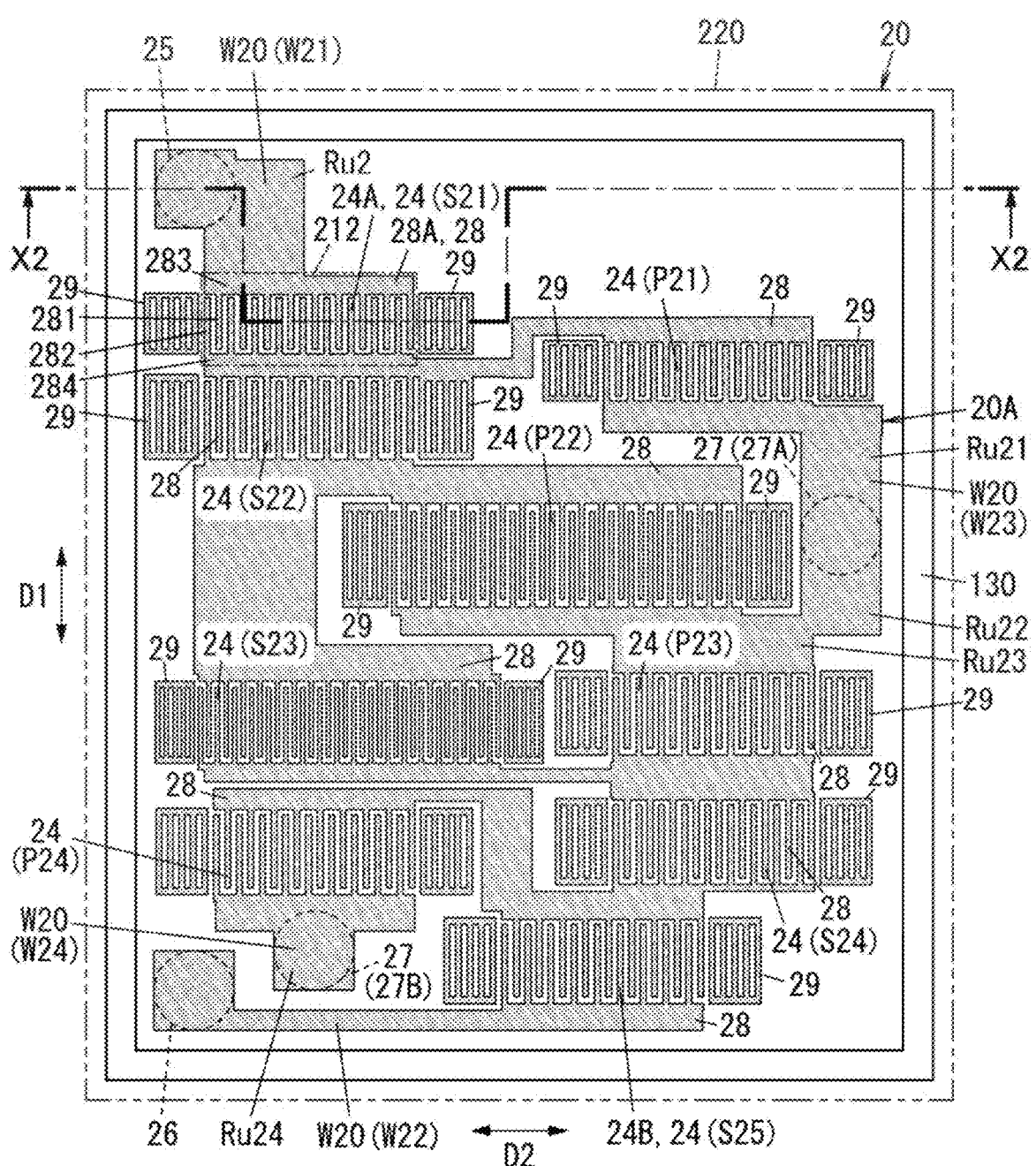
FIG. 7 is a perspective view illustrating a lower surface of the second transmission filter in the acoustic wave device when seen from an upper surface side of the second transmission filter.

As illustrated in FIGS. 7 and 8, a second acoustic wave filter 20A of the second transmission filter 20 includes a second substrate 220 and a plurality of functional electrodes 28 that are provided on the second substrate 220 and that constitute a part of each of the plurality of acoustic wave resonators 24. In the radio frequency module 100, the second acoustic wave filter 20A is an acoustic wave filter that utilizes a surface acoustic wave, and each of the plurality of functional electrodes 28 is an IDT electrode. Therefore, each of the plurality of acoustic wave resonators 24 is a SAW resonator. In the second transmission filter 20, in the first direction D1 orthogonal to the thickness direction D0 of the mounting substrate 9, the series arm resonator S21, the series arm resonator S22, the series arm resonator S23, the series arm resonator S24, and the series arm resonator S25 are arranged in an order of the series arm resonator S21, the series arm resonator S22, the series arm resonator S23, the series arm resonator S24, and the series arm resonator S25. In addition, in the second transmission filter 20, in the first direction D1, the parallel arm resonator P21, the parallel arm resonator P22, the parallel arm resonator P23, and the parallel arm resonator P24 are arranged in an order of the parallel arm resonator P21, the parallel arm resonator P22, the parallel arm resonator P23, and the parallel arm resonator P24. Further, the second transmission filter 20 includes a plurality of reflectors 29 disposed on the second substrate 220. The plurality of reflectors 29 include two reflectors 29 that are disposed adjacent to each IDT electrode for each of the plurality of IDT electrodes in the second direction D2 orthogonal to the first direction D1. The two reflectors 29 reflect an acoustic wave having a direction in which a plurality of electrode fingers of the adjacent IDT electrodes are arranged, as an acoustic wave propagation direction. Further, the second transmission filter 20 includes a plurality of wiring portions W20 disposed on the second substrate 220. In FIG. 7, each functional electrode (IDT electrode) 28, each reflector 29, and each wiring portion W20 are hatched with dots, but the hatching does not represent a cross section, and is only to make a relationship among each functional electrode (IDT electrode) 28, each reflector 29, each wiring portion W20, and the second substrate 220 easier to understand. In the second transmission filter 20, among the plurality of functional electrodes 28, the functional electrode 28 constituting a part of the second acoustic wave resonator 24A (series arm resonator S21) is a second functional electrode 28A.

As illustrated in FIG. 8, the second substrate 220 includes a piezoelectric layer 223 (hereinafter, also referred to as a second piezoelectric layer 223) and a high acoustic velocity member 221 (hereinafter, also referred to as a second high acoustic velocity member 221). The high acoustic velocity member 221 is a high acoustic velocity support substrate located to face the functional electrode 28 with the piezoelectric layer 223 interposed therebetween. In the high acoustic velocity member 221, the acoustic velocity of the bulk wave propagating through the high acoustic velocity member 221 is higher than the acoustic velocity of the acoustic wave propagating through the piezoelectric layer 223. Here, the bulk wave propagating through the high acoustic velocity member 221 is the bulk wave with the lowest acoustic velocity among a plurality of bulk waves propagating through the high acoustic velocity member 221.

The second substrate 220 further includes a low acoustic velocity film 222 (hereinafter, also referred to as a second low acoustic velocity film 222) interposed between the high acoustic velocity member 221 and the piezoelectric layer 223. The low acoustic velocity film 222 is a film in which the acoustic velocity of the bulk wave propagating through the low acoustic velocity film 222 is lower than the acoustic velocity of the bulk wave propagating through the piezo-electric layer 223.

A material of each of the first piezoelectric layer 123 and the second piezoelectric layer 223 includes, for example, lithium tantalate or lithium niobate.

A material of each of the first high acoustic velocity member 121 and the second high acoustic velocity member 221 includes, for example, silicon. The material of each of the first high acoustic velocity member 121 and the second high acoustic velocity member 221 need only include, for example, at least one type selected from the group consisting of silicon, aluminum nitride, aluminum oxide, silicon car-bide, silicon nitride, sapphire, lithium tantalate, lithium niobate, crystal, alumina, zirconia, cordierite, mullite, ste-atite, forsterite, magnesia, and diamond.

A material of each of the first low acoustic velocity film 122 and the second low acoustic velocity film 222 includes, for example, silicon dioxide. The material of each of the first low acoustic velocity film 122 and the second low acoustic velocity film 222 is not limited to silicon dioxide. The material of each of the first low acoustic velocity film 122 and the second low acoustic velocity film 222 may be, for example, glass, silicon oxynitride, tantalum oxide, a com-pound of silicon dioxide with fluorine, carbon, or boron, or a material with each of these materials as a main component.

As illustrated in FIG. 8, the acoustic wave device ST1 includes a spacer portion 130 interposed between the first transmission filter 10 and the second transmission filter 20. The spacer portion 130 has a frame shape. The acoustic wave device ST1 includes a hollow space 131 surrounded by the first transmission filter 10, the second transmission filter 20, and the spacer portion 130. A material of the spacer portion 130 includes, for example, at least one of metal and solder. The material of the spacer portion 130 may be resin.

In the first transmission filter 10, as illustrated in FIG. 8, the first functional electrode 18A is located closer to the second transmission filter 20 side than the first substrate 120. In the second transmission filter 20, the second functional electrode 28A is located closer to the first transmission filter 10 side than the second substrate 220.

In the first transmission filter 10, the first substrate 120 includes a first main surface 1201 and a second main surface 1202. In the first transmission filter 10, the plurality of functional electrodes 18 are disposed on the first main surface 1201 of the first substrate 120. In the first transmis-sion filter 10, the first main surface 1201 of the first substrate 120 constitutes a first functional surface 111. The first functional surface 111 is a surface on which the first func-tional electrode 18A is formed in the first transmission filter 10. In the first transmission filter 10, the first input terminal 15, the first output terminal 16, and the plurality of (for example, three) ground terminals 17 are disposed on the second main surface 1202 of the first substrate 120. Each of the first input terminal 15, the first output terminal 16, and the plurality of ground terminals 17 is, for example, a conductive bump. A material of the conductive bump includes, for example, solder. The first transmission filter 10 further includes a resist layer 128 disposed on the second main surface 1202 of the first substrate 120. The resist layer 128 includes a plurality of openings that exposes the plurality of conductive bumps. The resist layer 128 has an electrical insulating property. A material of the resist layer 128 includes, for example, polyimide. Further, the first transmission filter 10 includes a connection terminal 125 connected to the second input terminal 25 of the second transmission filter 20 and a connection terminal 126 con-nected to the second output terminal 26 of the second transmission filter 20. In addition, the plurality of (for example, three) ground terminals 17 of the first transmission filter 10 are connected to a plurality of (for example, two) ground terminals 27 of the second transmission filter 20. Hereinafter, for convenience of description, in order to distinguish the three ground terminals 17, the three ground terminals 17 may be referred to as a ground terminal 17A, a ground terminal 17B, and a ground terminal 17C. In addition, in order to distinguish the two ground terminals 27, the two ground terminals 27 may be referred to as a ground terminal 27A and a ground terminal 27B.

The first transmission filter 10 includes a plurality of via conductors V0 that pass through the first substrate 120 in the thickness direction. Each of the plurality of via conductors V0 includes, for example, a seed layer V01 and a plated portion V02. In the case where the high acoustic velocity member 121 of the first substrate 120 is a silicon substrate, it is preferable that an electrical insulating film 124 is interposed between the plurality of via conductors V0 and the high acoustic velocity member 121. A material of the electrical insulating film 124 includes, for example, silicon dioxide. The plurality of via conductors V0 include a first input via conductor V15 connected to the first input terminal 15, a first output via conductor connected to the first output terminal 16 (see FIG. 6), a plurality of ground via conductors connected to the plurality of ground terminals 17 (see FIG. 6), a second input via conductor V125 connected to the connection terminal 125, and a second output via conductor connected to the connection terminal 126 (see FIG. 6).

In addition, in the first transmission filter 10, the plurality of wiring portions W10 are disposed on the first main surface 1201 of the first substrate 120. As illustrated in FIG. 6, the plurality of wiring portions W10 include a first wiring portion W11, a second wiring portion W12, a third wiring portion W13, a fourth wiring portion W14, a fifth wiring portion W15, a sixth wiring portion W16, and a seventh wiring portion W17. The first wiring portion W11 is con-nected to the series arm resonator S11 and the first input via conductor V15 between the series arm resonator S11 and the first input terminal 15. The second wiring portion W12 is connected to the series arm resonator S14 and the first output via conductor between the series arm resonator S14 and the first output terminal 16. The third wiring portion W13 is connected to the parallel arm resonator P11 and the ground via conductor between the parallel arm resonator P11 and the ground terminal 17A. The fourth wiring portion W14 is connected to the parallel arm resonator P12 and the ground via conductor between the parallel arm resonator P12 and the ground terminal 17B. The fifth wiring portion W15 is connected to the parallel arm resonator P13 and the ground via conductor between the parallel arm resonator P13 and the ground terminal 17C. The sixth wiring portion W16 is connected to the connection terminal 125 with the second input via conductor V125 interposed therebetween. The seventh wiring portion W17 is connected to the connection terminal 126 with the second output via conductor inter-posed therebetween. The first wiring portion W11 and the second wiring portion W12 constitute a part of the signal route Ru1 (see FIG. 2A). The third wiring portion W13 constitutes a part of the route Ru11 (see FIG. 2A). The fourth wiring portion W14 constitutes a part of the route Ru12 (see FIG. 2A). The fifth wiring portion W15 constitutes a part of the route Ru13 (see FIG. 2A).

As illustrated in FIG. 8, the second transmission filter 20 includes the second substrate 220 including a third main surface 2201 and a fourth main surface 2202. In the second transmission filter 20, the plurality of functional electrodes 28 are disposed on the third main surface 2201 of the second substrate 220. In the second transmission filter 20, the third main surface 2201 of the second substrate 220 constitutes a second functional surface 211. The second functional surface 211 is a surface on which the second functional electrode 28A is formed in the second transmission filter 20. In the second transmission filter 20, the second input terminal 25, the second output terminal 26, and the plurality of (for example, two) ground terminals 27 are disposed on the third main surface 2201 of the second substrate 220.

In addition, in the second transmission filter 20, a plurality of wiring portions W20 are disposed on the third main surface 2201 of the second substrate 220. As illustrated in FIG. 7, the plurality of wiring portions W20 include a first wiring portion W21, a second wiring portion W22, a third wiring portion W23, and a fourth wiring portion W24. The first wiring portion W21 is connected to the series arm resonator S21 and the second input terminal 25. The second wiring portion W22 is connected to the series arm resonator S25 and the second output terminal 26. The third wiring portion W23 is connected to the parallel arm resonator P21, the parallel arm resonator P22, the parallel arm resonator P23, and the ground terminal 27A. The fourth wiring portion W24 is connected to the parallel arm resonator P24 and the ground terminal 27B. The first wiring portion W21 and the second wiring portion W22 constitute a part of the signal route Ru2 (see FIG. 2B). The third wiring portion W23 constitutes a part of each of the routes Ru21 to Ru23 (see FIG. 2B). The fourth wiring portion W24 constitutes a part of the route Ru24 (see FIG. 2B).

Further, the acoustic wave device ST1 includes a plurality of connection conductor portions interposed between the first transmission filter 10 and the second transmission filter 20 in a thickness direction D3 of the second transmission filter 20. The thickness direction D3 of the second transmission filter 20 is a thickness direction of the second substrate 220. The plurality of connection conductor portions include a first connection conductor portion R1, a second connection conductor portion, a third connection conductor portion, and a fourth connection conductor portion. The first connection conductor portion R1 connects the second input terminal 25 of the second transmission filter 20 and the sixth wiring portion W16 of the first transmission filter 10. The second connection conductor portion connects the second output terminal 26 (see FIG. 7) of the second transmission filter 20 and the seventh wiring portion W17 (see FIG. 6) of the first transmission filter 10. The third connection conductor portion (ground conductor portion) connects the ground terminal 27A (see FIG. 7) of the second transmission filter 20 and the third wiring portion W13 (see FIG. 6) of the first transmission filter 10. The fourth connection conductor portion (ground conductor portion) connects the ground terminal 27B (see FIG. 7) of the second transmission filter 20 and the fifth wiring portion W15 (see FIG. 6). In the radio frequency module 100 including the acoustic wave device ST1, the thickness direction D3 of the second transmission filter 20 and the thickness direction D0 of the mounting substrate 9 are parallel to each other. The thickness direction D3 of the second transmission filter 20 and the thickness direction D0 of the mounting substrate 9 are parallel to each other, but need not be strictly parallel to each other, and an angle formed by the thickness direction D3 of the second transmission filter 20 and the thickness direction D0 of the mounting substrate 9 need only be 10° or less.

In the acoustic wave device ST1, a formation region 112 of the first functional electrode 18A and a formation region 212 of the second functional electrode 28A do not overlap each other in plan view in the thickness direction D3 of the second transmission filter 20. The "formation region 112 of the first functional electrode 18A and the formation region 212 of the second functional electrode 28A do not overlap each other in plan view in the thickness direction D3 of the second transmission filter 20" means that the formation region 112 of the first functional electrode 18A of the first acoustic wave resonator 14A (series arm resonator S11) and the formation region 212 of the second functional electrode 28A of the second acoustic wave resonator 24A (series arm resonator S21) do not completely overlap each other, that is, the formation region 112 of the first functional electrode 18A of the first acoustic wave resonator 14A and the formation region 212 of the second functional electrode 28A of the second acoustic wave resonator 24A do not overlap each other even partially, in plan view in the thickness direction D3 of the second transmission filter 20. Therefore, in the acoustic wave device ST1 according to Exemplary embodiment 1, the formation region 112 of the first functional electrode 18A of the first acoustic wave resonator 14A and the formation region 212 of the second functional electrode 28A of the second acoustic wave resonator 24A do not completely overlap each other. The formation region 112 of the first functional electrode 18A includes a region in which the first functional electrode 18A is formed on the first functional surface 111, does not include regions in which the two reflectors 19 adjacent to the first functional electrode 18A are formed on the first functional surface 111, and does not include a formation region of the wiring portion W10 connected to the first functional electrode 18A. The formation region 212 of the second functional electrode 28A includes a region in which the second functional electrode 28A is formed on the second functional surface 211, does not include regions in which the two reflectors 29 adjacent to the second functional electrode 28A are formed on the second functional surface 211, and does not include a formation region of the wiring portion W20 connected to the second functional electrode 28A. In the acoustic wave device ST1 according to Exemplary embodiment 1, the first functional electrode 18A is an IDT electrode and includes, as illustrated in FIG. 6, a first busbar 183, a second busbar 184, a plurality of first electrode fingers 181, and a plurality of second electrode fingers 182. In the IDT electrode constituting the first functional electrode 18A, the first busbar 183 and the second busbar 184 face each other in the first direction D1. The first busbar 183 and the second busbar 184 are elongated with the second direction D2 as a longitudinal direction. The plurality of first electrode fingers 181 are connected to the first busbar 183 and extend from the first busbar 183 to the second busbar 184 side in the first direction D1. The plurality of second electrode fingers 182 are connected to the second busbar 184 and extend from the second busbar 184 to the first busbar 183 side in the first direction D1. In the IDT electrode constituting the first functional electrode 18A, the plurality of first electrode fingers 181 and the plurality of second electrode fingers 182 are alternately arranged and spaced from each other, for example, one by one in the second direction D2. In the acoustic wave device ST1 according to Exemplary embodiment 1, the second functional electrode 28A is an IDT electrode and includes, as illustrated in FIG. 7, a first busbar 283, a second busbar 284, a plurality of first electrode fingers 281, and a plurality of second electrode fingers 282. In the IDT electrode constituting the second functional electrode 28A, the first busbar 283 and the second busbar 284 face each other in the first direction D1. The first busbar 283 and the second busbar 284 are elongated with the second direction D2 as a longitudinal direction. The plurality of first electrode fingers 281 are connected to the first busbar 283 and extend from the first busbar 283 to the second busbar 284 side in the first direction D1. The plurality of second electrode fingers 282 are connected to the second busbar 284 and extend from the second busbar 284 to the first busbar 283 side in the first direction D1. In the IDT electrode constituting the second functional electrode 28A, the plurality of first electrode fingers 281 and the plurality of second electrode fingers 282 are alternately arranged and spaced from each other, for example, one by one in the second direction D2.

In addition, the first acoustic wave resonator 14A (series arm resonator S11) of the first transmission filter 10 does not overlap any acoustic wave resonators 24 of the second transmission filter 20 other than the second acoustic wave resonator 24A (series arm resonator S21) in the acoustic wave device ST1, in plan view in the thickness direction D3 of the second transmission filter 20.

In addition, in the acoustic wave device ST1, the second acoustic wave resonator 24A (series arm resonator S21) of the second transmission filter 20 overlaps one acoustic wave resonator 14 (series arm resonator S12) other than the first acoustic wave resonator 14A of the first transmission filter 10 in plan view in the thickness direction D3 of the second transmission filter 20. The second acoustic wave resonator 24A (series arm resonator S21) is not limited to overlapping one acoustic wave resonator 14 other than the first acoustic wave resonator 14A (series arm resonator S11), and may overlap two or more acoustic wave resonators 14.

In the acoustic wave device ST1, the third acoustic wave resonator 14B and the fourth acoustic wave resonator 24B overlap each other in plan view in the thickness direction D3 of the second transmission filter 20. In the acoustic wave device ST1, a part of the third acoustic wave resonator 14B and a part of the fourth acoustic wave resonator 24B overlap each other, but the present disclosure is not limited to this. A part of the third acoustic wave resonator 14B may overlap the entire fourth acoustic wave resonator 24B, the entire third acoustic wave resonator 14B may overlap a part of the fourth acoustic wave resonator 24B, or the entire third acoustic wave resonator 14B may overlap the entire fourth acoustic wave resonator 24B.

(2.5) Structure of Communication Device

As described above, the communication device 300 includes the radio frequency module 100 and the signal processing circuit 301. The plurality of electronic components constituting the signal processing circuit 301 may be mounted on, for example, the above-described circuit board, or may be mounted on a circuit board (second circuit board) different from a circuit board (first circuit board) on which the radio frequency module 100 is mounted.

(3) Effects (3.1) Acoustic Wave Device

The acoustic wave device ST1 according to Exemplary embodiment 1 includes the first transmission filter 10 and the second transmission filter 20. In the acoustic wave device ST1, the first transmission filter 10 and the second transmission filter 20 are stacked with the first functional surface 111 of the first transmission filter 10 and the second functional surface 211 of the second transmission filter 20 being disposed to face each other at a predetermined distance H1. The first transmission filter 10 includes the first input terminal 15 and the first acoustic wave resonator 14A closest to the first input terminal 15. The second transmission filter 20 includes the second input terminal 25 and the second acoustic wave resonator 24A closest to the second input terminal 25. The first acoustic wave resonator 14A includes the first functional electrode 18A formed on the first functional surface 111. The second acoustic wave resonator 24A includes the second functional electrode 28A formed on the second functional surface 211. The formation region 112 of the first functional electrode 18A and the formation region 212 of the second functional electrode 28A do not overlap each other in plan view in the thickness direction D3 of the second transmission filter 20.

With the acoustic wave device ST1 according to Exemplary embodiment 1, it is possible to suppress the deterioration in the filter characteristics of each of the first transmission filter and the second transmission filter due to the temperature rise in of the first transmission filter and the second transmission filter. In the transmission filter, the first acoustic wave resonator closest to the input terminal is more likely to generate heat than the other acoustic wave resonators. In an acoustic wave device according to a comparative example including two transmission filters (first transmission filter and second transmission filter), in which the two transmission filters are stacked, and a formation region of a functional electrode close to the input terminal in the first transmission filter and a formation region of a functional electrode close to the input terminal in the second transmission filter are disposed to overlap each other, the first transmission filter and the second transmission filter are affected by heat from each other, leading to a high possibility of the deterioration in the filter characteristics due to the temperature rise in the acoustic wave resonator close to the input terminal in each of the first transmission filter and the second transmission filter. On the other hand, in the acoustic wave device ST1 according to Exemplary embodiment 1, since the formation region 112 of the first functional electrode 18A of the first acoustic wave resonator 14A and the formation region 212 of the second functional electrode 28A of the second acoustic wave resonator 24A do not overlap each other in plan view in the thickness direction D3 of the second transmission filter 20, it is possible to suppress the temperature rise in each of the first acoustic wave resonator 14A and the second acoustic wave resonator 24A. As a result, in the acoustic wave device ST1 according to Exemplary embodiment 1, it is possible to suppress the decrease in the voltage withstand capability of each of the first transmission filter 10 and the second transmission filter 20, and it is possible to suppress the deterioration in the filter characteristics due to the temperature rise.

In addition, in the acoustic wave device ST1 according to Exemplary embodiment 1, the second acoustic wave resonator 24A of the second transmission filter 20 overlaps at least one acoustic wave resonator 14 other than the first acoustic wave resonator 14A among the plurality of acoustic wave resonators 14 of the first transmission filter 10 in plan view in the thickness direction D3 of the second transmission filter 20. As a result, the acoustic wave device ST1 according to Exemplary embodiment 1 can suppress the size increase in the second transmission filter 20.

Further, in the acoustic wave device ST1 according to Exemplary embodiment 1, the third acoustic wave resonator 14B and the fourth acoustic wave resonator 24B overlap each other in plan view in the thickness direction D3 of the second transmission filter 20. As a result, the acoustic wave device ST1 according to Exemplary embodiment 1 can suppress the size increase in the first transmission filter 10 and the second transmission filter 20.

(3.2) Radio Frequency Module

The radio frequency module 100 according to Exemplary embodiment 1 includes the mounting substrate 9 and the acoustic wave device ST1. The mounting substrate 9 includes the main surface 91. The acoustic wave device ST1 is disposed on the main surface 91 of the mounting substrate 9. With the radio frequency module 100 according to Exemplary embodiment 1, it is possible to suppress the deterioration in the filter characteristics of each of the first transmission filter 10 and the second transmission filter 20 due to the temperature rise in the first transmission filter 10 and the second transmission filter 20.

Further, the radio frequency module 100 according to Exemplary embodiment 1 further includes the resin layer 150 and the metal electrode layer 160. In the radio frequency module 100 according to Exemplary embodiment 1, the metal electrode layer 160 is in contact with the main surface (fourth main surface 22) of the second transmission filter 20 on the side opposite to the first transmission filter 10 side. As a result, the radio frequency module 100 according to Exemplary embodiment 1 can improve the heat dissipation. Therefore, with the radio frequency module 100, it is possible to further suppress the deterioration in the filter characteristics of each of the first transmission filter 10 and the second transmission filter 20 due to the temperature rise in the first transmission filter 10 and the second transmission filter 20.

(3.3) Communication Device

The communication device 300 according to Exemplary embodiment 1 includes the radio frequency module 100 and the signal processing circuit 301. The signal processing circuit 301 is connected to the radio frequency module 100.

According to the communication device 300 according to Exemplary embodiment 1, it is possible to suppress the deterioration in the filter characteristics of each of the first transmission filter 10 and the second transmission filter 20 due to the temperature rise in the first transmission filter 10 and the second transmission filter 20.

Since the communication device 300 according to Exemplary embodiment 1 includes the radio frequency module 100 and the signal processing circuit 301, it is possible to suppress the deterioration in the filter characteristics of each of the first transmission filter 10 and the second transmission filter 20 during the simultaneous communication using the first transmission filter 10 and the second transmission filter 20.

(4) Modification Example (4.1) Modification Example 1

Figure 9:
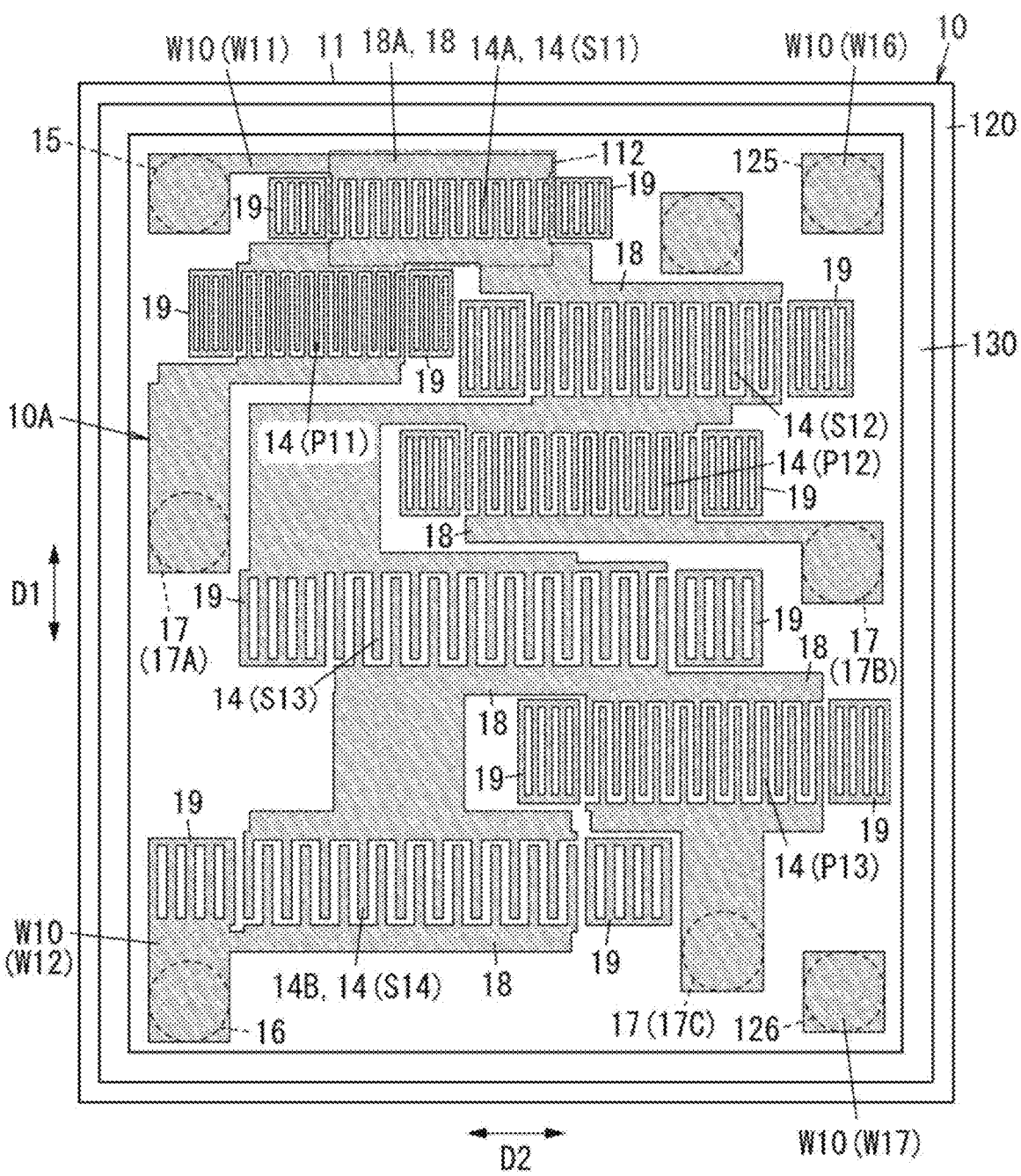
FIG. 9 is a plan view of a first transmission filter in an acoustic wave device according to Modification Example 1 of Exemplary embodiment 1.
Figure 10:
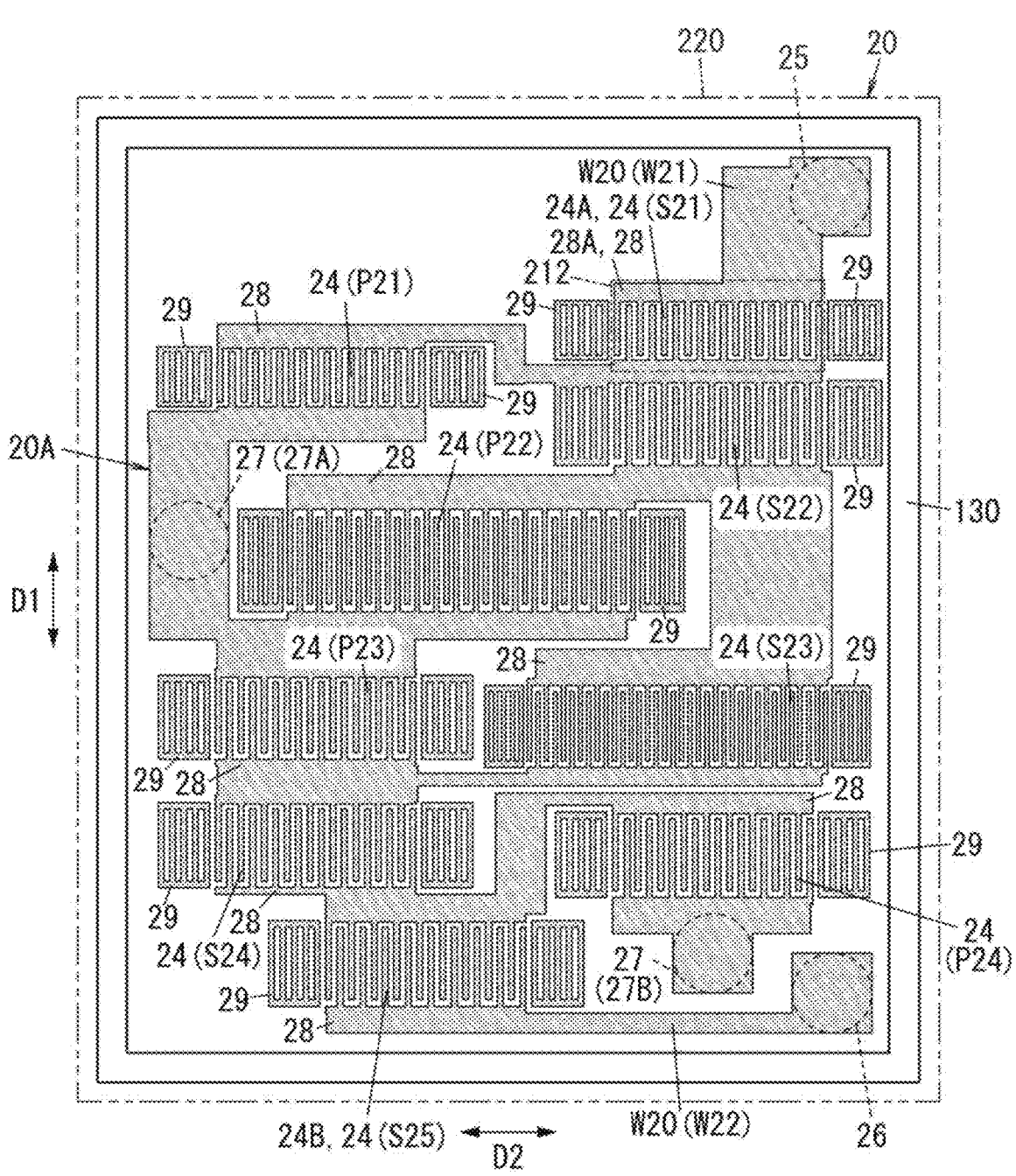
FIG. 10 is a perspective view illustrating a lower surface of a second transmission filter in the acoustic wave device when seen from an upper surface side of the second transmission filter.

In Modification Example 1 of the acoustic wave device ST1 (see FIG. 8) according to Exemplary embodiment 1, the first transmission filter 10 illustrated in FIG. 9 and the second transmission filter 20 illustrated in FIG. 10 are stacked instead of the first transmission filter 10 and the second transmission filter 20 in the acoustic wave device ST1 in FIG. 8. The first transmission filter 10 illustrated in FIG. 9 is different from the first transmission filter 10 illustrated in FIG. 6 in that the positions of the first input terminal 15 and the connection terminal 125 are reversed, the positions of the first output terminal 16 and the connection terminal 126 are different, and the layouts of the plurality of series arm resonators S11 to S14 and the plurality of parallel arm resonators P11 to P13 are different. The second transmission filter 20 illustrated in FIG. 10 is different from the second transmission filter 20 illustrated in FIG. 7 in that the positions of the second input terminal 25 and the second output terminal 26 are different, and the layouts of the plurality of series arm resonators S21 to S25 and the plurality of parallel arm resonators P21 to P24 are different. In FIG. 9, each functional electrode (IDT electrode) 18, each reflector 19, and each wiring portion W10 are hatched with dots, but the hatching does not represent a cross section, as in FIG. 6. Further, in FIG. 10, each functional electrode (IDT electrode) 28, each reflector 29, and each wiring portion W20 are hatched with dots, but the hatching does not represent a cross section, as in FIG. 7. In addition, in Modification Example 1 of the acoustic wave device ST1 according to Exemplary embodiment 1, the same constituent element as those of the acoustic wave device ST1 according to Exemplary embodiment 1 are denoted by the same reference numerals.

In Modification Example 1 of the acoustic wave device ST1 according to Exemplary embodiment 1, the formation region 112 of the first functional electrode 18A and the formation region 212 of the second functional electrode 28A do not overlap each other in plan view in the thickness direction D3 of the second transmission filter 20. As a result, in Modification Example 1 of the acoustic wave device ST1 according to Exemplary embodiment 1, it is possible to suppress the deterioration in the filter characteristics of each of the first transmission filter 10 and the second transmission filter 20 due to the temperature rise in the first transmission filter 10 and the second transmission filter 20.

(4.2) Modification Example 2

Figure 11:
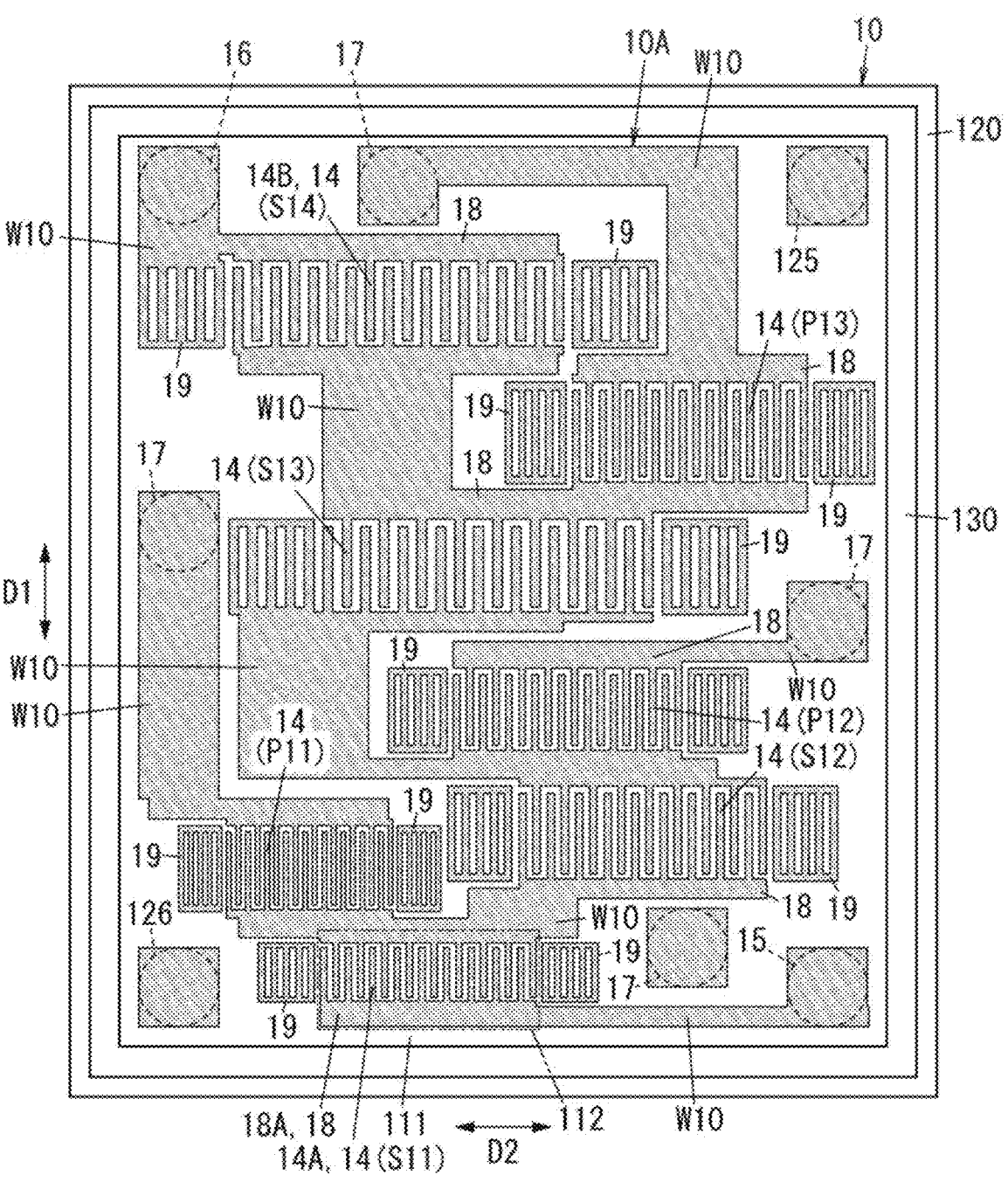
FIG. 11 is a plan view of a first transmission filter in an acoustic wave device according to Modification Example 2 of Exemplary embodiment 1.
Figure 12:
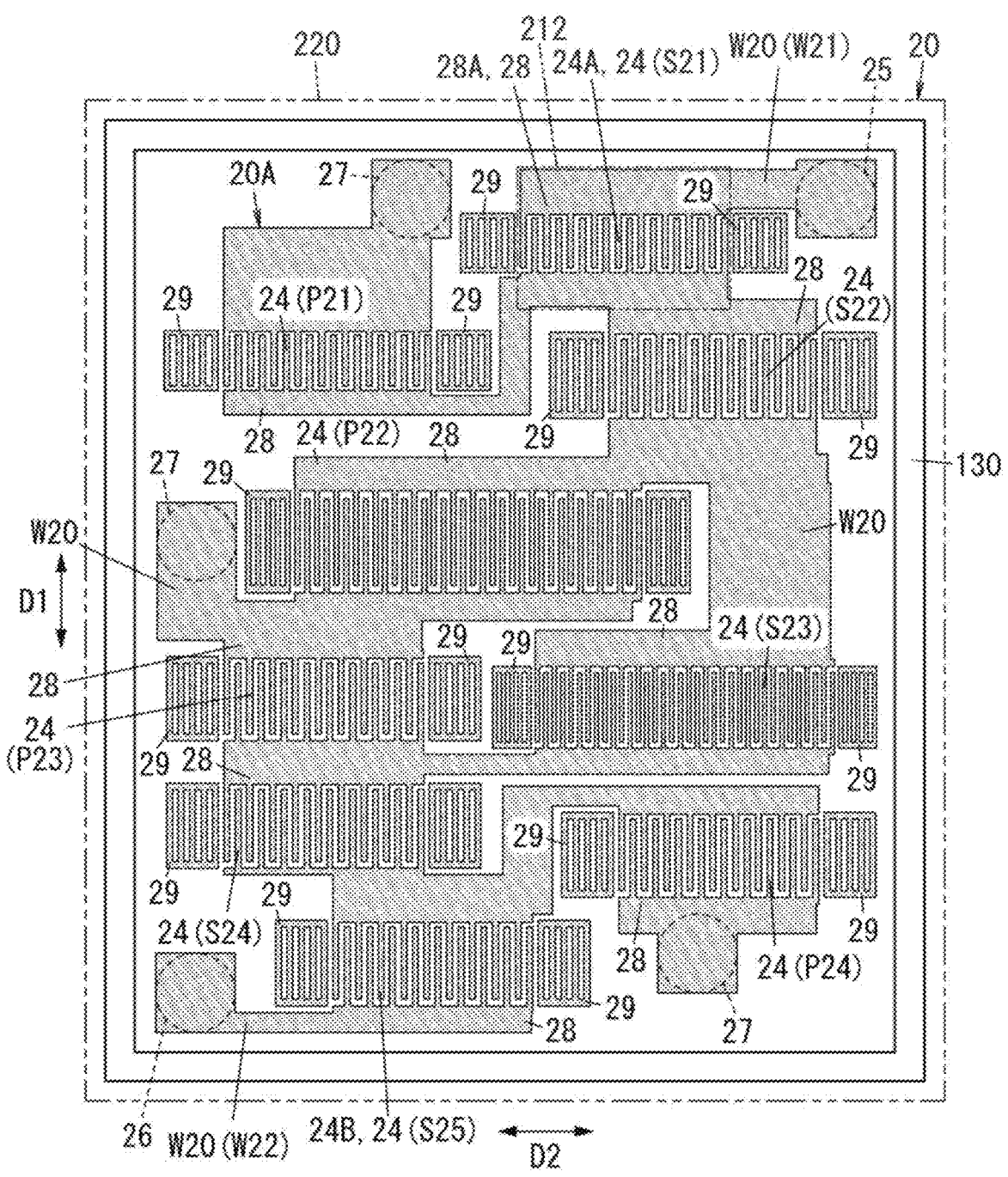
FIG. 12 is a perspective view illustrating a lower surface of a second transmission filter in the acoustic wave device when seen from an upper surface side of the second transmission filter.

In Modification Example 2 of the acoustic wave device ST1 (see FIG. 8) according to Exemplary embodiment 1, the first transmission filter 10 illustrated in FIG. 11 and the second transmission filter 20 illustrated in FIG. 12 are stacked instead of the first transmission filter 10 and the second transmission filter 20 in the acoustic wave device ST1 in FIG. 8.

In Modification Example 2, the series arm resonator S11, the series arm resonator S12, the parallel arm resonator P11, and the parallel arm resonator P12 of the first transmission filter 10 do not overlap any of the series arm resonator S21, the series arm resonator S22, the parallel arm resonator P21, and the parallel arm resonator P22 of the second transmission filter 20 in plan view in the thickness direction D3 (see FIG. 8) of the second transmission filter 20. The series arm resonator S11 of the first transmission filter 10 is the acoustic wave resonator 14 closest to the first input terminal 15 among the plurality of series arm resonators S11 to S14. The series arm resonator S12 of the first transmission filter 10 is the second closest acoustic wave resonator 14 to the first input terminal 15 among the plurality of series arm resonators S11 to S14. In addition, the parallel arm resonator P11 of the first transmission filter 10 is the acoustic wave resonator 14 closest to the first input terminal 15 among the plurality of parallel arm resonators P11 to P13. In addition, the parallel arm resonator P12 of the first transmission filter 10 is the acoustic wave resonator 14 that is the second closest to the first input terminal 15 among the plurality of parallel arm resonators P11 to P13. In FIG. 11, each functional electrode (IDT electrode) 18, each reflector 19, and each wiring portion W10 are hatched with dots, but the hatching does not represent a cross section, as in FIG. 6. In addition, in Modification Example 2, the same constituent elements as those in the acoustic wave device ST1 according to Exemplary embodiment 1 are denoted by the same reference numerals.

The series arm resonator S21 of the second transmission filter 20 is the acoustic wave resonator 24 closest to the second input terminal 25 among the plurality of series arm resonators S21 to S25. The series arm resonator S22 of the second transmission filter 20 is the acoustic wave resonator 24 that is the second closest to the second input terminal 25 among the plurality of series arm resonators S21 to S25. In addition, the parallel arm resonator P21 of the second transmission filter 20 is the acoustic wave resonator 24 closest to the second input terminal 25 among the plurality of parallel arm resonators P21 to P24. In addition, the parallel arm resonator P22 of the second transmission filter 20 is the acoustic wave resonator 24 that is the second closest to the second input terminal 25 among the plurality of parallel arm resonators P21 to P24. In FIG. 12, each functional electrode (IDT electrode) 28, each reflector 29, and each wiring portion W20 are hatched with dots, but the hatching does not represent a cross section, as in FIG. 7.

In the first transmission filter 10, the series arm resonator S11 closest to the first input terminal 15 among the plurality of series arm resonators S11 to S14 is likely to generate heat, and the series arm resonator S12 is likely to generate heat following the series arm resonator S11. In addition, in the first transmission filter 10, the parallel arm resonator P11 closest to the first input terminal 15 among the plurality of parallel arm resonators P11 to P13 is likely to generate heat, and the parallel arm resonator P12 is likely to generate heat following the parallel arm resonator P11. In the second transmission filter 20, the series arm resonator S21 closest to the second input terminal 25 among the plurality of series arm resonators S21 to S25 is likely to generate heat, and the series arm resonator S22 is likely to generate heat following the series arm resonator S21. In addition, in the second transmission filter 20, the parallel arm resonator P21 closest to the second input terminal 25 among the plurality of parallel arm resonators P21 to P24 is likely to generate heat, and the parallel arm resonator P22 is likely to generate heat following the parallel arm resonator P21.

In Modification Example 2 of the acoustic wave device ST1 according to Exemplary embodiment 1, the formation region 112 of the first functional electrode 18A and the formation region 212 of the second functional electrode 28A do not overlap each other in plan view in the thickness direction D3 of the second transmission filter 20. As a result, in Modification Example 2 of the acoustic wave device ST1 according to Exemplary embodiment 1, it is possible to suppress the deterioration in the filter characteristics of each of the first transmission filter 10 and the second transmission filter 20 due to the temperature rise in the first transmission filter 10 and the second transmission filter 20.

In Modification Example 2, as described above, the series arm resonator S11, the series arm resonator S12, the parallel arm resonator P11, and the parallel arm resonator P12 of the first transmission filter 10 do not overlap any of the series arm resonator S21, the series arm resonator S22, the parallel arm resonator P21, and the parallel arm resonator P22 of the second transmission filter 20 in plan view in the thickness direction D3 (see FIG. 8) of the second transmission filter 20. As a result, in Modification Example 2, it is possible to further improve the heat dissipation of the first transmission filter 10 and the second transmission filter 20 during the simultaneous communication.

In addition, in Modification Example 2, the plurality of acoustic wave resonators 14 of the first transmission filter 10 include the third acoustic wave resonator 14B closest to the first output terminal 16 of the first transmission filter 10. In Modification Example 2, the second acoustic wave resonator 24A and the third acoustic wave resonator 14B overlap each other in plan view in the thickness direction D3 of the second transmission filter 20. As a result, in Modification Example 2, it is possible to suppress the size increase in the first transmission filter 10 and the second transmission filter 20.

(4.3) Modification Example 3

Figure 13:
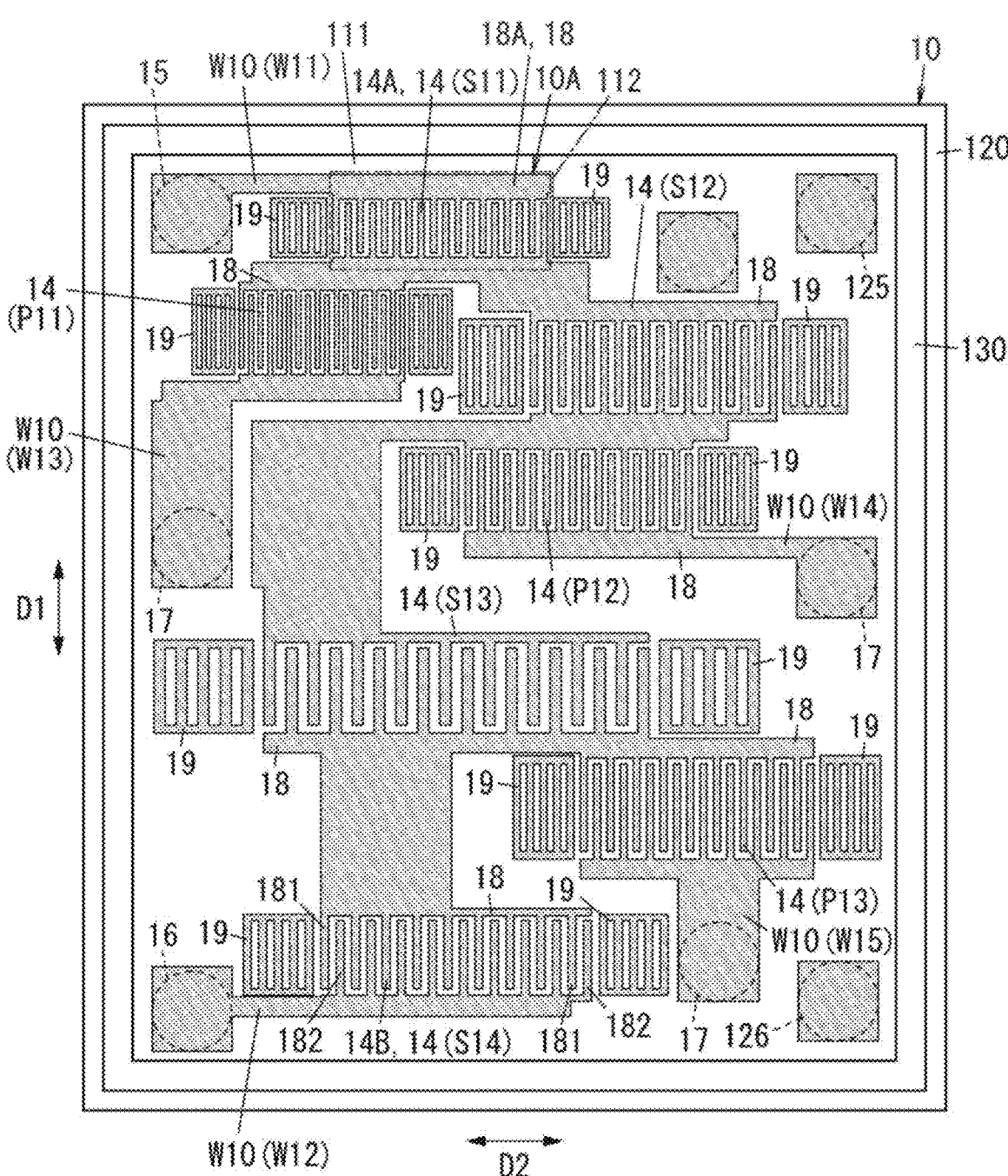
FIG. 13 is a plan view of a first transmission filter in an acoustic wave device according to Modification Example 3 of Exemplary embodiment 1.
Figure 14:
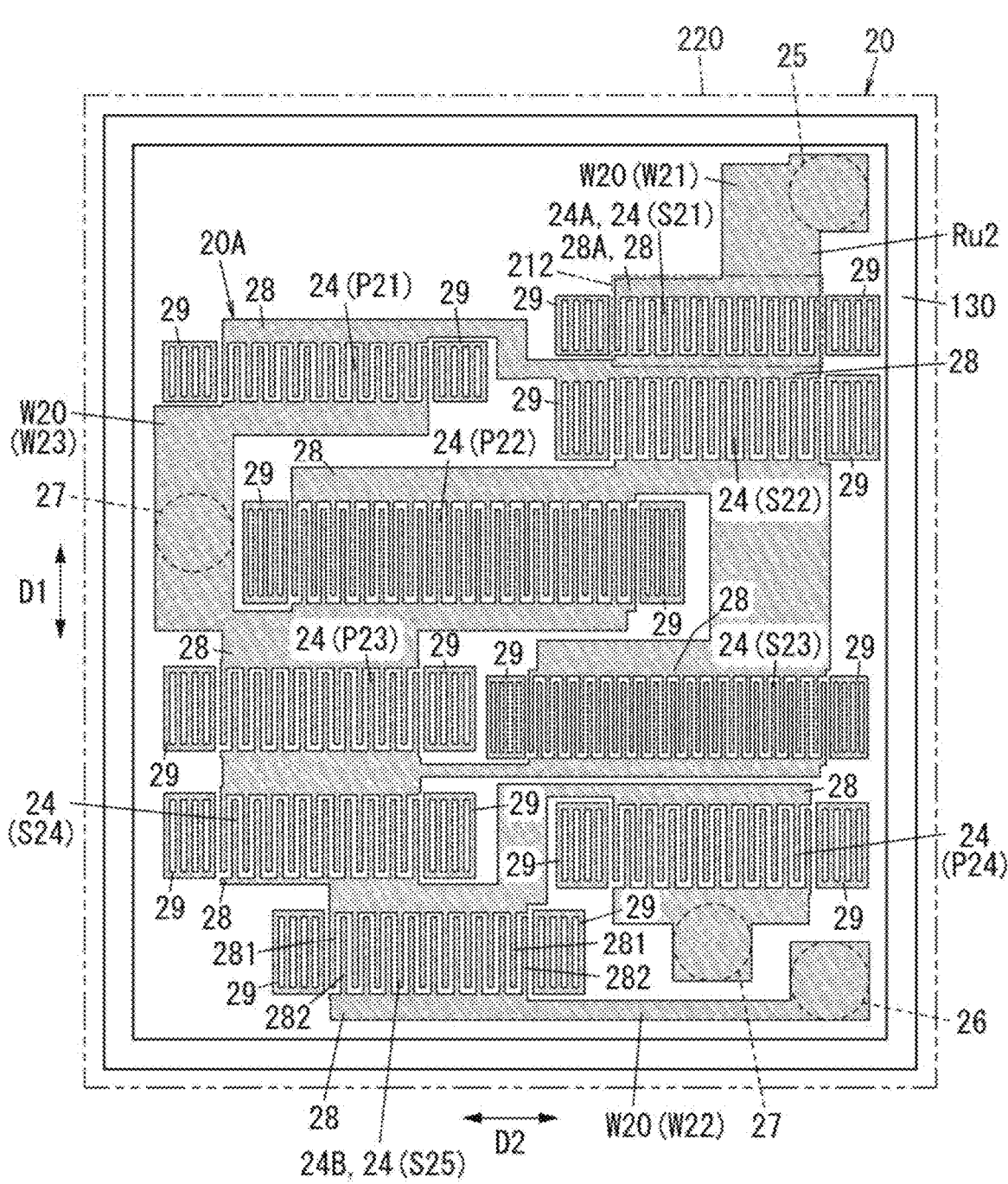
FIG. 14 is a perspective view illustrating a lower surface of a second transmission filter in the acoustic wave device when seen from an upper surface side of the second transmission filter.

In Modification Example 3 of the acoustic wave device ST1 (see FIG. 8) according to Exemplary embodiment 1, the first transmission filter 10 illustrated in FIG. 13 and the second transmission filter 20 illustrated in FIG. 14 are stacked instead of the first transmission filter 10 and the second transmission filter 20 in the acoustic wave device ST1 in FIG. 8. In Modification Example 3, the third acoustic wave resonator 14B and the fourth acoustic wave resonator 24B overlap each other in plan view in the thickness direction D3 (see FIG. 8) of the second transmission filter 20. In Modification Example 3, as compared to the acoustic wave device ST1 according to Exemplary embodiment 1, in plan view in the thickness direction D3 of the transmission filter 20, an area of the third acoustic wave resonator 14B overlapping the fourth acoustic wave resonator 24B is wide, and an area of the fourth acoustic wave resonator 24B overlapping the third acoustic wave resonator 14B is also wide. In the acoustic wave device ST1 according to Exemplary embodiment 1, a cross region of the IDT electrode (functional electrode 18) of the third acoustic wave resonator 14B and a cross region of the IDT electrode (functional electrode 28) of the fourth acoustic wave resonator 24B do not overlap each other. On the other hand, in Modification Example 3, a cross region of the IDT electrode of the third acoustic wave resonator 14B and a cross region of the IDT electrode of the fourth acoustic wave resonator 24B overlap each other. The cross region of the IDT electrode (functional electrode 18) is defined by the plurality of first electrode fingers 181 and the plurality of second electrode fingers 182 of the IDT electrode. The cross region of the IDT electrode (functional electrode 18) is a region between an envelope of distal ends of the plurality of first electrode fingers 181 and an envelope of distal ends of the plurality of second electrode fingers 182. The cross region of the IDT electrode (functional electrode 28) is defined by the plurality of first electrode fingers 281 and the plurality of second electrode fingers 282 of the IDT electrode. The cross region of the IDT electrode (functional electrode 28) is a region between an envelope of distal ends of the plurality of first electrode fingers 281 and an envelope of distal ends of the plurality of second electrode fingers 282. In FIG. 13, each functional electrode (IDT electrode) 18, each reflector 19, and each wiring portion W10 are hatched with dots, but the hatching does not represent a cross section, as in FIG. 6. Further, in FIG. 14, each functional electrode (IDT electrode) 28, each reflector 29, and each wiring portion W20 are hatched with dots, but the hatching does not represent a cross section, as in FIG. 7. In addition, in Modification Example 3, the same constituent elements as those in the acoustic wave device ST1 according to Exemplary embodiment 1 are denoted by the same reference numerals.

In Modification Example 3 of the acoustic wave device ST1 according to Exemplary embodiment 1, the formation region 112 of the first functional electrode 18A and the formation region 212 of the second functional electrode 28A do not overlap each other in plan view in the thickness direction D3 of the second transmission filter 20. As a result, in Modification Example 3 of the acoustic wave device ST1 according to Exemplary embodiment 1, it is possible to suppress the deterioration in the filter characteristics of each of the first transmission filter 10 and the second transmission filter 20 due to the temperature rise in the first transmission filter 10 and the second transmission filter 20.

(4.4) Modification Example 4

Figures 15A, 15B:
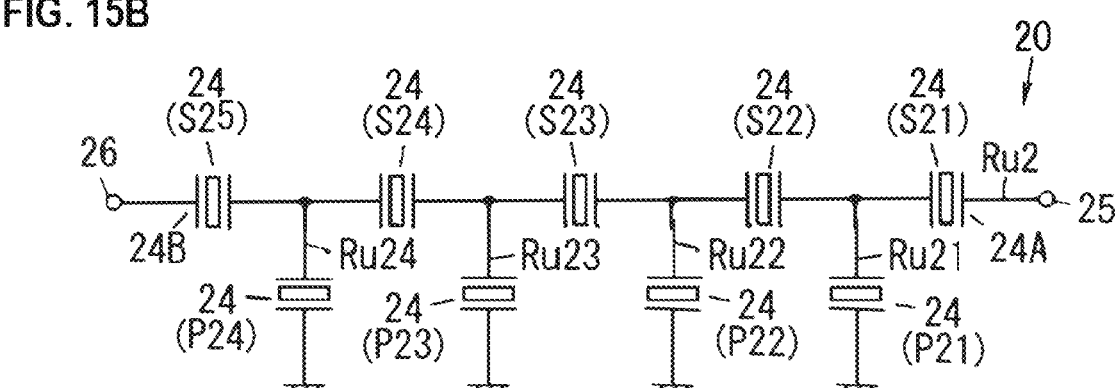
FIG. 15A is a circuit diagram of a first transmission filter in an acoustic wave device according to Modification Example 4 of Exemplary embodiment 1.
FIG. 15B is a circuit diagram of a second transmission filter in the acoustic wave device.

In Modification Example 4, the acoustic wave device ST1 (see FIG. 8) according to Exemplary embodiment 1 is different from the acoustic wave device ST1 according to Exemplary embodiment 1 in that, as illustrated in FIG. 15A, the plurality of acoustic wave resonators 14 included in the first transmission filter 10 include two longitudinally coupled resonators DMS1 and DMS2, one series arm resonator S11, and one parallel arm resonator P11. In Modification Example 4, the longitudinally coupled resonator DMS1 among the plurality of acoustic wave resonators 14 constitutes the first acoustic wave resonator 14A. Further, in Modification Example 4, the series arm resonator S11 among the plurality of acoustic wave resonators 14 constitutes the third acoustic wave resonator 14B. As illustrated in FIG. 15B, the second transmission filter 20 includes the plurality of (for example, nine) acoustic wave resonators 24, as in the acoustic wave device ST1 according to Exemplary embodiment 1.

The first transmission filter 10 includes a first acoustic wave filter having the plurality of (four in the illustrated example) acoustic wave resonators 14. The four acoustic wave resonators 14 include two longitudinally coupled resonators DMS1 and DMS2, one series arm resonator S11, and one parallel arm resonator P11. The two longitudinally coupled resonators DMS1 and DMS2 and the one series arm resonator S11 are provided on the signal route Ru1 (hereinafter, also referred to as the series arm route Ru1) between the first input terminal 15 and the first output terminal 16. In the series arm route Ru1, the two longitudinally coupled resonators DMS1 and DMS2 and the one series arm resonator S11 are connected in series. In the first acoustic wave filter, on the series arm route Ru1, the longitudinally coupled resonator DMS1, the longitudinally coupled resonator DMS2, and the one series arm resonator S11 are arranged in an order of the longitudinally coupled resonator DMS1, the longitudinally coupled resonator DMS2, and the one series arm resonator S11 from the first input terminal 15 side. The parallel arm resonator P11 is provided on the route Ru11 between a route between the longitudinally coupled resonator DMS2 and the series arm resonator S11 in the series arm route Ru1 and the ground.

Figure 16:
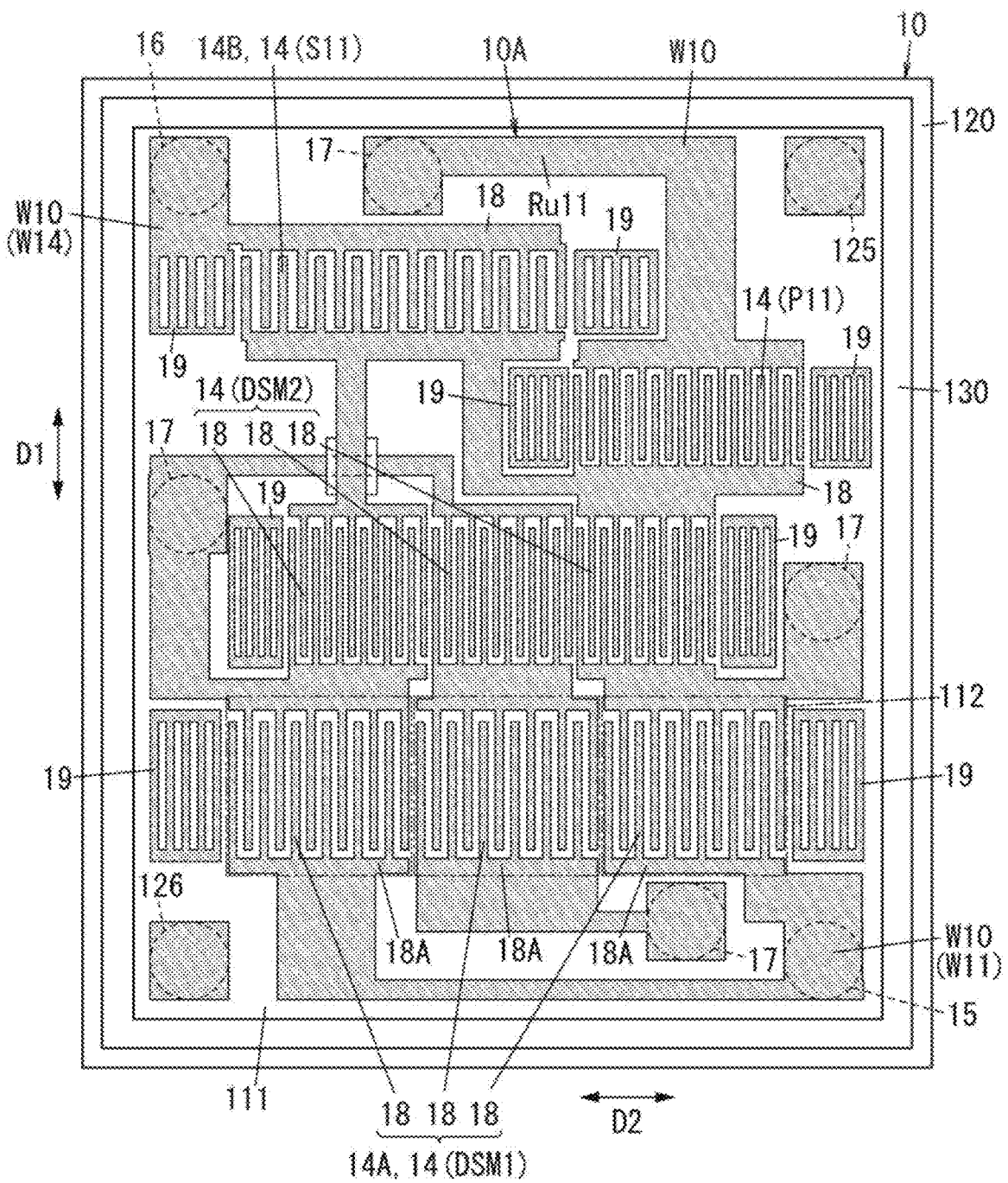
FIG. 16 is a plan view of the first transmission filter in the acoustic wave device.
Figure 17:
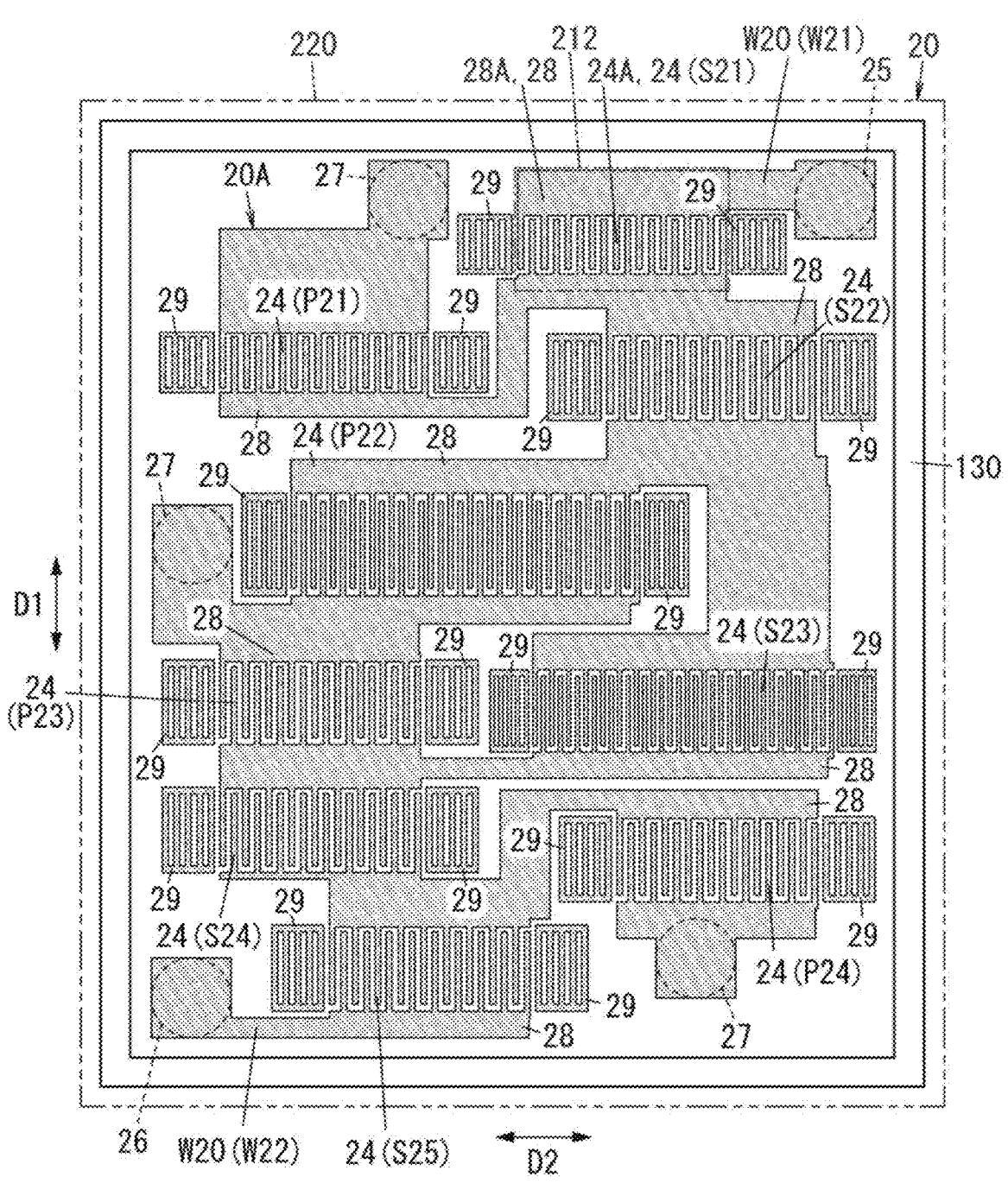
FIG. 17 is a perspective view illustrating a lower surface of the second transmission filter in the acoustic wave device when seen from an upper surface side of the second transmission filter.

In Modification Example 4, the first transmission filter 10 illustrated in FIG. 16 and the second transmission filter 20 illustrated in FIG. 17 are stacked instead of the first transmission filter 10 and the second transmission filter 20 in the acoustic wave device ST1 illustrated in FIG. 8.

The longitudinally coupled resonator DMS1 of the first transmission filter 10 includes three functional electrodes 18 disposed between two reflectors 19 that are spaced apart from each other in the second direction D2. Each of the three functional electrodes 18 of the longitudinally coupled resonator DMS1 is an IDT electrode. In addition, the longitudinally coupled resonator DMS2 includes three functional electrodes 18 that are disposed between the two reflectors 19 that are spaced apart from each other in the second direction D2. Each of the three functional electrodes 18 of the longitudinally coupled resonator DMS2 is an IDT electrode. In FIG. 16, each functional electrode (IDT electrode) 18, each reflector 19, and each wiring portion W10 are hatched with dots, but the hatching does not represent a cross section, as in FIG. 6. In addition, in Modification Example 4, the same constituent elements as those in the acoustic wave device ST1 according to Exemplary embodiment 1 are denoted by the same reference numerals.

As illustrated in FIG. 17, the second transmission filter 20 includes the second input terminal 25 and the second output terminal 26 that are spaced apart from each other in a direction of one diagonal line of the second substrate 220, and is different from the second transmission filter 20 illustrated in FIG. 7 in the layouts of the plurality of series arm resonators S21 to S25, the plurality of parallel arm resonators P21 to P24, the plurality of ground terminals 27, and the like. In FIG. 17, each functional electrode (IDT electrode) 28, each reflector 29, and each wiring portion W20 are hatched with dots, but the hatching does not represent a cross section, as in FIG. 7.

In Modification Example 4, the first acoustic wave resonator 14A of the first transmission filter 10 and the second acoustic wave resonator 24A of the second transmission filter 20 do not overlap each other in plan view in the thickness direction D3 (see FIG. 8) of the second transmission filter 20. That is, in Modification Example 4 of the acoustic wave device ST1 according to Exemplary embodiment 1, the formation region 112 of the first functional electrode 18A and the formation region 212 of the second functional electrode 28A do not overlap each other in plan view in the thickness direction D3 of the second transmission filter 20. As a result, in Modification Example 4 of the acoustic wave device ST1 according to Exemplary embodiment 1, it is possible to suppress the deterioration in the filter characteristics of each of the first transmission filter 10 and the second transmission filter 20 due to the temperature rise in the first transmission filter 10 and the second transmission filter 20.

In addition, in Modification Example 4, the series arm resonator S21 (second acoustic wave resonator 24A), the parallel arm resonator P21, and the series arm resonator S22 of the second transmission filter 20 do not overlap the longitudinally coupled resonator DMS1 (first acoustic wave resonator 14A) of the first transmission filter 10 in plan view in the thickness direction D3 of the second transmission filter 20. As a result, in Modification Example 4, it is possible to further suppress the deterioration in the filter characteristics of each of the first transmission filter 10 and the second transmission filter 20 due to the temperature rise in the first transmission filter 10 and the second transmission filter 20.

(4.5) Modification Example 5

Figure 18A:
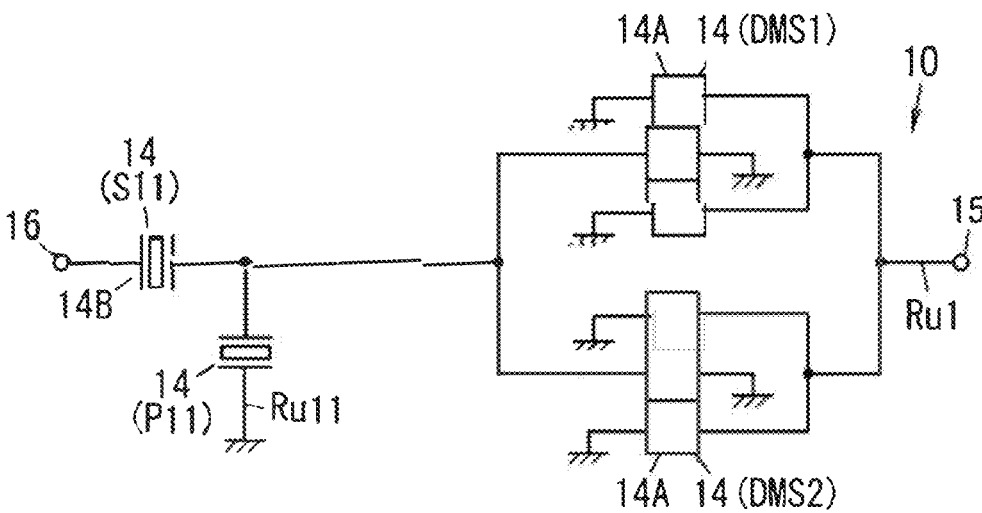
FIG. 18A is a circuit diagram of a first transmission filter in an acoustic wave device according to Modification Example 5 of Exemplary embodiment 1.
Figure 18B:
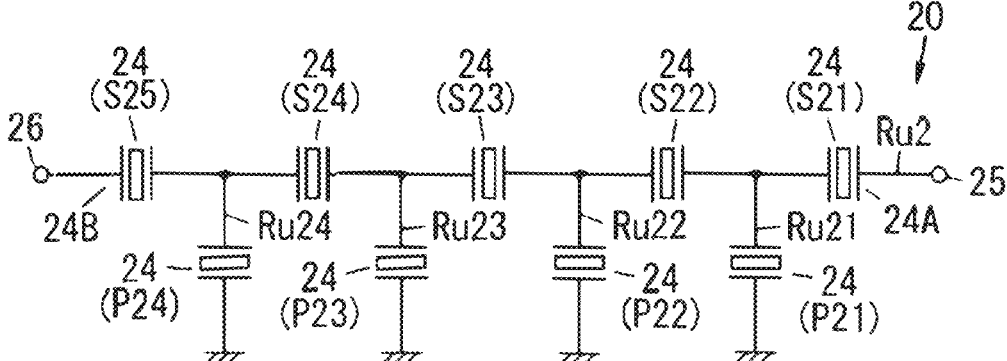
FIG. 18B is a circuit diagram of a second transmission filter in the acoustic wave device.

In Modification Example 5, the acoustic wave device ST1 according to Exemplary embodiment 1 is different from the acoustic wave device ST1 according to Exemplary embodiment 1 in that, as illustrated in FIG. 18A, the plurality of acoustic wave resonators 14 included in the first transmission filter 10 include two longitudinally coupled resonators DMS1 and DMS2, one series arm resonator S11, and one parallel arm resonator P11. In Modification Example 5, the two longitudinally coupled resonators DMS1 and DMS2 among the plurality of acoustic wave resonators 14 constitute the first acoustic wave resonator 14A. Further, in Modification Example 5, the series arm resonator S11 among the plurality of acoustic wave resonators 14 constitutes the third acoustic wave resonator 14B. As illustrated in FIG. 18B, the second transmission filter 20 includes the plurality of acoustic wave resonators 24, as in the acoustic wave device ST1 according to Exemplary embodiment 1.

The first transmission filter 10 includes a first acoustic wave filter having the plurality of (four in the illustrated example) acoustic wave resonators 14. The four acoustic wave resonators 14 include two longitudinally coupled resonators DMS1 and DMS2, one series arm resonator S11, and one parallel arm resonator P11. A parallel circuit of the two longitudinally coupled resonators DMS1 and DMS2 is connected to the first input terminal 15 and the series arm resonator S11. In the first acoustic wave filter, on the series arm route Ru1, the parallel circuit of the two longitudinally coupled resonators DMS1 and DMS2 and the one series arm resonator S11 are arranged in an order of the parallel circuit of the two longitudinally coupled resonators DMS1 and DMS2 and the one series arm resonator S11 from the first input terminal 15 side. The parallel arm resonator P11 is provided on the route Ru11 between a route between the parallel circuit of the two longitudinally coupled resonators DMS1 and DMS2 and the series arm resonator S11 in the series arm route Ru1 and the ground.

Figure 19:
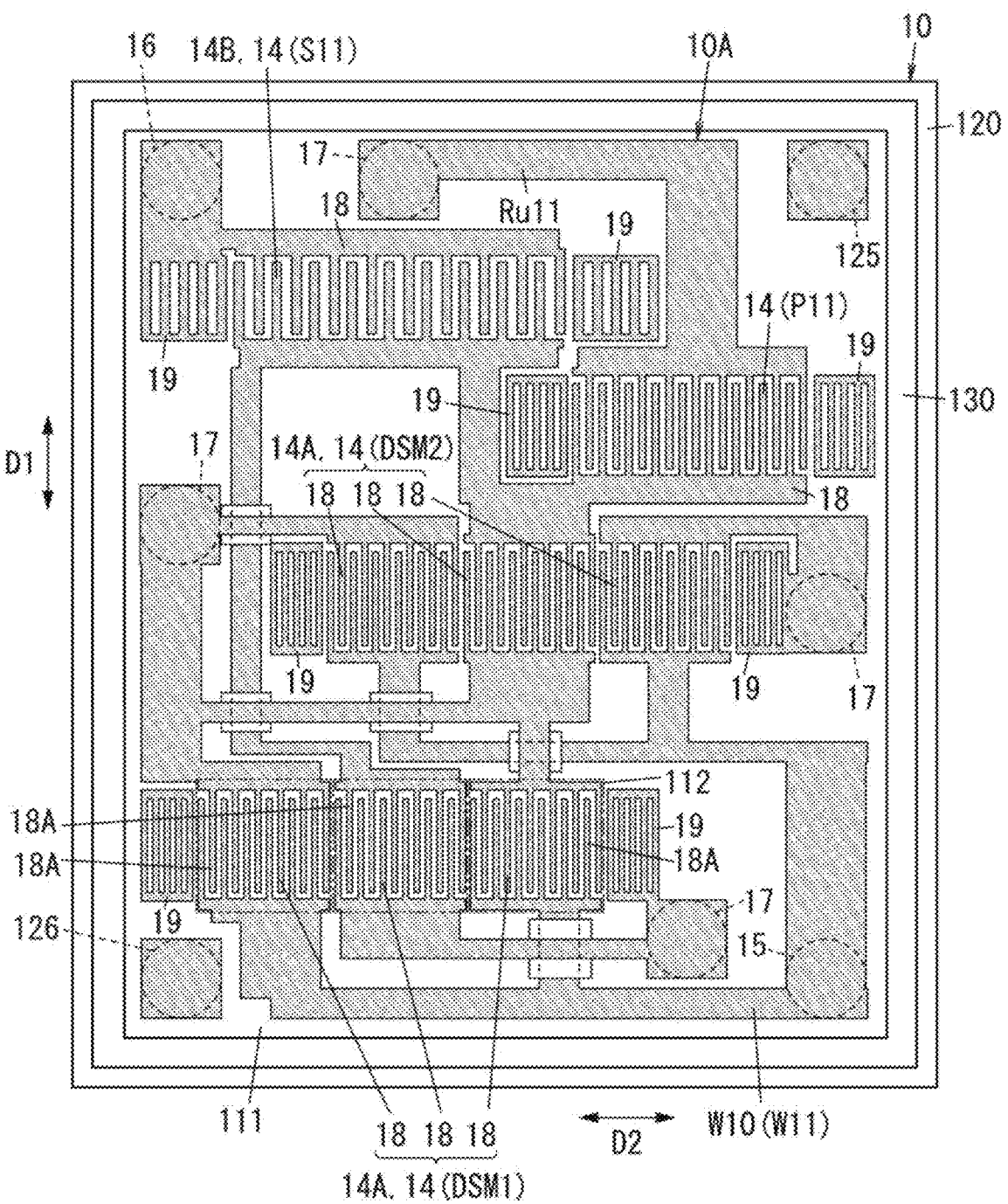
FIG. 19 is a plan view of the first transmission filter in the acoustic wave device.
Figure 20:
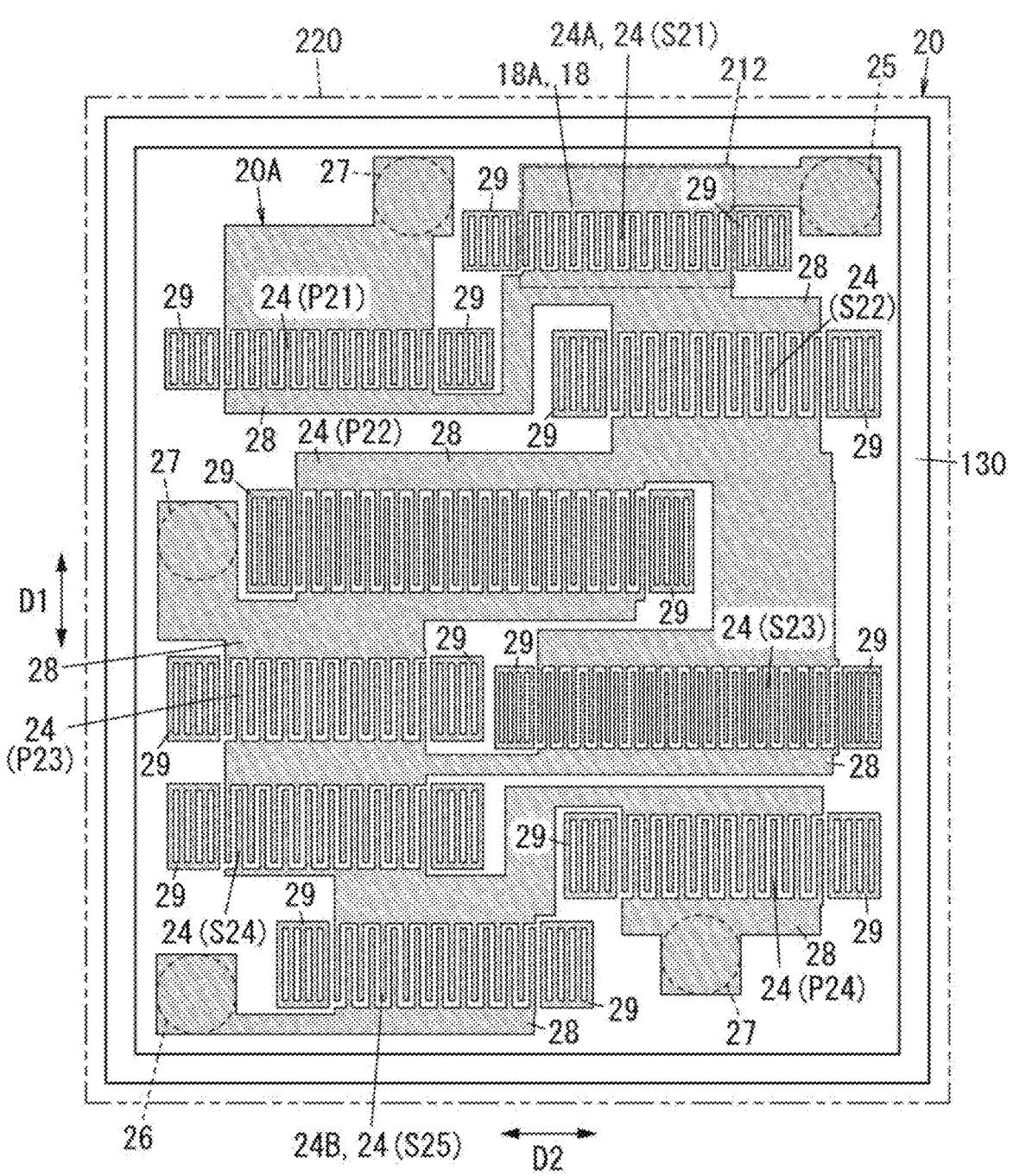
FIG. 20 is a perspective view illustrating a lower surface of the second transmission filter in the acoustic wave device when seen from an upper surface side of the second transmission filter.

In Modification Example 5, the first transmission filter 10 illustrated in FIG. 19 and the second transmission filter 20 illustrated in FIG. 20 are stacked instead of the first transmission filter 10 and the second transmission filter 20 in the acoustic wave device ST1 illustrated in FIG. 8.

The longitudinally coupled resonator DMS1 of the first transmission filter 10 includes three functional electrodes 18 disposed between two reflectors 19 that are spaced apart from each other in the second direction D2. Each of the three functional electrodes 18 of the longitudinally coupled resonator DMS1 is an IDT electrode. In addition, the longitudinally coupled resonator DMS2 includes three functional electrodes 18 that are disposed between the two reflectors 19 that are spaced apart from each other in the second direction D2. Each of the three functional electrodes 18 of the longitudinally coupled resonator DMS2 is an IDT electrode. In FIG. 19, each functional electrode (IDT electrode) 18, each reflector 19, and each wiring portion W10 are hatched with dots, but the hatching does not represent a cross section, as in FIG. 6. In addition, in Modification Example 5, the same constituent elements as those in the acoustic wave device ST1 according to Exemplary embodiment 1 are denoted by the same reference numerals.

As illustrated in FIG. 20, the second transmission filter 20 includes the second input terminal 25 and the second output terminal 26 that are spaced apart from each other in a direction of one diagonal line of the second substrate 220, and is different from the second transmission filter 20 illustrated in FIG. 7 in the layouts of the plurality of series arm resonators S21 to S25, the plurality of parallel arm resonators P21 to P24, the plurality of ground terminals 27, and the like. In FIG. 20, each functional electrode (IDT electrode) 28, each reflector 29, and each wiring portion W20 are hatched with dots, but the hatching does not represent a cross section, as in FIG. 7.

In Modification Example 5, the first acoustic wave resonator 14A of the first transmission filter 10 and the second acoustic wave resonator 24A of the second transmission filter 20 do not overlap each other in plan view in the thickness direction (D3) of the second transmission filter 20. That is, in Modification Example 5 of the acoustic wave device ST1 according to Exemplary embodiment 1, the formation region 112 of the first functional electrode 18A and the formation region 212 of the second functional electrode 28A do not overlap each other in plan view in the thickness direction D3 of the second transmission filter 20. As a result, in Modification Example 5 of the acoustic wave device ST1 according to Exemplary embodiment 1, it is possible to suppress the deterioration in the filter characteristics of each of the first transmission filter 10 and the second transmission filter 20 due to the temperature rise in the first transmission filter 10 and the second transmission filter 20.

In addition, in Modification Example 5, the series arm resonator S21 (second acoustic wave resonator 24A), the parallel arm resonator P21, and the series arm resonator S22 of the second transmission filter 20 do not overlap the longitudinally coupled resonator DMS1 (first acoustic wave resonator 14A) or the longitudinally coupled resonator DMS2 (first acoustic wave resonator 14A) of the first transmission filter 10 in plan view in the thickness direction D3 of the second transmission filter 20. As a result, in Modification Example 5, it is possible to further suppress the deterioration in the filter characteristics of each of the first transmission filter 10 and the second transmission filter 20 due to the temperature rise in the first transmission filter 10 and the second transmission filter 20.

(4.6) Other Modification Examples of Exemplary Embodiment 1

The first substrate 120 (see FIG. 8) in the first transmission filter 10 may have, for example, a configuration including a first support substrate and a first high acoustic velocity film interposed between the first support substrate and the low acoustic velocity film 122, instead of the high acoustic velocity member 121. The first high acoustic velocity film is a film in which the acoustic velocity of the bulk wave propagating through the first high acoustic velocity film is higher than the acoustic velocity of the acoustic wave propagating through the piezoelectric layer 123. The second substrate 220 (see FIG. 8) in the second transmission filter 20 may have, for example, a configuration including a second support substrate and a second high acoustic velocity film interposed between the second support substrate and the low acoustic velocity film 222, instead of the high acoustic velocity member 221. The second high acoustic velocity film is a film in which the acoustic velocity of the bulk wave propagating through the second high acoustic velocity film is higher than the acoustic velocity of the acoustic wave propagating through the piezoelectric layer 223. A material of each of the first high acoustic velocity film and the second high acoustic velocity film is, for example, silicon nitride, but is not limited to silicon nitride, and may be at least one type selected from the group consisting of diamond-like carbon, aluminum nitride, silicon carbide, silicon oxynitride, silicon, sapphire, lithium tantalate, lithium niobate, crystal, zirconia, cordierite, mullite, steatite, forsterite, magnesia, and diamond.

In addition, the first substrate 120 may include, for example, an adhesion layer interposed between the low acoustic velocity film 122 and the piezoelectric layer 123. The adhesion layer is made of, for example, resin (epoxy resin or polyimide resin). Further, the first substrate 120 may include a dielectric film between the low acoustic velocity film 122 and the piezoelectric layer 123, on the piezoelectric layer 123, or under the low acoustic velocity film 122. In addition, the second substrate 220 may include, for example, an adhesion layer interposed between the low acoustic velocity film 222 and the piezoelectric layer 223. The adhesion layer is made of, for example, resin (epoxy resin or polyimide resin). In addition, the second substrate 220 may include a dielectric film between the low acoustic velocity film 222 and the piezoelectric layer 223, on the piezoelectric layer 223, or under the low acoustic velocity film 222. The first transmission filter 10 may further include a first protective film that is provided on the piezoelectric layer 123 and that covers the plurality of functional electrodes 18 and the plurality of reflectors 19. A material of the first protective film is, for example, silicon dioxide. The second transmission filter 20 may further include a second protective film that is provided on the piezoelectric layer 223 and that covers the plurality of functional electrodes 28 and the plurality of reflectors 29. A material of the second protective film is, for example, silicon dioxide.

In addition, in the first transmission filter 10, the first substrate 120 may include a piezoelectric substrate instead of a stacked substrate including the high acoustic velocity member 121, the low acoustic velocity film 122, and the piezoelectric layer 123. The piezoelectric substrate is, for example, a lithium tantalate substrate or a lithium niobate substrate. In addition, in the second transmission filter 20, the second substrate 220 may include a piezoelectric substrate instead of a stacked substrate including the high acoustic velocity member 221, the low acoustic velocity film 222, and the piezoelectric layer 223. The piezoelectric substrate is, for example, a lithium tantalate substrate or a lithium niobate substrate.

Exemplary Embodiment 2

Figure 21:
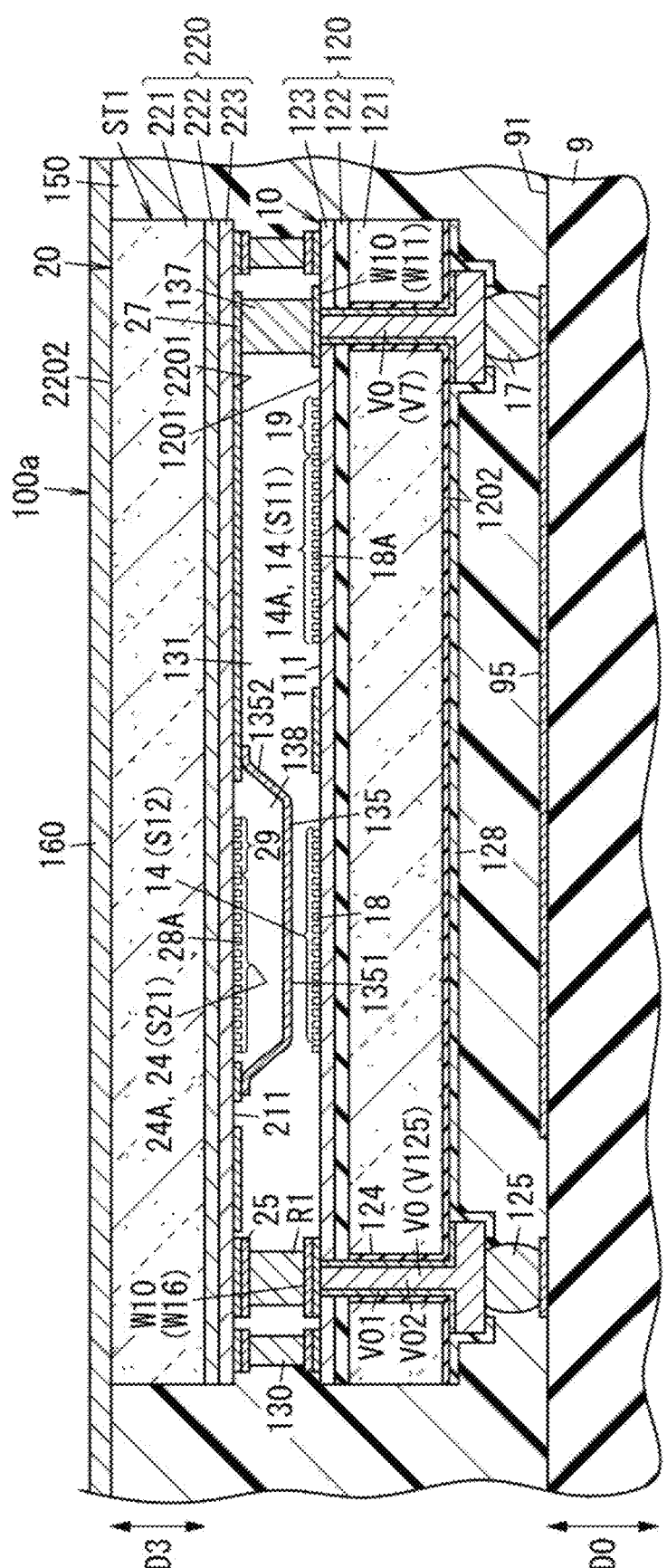
FIG. 21 is a cross-sectional view of a radio frequency module according to Exemplary embodiment 2.

An acoustic wave device ST1 and a radio frequency module 100a according to Exemplary embodiment 2 will be described with reference to FIG. 21. Regarding the acoustic wave device ST1 and the radio frequency module 100a according to Exemplary embodiment 2, the same constituent elements as those of the acoustic wave device ST1 and the radio frequency module 100 according to Exemplary embodiment 1 are denoted by the same reference numerals, and the description thereof is omitted.

(1) Configuration

The radio frequency module 100a according to Exemplary embodiment 2 is different from the radio frequency module 100 according to Exemplary embodiment 1 in that the acoustic wave device ST1 further includes a shield electrode 135. In the acoustic wave device ST1 within the radio frequency module 100a, the shield electrode 135 is disposed in the hollow space 131 surrounded by the first transmission filter 10, the second transmission filter 20, and the spacer portion 130. The shield electrode 135 is disposed between the first transmission filter 10 and the second transmission filter 20 in the thickness direction D3 of the second transmission filter 20, and overlaps the second functional electrode 28A. The mounting substrate 9 further includes a ground electrode 95 to which the shield electrode 135 is connected.

The shield electrode 135 includes a first shield portion 1351 spaced apart from the second transmission filter 20 in the thickness direction D3 of the second transmission filter 20, and a second shield portion 1352 connecting the second transmission filter 20 and the first shield portion 1351. The first shield portion 1351 and the second shield portion 1352 are integrated as a single unit. A material of the shield electrode 135 includes metal. In the radio frequency module 100a, the acoustic wave device ST1 includes a cavity 138 formed between the shield electrode 135, the third main surface 2201 of the second substrate 220, and the second functional electrode 28A. The cavity 138 between the shield electrode 135, the third main surface 2201 of the second substrate 220, and the second functional electrode 28A can be formed by using, for example, sacrificial layer etching technology.

(2) Effects

In the acoustic wave device ST1 according to Exemplary embodiment 2, the first acoustic wave resonator 14A and the second acoustic wave resonator 24A do not overlap each other in plan view in the thickness direction D3 of the second transmission filter 20. That is, in the acoustic wave device ST1 according to Exemplary embodiment 2, the formation region 112 (see FIG. 6) of the first functional electrode 18A and the formation region 212 (see FIG. 7) of the second functional electrode 28A do not overlap each other in plan view in the thickness direction D3 of the second transmission filter 20. As a result, with the acoustic wave device ST1 according to Exemplary embodiment 2, it is possible to suppress the deterioration in the filter characteristics of each of the first transmission filter 10 and the second transmission filter 20 due to the temperature rise in the first transmission filter 10 and the second transmission filter 20.

In addition, in the radio frequency module 100a according to Exemplary embodiment 2, the acoustic wave device ST1 includes the shield electrode 135, and the shield electrode 135 is connected to the ground electrode 95 of the mounting substrate 9. As a result, the radio frequency module 100a according to Exemplary embodiment 2 can improve the isolation between the first transmission filter 10 and the second transmission filter 20.

In the radio frequency module 100a according to Exemplary embodiment 2, the ground electrode 95 overlaps the first acoustic wave resonator 14A in plan view in the thickness direction D3 of the second transmission filter 20. As a result, in the radio frequency module 100a according to Exemplary embodiment 2, the heat generated in the first acoustic wave resonator 14A is more likely to be dissipated through the ground electrode 95, thereby further improving the heat dissipation.

Further, in the radio frequency module 100a according to Exemplary embodiment 2, the acoustic wave device ST1 further includes a ground conductor portion 137. The ground conductor portion 137 is located between the first transmission filter 10 and the second transmission filter 20 in the thickness direction D3 of the second transmission filter 20. The ground conductor portion 137 connects the first transmission filter 10 and the second transmission filter 20. The first transmission filter 10 further includes the via conductor V0 (ground via conductor V7) connected to the ground terminal 27 of the second transmission filter 20 with the ground conductor portion 137 interposed therebetween. The ground via conductor V7 passes through the first substrate 120 in the thickness direction. The ground via conductor V7 is connected to the ground electrode 95 of the mounting substrate 9. As a result, in the radio frequency module 100a according to Exemplary embodiment 2, the heat generated in the first acoustic wave resonator 14A of the first transmission filter 10 is less likely to be transmitted to the second transmission filter 20.

Exemplary Embodiment 3

Figure 22:
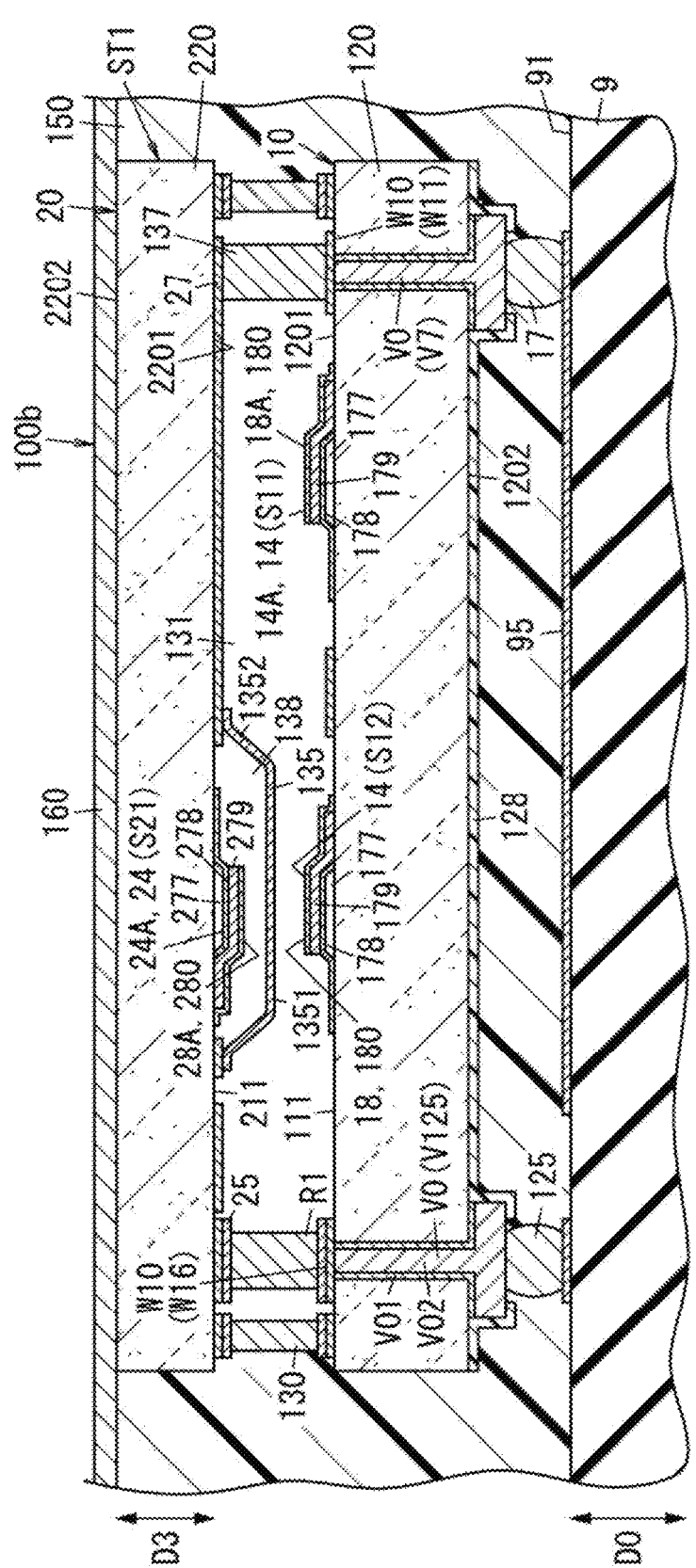
FIG. 22 is a cross-sectional view of a radio frequency module according to Exemplary embodiment 3.

An acoustic wave device ST1 and a radio frequency module 100b according to Exemplary embodiment 3 will be described with reference to FIG. 22. Regarding the acoustic wave device ST1 and the radio frequency module 100b according to Exemplary embodiment 3, the same constituent elements as those of the acoustic wave device ST1 and the radio frequency module 100a according to Exemplary embodiment 2 are denoted by the same reference numerals, and the description thereof is omitted.

(1) Configuration

The acoustic wave device ST1 according to Exemplary embodiment 3 is different from the acoustic wave device ST1 according to Exemplary embodiment 1 in that the plurality of acoustic wave resonators 14 are bulk acoustic wave (BAW) resonators and the plurality of acoustic wave resonators 24 are also BAW resonators.

The first substrate 120 of the first transmission filter 10 is, for example, a silicon substrate or a spinel substrate. The BAW resonator constituting the acoustic wave resonator 14 includes a lower electrode 178 provided on the first main surface 1201 side of the first substrate 120, a piezoelectric film 179 on the lower electrode 178, and an upper electrode 180 on the piezoelectric film 179. In the first transmission filter 10, each of the upper electrodes 180 of the acoustic wave resonators 14 constitutes the functional electrode 18. In the first transmission filter 10, the upper electrode 180 of the first acoustic wave resonator 14A constitutes the first functional electrode 18A. A material of the piezoelectric film 179 is, for example, AlN, ScAlN, LiTaO$_3$, LiNbO$_3$, or lead zirconate titanate (PZT). The BAW resonator constituting the acoustic wave resonator 14 includes a cavity 177 on the side of the lower electrode 178 opposite to the piezoelectric film 179 side. Therefore, the first functional electrode 18A is formed on the first functional surface 111 of the first transmission filter 10 with the cavity 177, the lower electrode 178, and the piezoelectric film 179 interposed therebetween. The formation region of the first functional electrode 18A is a region of the first functional surface 111 overlapping the cavity 177. The BAW resonator constituting the acoustic wave resonator 14 is a film bulk acoustic resonator (FBAR), but is not limited to this, and may be a solidly mounted resonator (SMR).

The second substrate 220 in the second transmission filter 20 is, for example, a silicon substrate or a spinel substrate. The BAW resonator constituting the acoustic wave resonator 24 includes a lower electrode 278 provided on the third main surface 2201 side of the second substrate 220, a piezoelectric film 279 on the lower electrode 278, and an upper electrode 280 on the piezoelectric film 279. In the second transmission filter 20, each of the upper electrodes 280 of the acoustic wave resonators 24 constitutes the functional electrode 28. In the second transmission filter 20, the upper electrode 280 of the second acoustic wave resonator 24A constitutes the second functional electrode 28A. A material of the piezoelectric film 279 is, for example, AlN, ScAlN, LiTaO$_3$, LiNbO$_3$, or lead zirconate titanate (PZT). The BAW resonator constituting the acoustic wave resonator 24 includes a cavity 277 on the side of the lower electrode 278 opposite to the piezoelectric film 279 side. Therefore, the second functional electrode 28A is formed on the second functional surface 211 of the second transmission filter 20 with the cavity 277, the lower electrode 278, and the piezoelectric film 279 interposed therebetween. The formation region of the second functional electrode 28A is a region of the second functional surface 211 overlapping the cavity 277. The BAW resonator constituting the acoustic wave resonator 24 is an FBAR, but is not limited to this, and may be an SMR.

(2) Effects

In the acoustic wave device ST1 according to Exemplary embodiment 3, the first acoustic wave resonator 14A and the second acoustic wave resonator 24A do not overlap each other in plan view in the thickness direction D3 of the second transmission filter 20. That is, in the acoustic wave device ST1 according to Exemplary embodiment 3, the formation region of the first functional electrode 18A and the formation region of the second functional electrode 28A do not overlap each other in plan view in the thickness direction D3 of the second transmission filter 20. As a result, with the acoustic wave device ST1 according to Exemplary embodiment 3, it is possible to suppress the deterioration in the filter characteristics of each of the first transmission filter 10 and the second transmission filter 20 due to the temperature rise in the first transmission filter 10 and the second transmission filter 20.

Exemplary Embodiment 4

Figure 23:
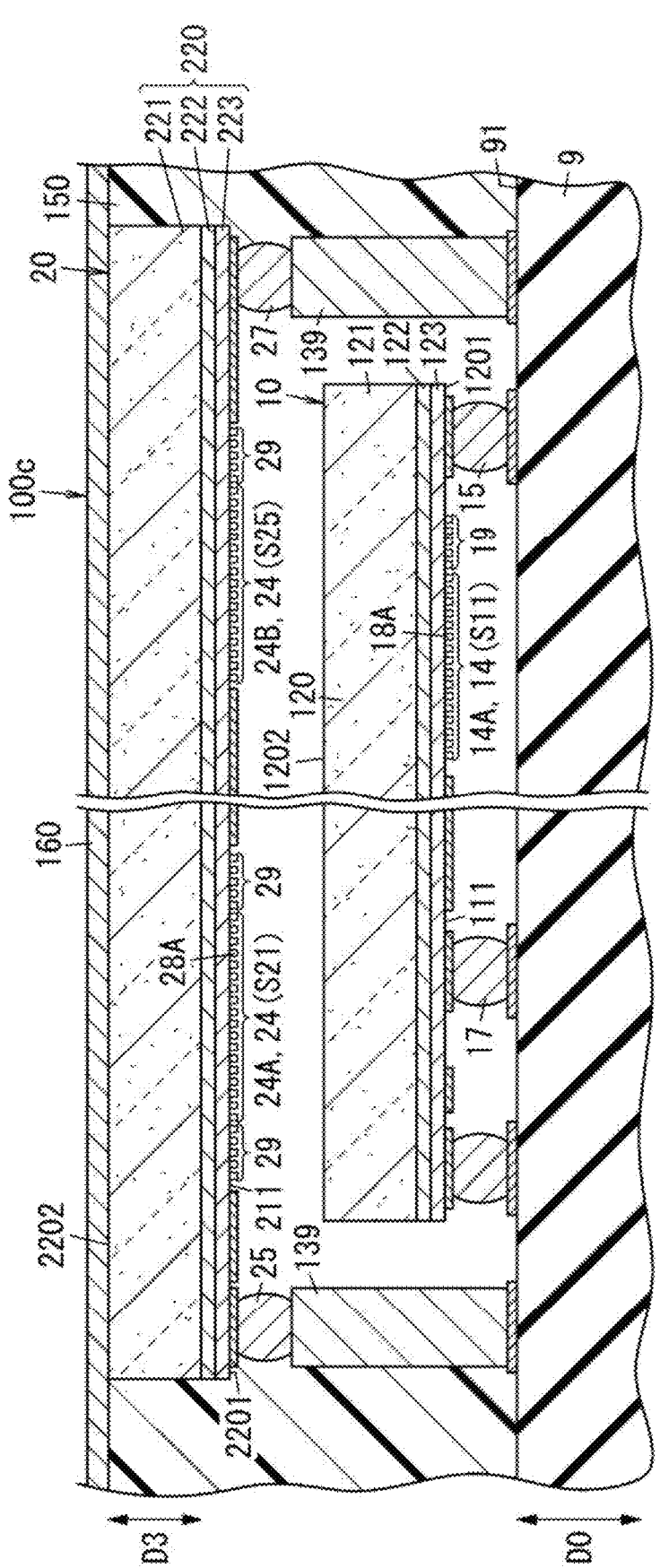
FIG. 23 is a cross-sectional view of a radio frequency module according to Exemplary embodiment 4.
Figure 24:
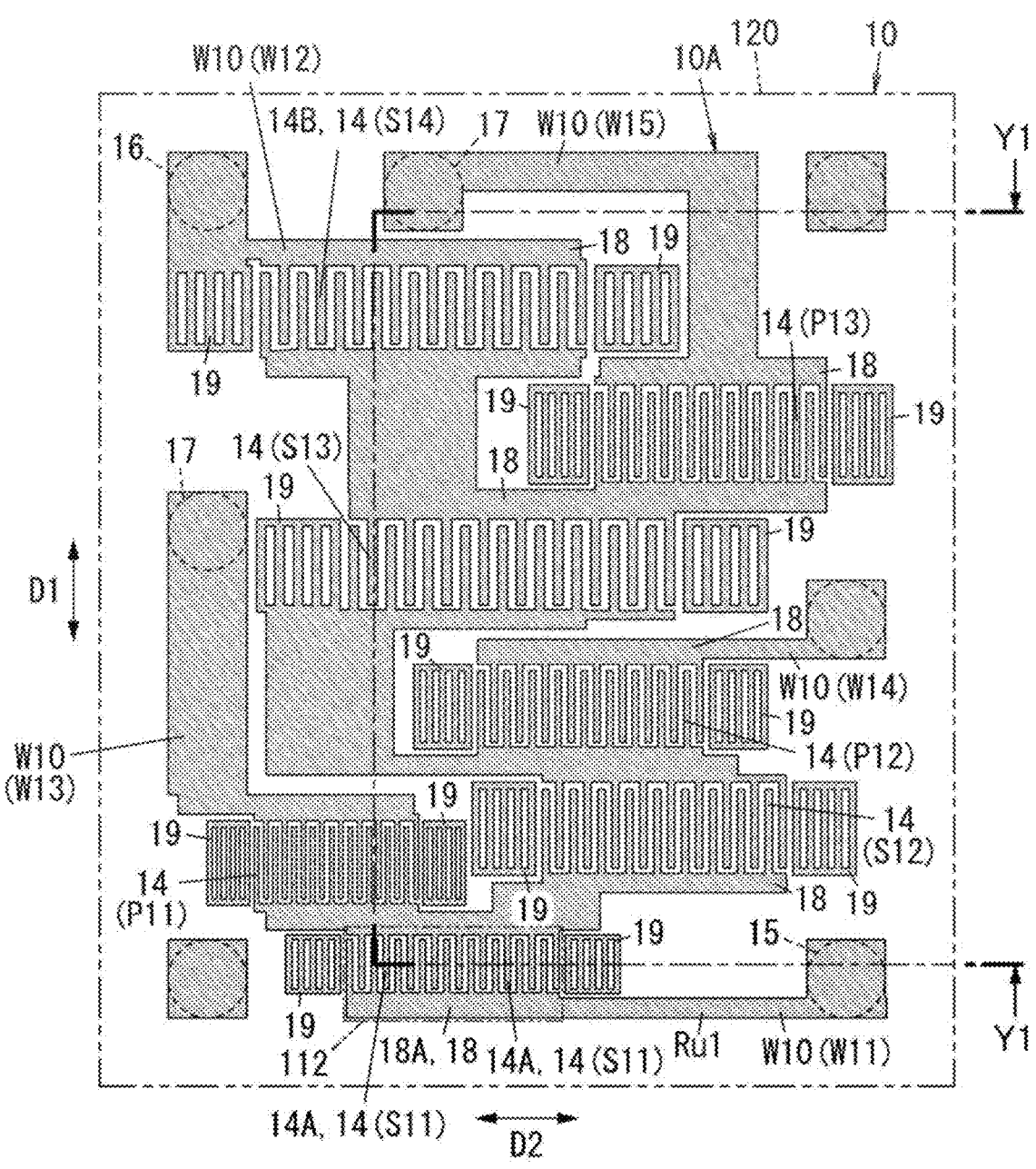
FIG. 24 is a perspective view illustrating a lower surface of a first transmission filter in the radio frequency module when seen from an upper surface side of the first transmission filter.
Figure 25:
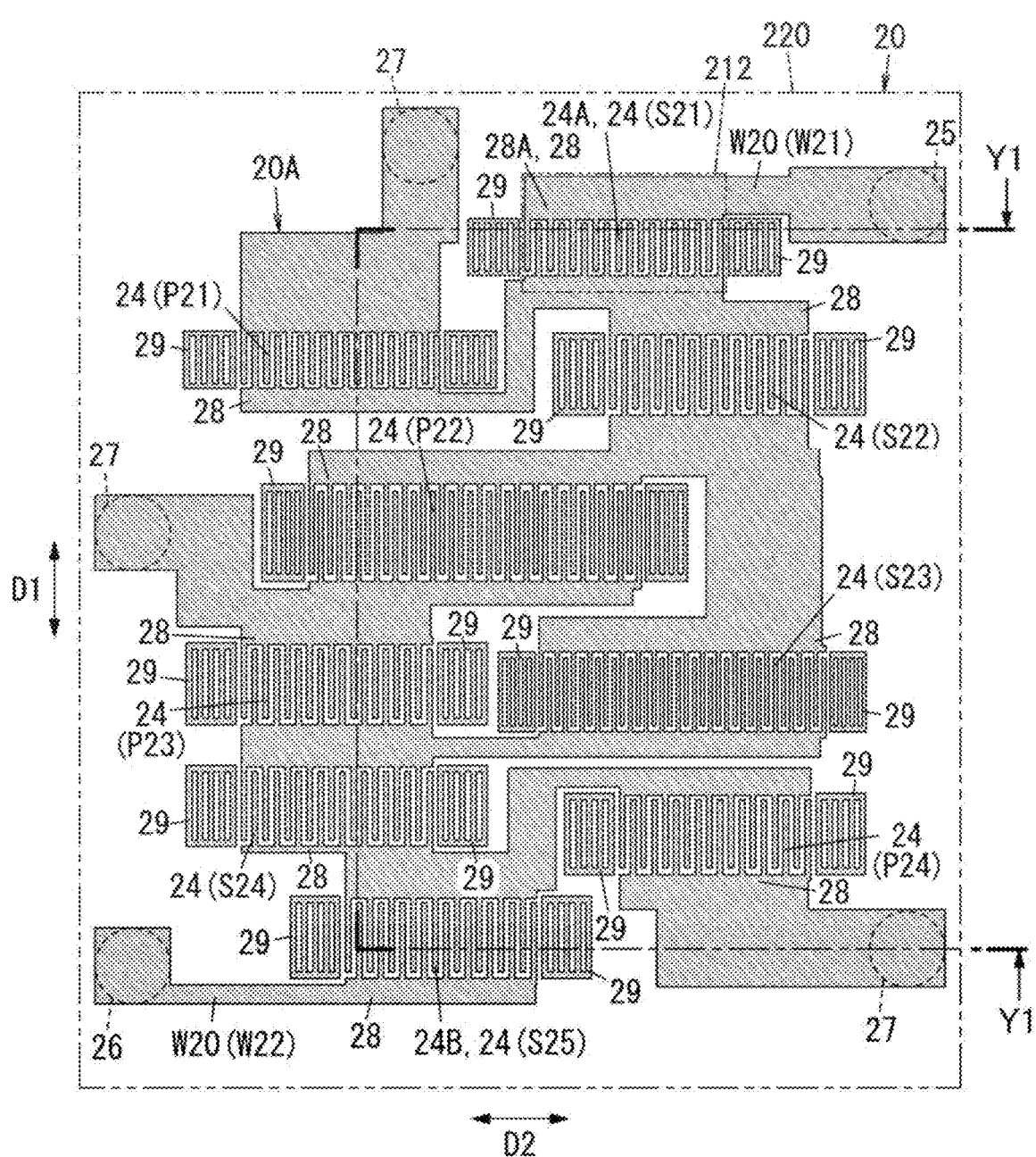
FIG. 25 is a perspective view illustrating a lower surface of a second transmission filter in the radio frequency module when seen from an upper surface side of the second transmission filter.

A radio frequency module 100c according to Exemplary embodiment 4 will be described with reference to FIGS. 23 to 25. Regarding the radio frequency module 100c according to Exemplary embodiment 4, the same constituent elements as those of the radio frequency module 100 according to Exemplary embodiment 1 are denoted by the same reference numerals, and the description thereof is omitted.

(1) Configuration

The radio frequency module 100c according to Exemplary embodiment 4 is similar to the radio frequency module 100 according to Exemplary embodiment 1 in that the second transmission filter 20 and the first transmission filter 10 overlap each other in the thickness direction D3 of the second transmission filter 20, but the radio frequency module 100c according to Exemplary embodiment 4 is different from the radio frequency module 100 according to Exemplary embodiment 1 in that the second transmission filter 20 is not stacked on the first transmission filter 10. In the radio frequency module 100c according to Exemplary embodiment 4, the first communication band is, for example, Band 1 of the 3GPP LTE standard or n1 of the 5G NR standard. The second communication band is, for example, Band 41 of the 3GPP LTE standard or n41 of the 5G NR standard.

In the radio frequency module 100c according to Exemplary embodiment 4, an outer size (chip size) of the second transmission filter 20 is larger than an outer size (chip size) of the first transmission filter 10 in plan view in the thickness direction D3 of the second transmission filter 20. The first transmission filter 10 in FIG. 23 corresponds to a cross-sectional view of the first transmission filter 10 in FIG. 24, which is taken along a Y1-Y1 line, and the second transmission filter 20 in FIG. 23 corresponds to a cross-sectional view of the second transmission filter 20 in FIG. 25, which is taken along a Y1-Y1 line. The layout of the plurality of acoustic wave resonators 14 of the first transmission filter 10 in the radio frequency module 100c according to Exemplary embodiment 4 is different from the layout of the plurality of acoustic wave resonators 14 of the first transmission filter 10 in the radio frequency module 100 according to Exemplary embodiment 1. In addition, the layout of the plurality of acoustic wave resonators 24 of the second transmission filter 20 in the radio frequency module 100c according to Exemplary embodiment 4 is different from the layout of the plurality of acoustic wave resonators 24 of the second transmission filter 20 in the radio frequency module 100 according to Exemplary embodiment 1. In FIG. 24, each functional electrode (IDT electrode) 18, each reflector 19, and each wiring portion W10 are hatched with dots, but the hatching does not represent a cross section, as in FIG. 6. Further, in FIG. 25, each functional electrode (IDT electrode) 28, each reflector 29, and each wiring portion W20 are hatched with dots, but the hatching does not represent a cross section, as in FIG. 7.

In the radio frequency module 100c, the first transmission filter 10 is mounted on the first main surface 91 of the mounting substrate 9 such that the first main surface 1201 of the first substrate 120 is located on the mounting substrate 9 side and the second main surface 1202 of the first substrate 120 is located on the second transmission filter 20 side. In addition, the second transmission filter 20 is mounted on the first main surface 91 of the mounting substrate 9 such that the third main surface 2201 of the second substrate 220 is located on the first transmission filter 10 side and the fourth main surface 2202 is located on the side opposite to the first transmission filter 10 side.

The first transmission filter 10 in the radio frequency module 100c does not include the plurality of via conductors V0 (see FIG. 8) that passes through, in the thickness direction, the first substrate 120 in the first transmission filter 10 of the radio frequency module 100 according to Exemplary embodiment 1. In the first transmission filter 10 in the radio frequency module 100c, the first input terminal 15, the first output terminal 16, and the plurality of ground terminals 17 are disposed on the first main surface 1201 of the first substrate 120. Further, the radio frequency module 100c includes a plurality of conductive connection members 139 that are connected to the second input terminal 25, the second output terminal 26, and the plurality of ground terminals 27, respectively, of the second transmission filter 20, and the radio frequency module 100c is connected to the mounting substrate 9 by using the plurality of conductive connection members 139. Each of the plurality of conductive connection members 139 has conductivity. A material of the plurality of conductive connection members 139 is, for example, metal (for example, copper or a copper alloy). Each of the plurality of conductive connection members 139 is a columnar electrode (for example, a cylindrical electrode). A length of each of the plurality of conductive connection members 139 in the thickness direction D0 of the mounting substrate 9 is determined to be longer than the thickness of the first transmission filter 10 such that the hollow space 131 is formed between the second transmission filter 20 and the first transmission filter 10. Although the plurality of conductive connection members 139 are disposed on the first main surface 91 of the mounting substrate 9 by bonding the columnar electrodes to the first main surface 91 of the mounting substrate 9, the present disclosure is not limited to this. The plurality of conductive connection members 139 may be formed by plating growth, may be disposed by bonding a copper core ball to the first main surface 91 of the mounting substrate 9, or may be formed by soldering.

(2) Effects

The radio frequency module 100c according to Exemplary embodiment 4 includes the mounting substrate 9, the first transmission filter 10, and the second transmission filter 20. The first transmission filter 10 is disposed on the mounting substrate 9. The second transmission filter 20 is disposed above the first transmission filter 10 by using the conductive connection member 139 connected to the mounting substrate 9. The first transmission filter 10 includes the first input terminal 15 connected to the first power amplifier 101 (see FIGS. 1 and 3), and the first acoustic wave resonator 14A located closest to the first input terminal 15. The second transmission filter 20 includes the second input terminal 25 connected to the second power amplifier 102 (see FIGS. 1 and 3), and the second acoustic wave resonator 24A located closest to the second input terminal 25. The first acoustic wave resonator 14A includes the first functional electrode 18A formed on the first functional surface 111. The second acoustic wave resonator 24A includes the second functional electrode 28A formed on the second functional surface 211. The second transmission filter 20 is disposed to face the first transmission filter 10 in the thickness direction D3 of the second transmission filter 20. The formation region 112 of the first functional electrode 18A and the formation region 212 of the second functional electrode 28A do not overlap each other in plan view in the thickness direction D3 of the second transmission filter 20.

With the radio frequency module 100c according to Exemplary embodiment 4, it is possible to suppress the deterioration in the filter characteristics of each of the first transmission filter 10 and the second transmission filter 20 due to the temperature rise in the first transmission filter 10 and the second transmission filter 20. In an acoustic wave device according to a comparative example including two transmission filters (first transmission filter and second transmission filter), in which the two transmission filters are stacked, and a formation region of a functional electrode close to the input terminal in the first transmission filter and a formation region of a functional electrode close to the input terminal in the second transmission filter are disposed to overlap each other, the first transmission filter and the second transmission filter are affected by heat from each other, leading to a high possibility of the deterioration in the filter characteristics due to the temperature rise in the acoustic wave resonator close to the input terminal in each of the first transmission filter and the second transmission filter. On the other hand, the radio frequency module 100c according to Exemplary embodiment 4 includes the first transmission filter 10 disposed on the mounting substrate 9, and the second transmission filter 20 connected to the mounting substrate 9 by using the conductive connection member 139 and disposed above the first transmission filter 10 to face the first transmission filter 10, in which the formation region 112 of the first functional electrode 18A of the first acoustic wave resonator 14A and the formation region 212 of the second functional electrode 28A of the second acoustic wave resonator 24A do not overlap each other in plan view in the thickness direction D3 of the second transmission filter 20. As a result, in the radio frequency module 100c according to Exemplary embodiment 4, it is possible to suppress the temperature rise in each of the first acoustic wave resonator 14A and the second acoustic wave resonator 24A. As a result, in the radio frequency module 100c according to Exemplary embodiment 4, it is possible to suppress the decrease in the voltage withstand capability of each of the first transmission filter 10 and the second transmission filter 20, and it is possible to suppress the deterioration in the filter characteristics due to the temperature rise.

In the radio frequency module 100c according to Exemplary embodiment 4, the series arm resonator S11, the series arm resonator S12, the parallel arm resonator P11, and the parallel arm resonator P12 of the first transmission filter 10 do not overlap any of the series arm resonator S21, the series arm resonator S22, the parallel arm resonator P21, and the parallel arm resonator P22 of the second transmission filter 20 in plan view in the thickness direction D3 of the second transmission filter 20. As a result, in the radio frequency module 100c according to Exemplary embodiment 4, it is possible to further suppress the deterioration in the filter characteristics due to the temperature rise in the first transmission filter 10 and the second transmission filter 20 during the simultaneous communication.

Further, in the radio frequency module 100c according to Exemplary embodiment 4, the functional electrodes 18 of the plurality of acoustic wave resonators 14 of the first transmission filter 10 are located on the mounting substrate 9 side. As a result, in the radio frequency module 100c according to Exemplary embodiment 4, the first functional surface 111 and the second functional surface 211 do not face each other, and the formation region 112 of the first functional electrode 18A and the formation region 212 of the second functional electrode 28A do not face each other. As a result, in the radio frequency module 100c, the first acoustic wave resonator 14A and the second acoustic wave resonator 24A are even less likely to be affected by heat from each other. Therefore, the radio frequency module 100c can further suppress the deterioration in the filter characteristics of each of the first transmission filter 10 and the second transmission filter 20 due to the temperature rise in the first acoustic wave resonator 14A and the second acoustic wave resonator 24A.

Other Modification Examples

Exemplary embodiments 1 to 4 and the like described above are merely one of various exemplary embodiments of the present disclosure. Exemplary embodiments 1 to 4 and the like described above can have various modifications according to the design and the like as long as the object of the present disclosure can be achieved, and different constituent elements of different exemplary embodiments may be combined as appropriate.

For example, in the acoustic wave device ST1 in the radio frequency modules 100, 100a, and 100c, at least one acoustic wave resonator 14 among the plurality of acoustic wave resonators 14 may include, for example, a plurality of (for example, two or three) split resonators. The plurality of split resonators are resonators obtained by splitting one acoustic wave resonator 14, and are connected in series not via any other acoustic wave resonators 14 between the split resonators and not via any connection node with a route including the other acoustic wave resonators 14.

Further, in the acoustic wave device ST1 in the radio frequency modules 100, 100a, and 100c, at least one acoustic wave resonator 24 among the plurality of acoustic wave resonators 24 may include, for example, a plurality of (for example, two or three) split resonators. The plurality of split resonators are resonators obtained by splitting one acoustic wave resonator 24, and are connected in series not via any other acoustic wave resonators 24 between the split resonators and not via any connection node with a route including the other acoustic wave resonators 24.

Further, the radio frequency modules 100, 100a, 100b, and 100c need only include at least the first transmission filter 10 and the second transmission filter 20 as filters, and may have a configuration in which the third transmission filter 30, the first reception filter 40, and the second reception filter 50 are not included.

In the radio frequency modules 100a and 100b, the shield electrode 135 is not limited to being disposed to overlap only the second functional electrode 28A out of the second functional electrode 28A of the second acoustic wave resonator 24A and the first functional electrode 18A of the first acoustic wave resonator 14A in plan view in the thickness direction D3 of the second transmission filter 20. For example, the shield electrode 135 may be disposed to overlap only the first functional electrode 18A of the first acoustic wave resonator 14A out of the second functional electrode 28A of the second acoustic wave resonator 24A and the first functional electrode 18A of the first acoustic wave resonator 14A in plan view in the thickness direction D3 of the second transmission filter 20. In addition, the shield electrode 135 may be disposed to overlap both the second functional electrode 28A of the second acoustic wave resonator 24A and the first functional electrode 18A of the first acoustic wave resonator 14A in plan view in the thickness direction D3 of the second transmission filter 20. Further, the shield electrode 135 may be disposed to overlap at least one of the second functional electrode 28A of the second acoustic wave resonator 24A and the first functional electrode 18A of the first acoustic wave resonator 14A, and the functional electrode 18 of one or more acoustic wave resonators 14 other than the first acoustic wave resonator 14A in plan view in the thickness direction D3 of the second transmission filter 20. In addition, the shield electrode 135 may be disposed to overlap at least one of the second functional electrode 28A of the second acoustic wave resonator 24A and the first functional electrode 18A of the first acoustic wave resonator 14A, and the functional electrode 28 of one or more acoustic wave resonators 24 other than the second acoustic wave resonator 24A in plan view in the thickness direction D3 of the second transmission filter 20.

The combination of the first communication band and the second communication band is not limited to the above-described example. For example, the first communication band may be Band 1 of a 3GPP LTE standard, Band 3 of the 3GPP LTE standard, Band 66 of the 3GPP LTE standard, Band 39 of the 3GPP LTE standard, or Band 40 of the 3GPP LTE standard, and the second communication band may be Band 41 of the 3GPP LTE standard. Further, the first communication band may be Band 1 of a 3GPP LTE standard, Band 66 of the 3GPP LTE standard, Band 39 of the 3GPP LTE standard, or Band 40 of the 3GPP LTE standard, and the second communication band may be Band 3 of the 3GPP LTE standard.

Further, the radio frequency module 100 may have a configuration in which the plurality of external connection terminals T0 are ball bumps, and the second resin layer 170 is not included. In this case, the radio frequency module 100 may include an underfill portion provided in a gap between each of the first switch 6, the second switch 7, and the third switch 8, which are mounted on the second main surface 92 of the mounting substrate 9, and the second main surface 92 of the mounting substrate 9. A material of the ball bump constituting each of the plurality of external connection terminals T0 is, for example, gold, copper, or solder. As the plurality of external connection terminals T0, the external connection terminal T0 including a ball bump and the external connection terminal T0 including a columnar electrode may be mixed.

Further, the communication device 300 according to Exemplary embodiment 1 may include any one of the radio frequency modules 100a, 100b, and 100c instead of the radio frequency module 100.

(Aspects)

The present specification discloses the following aspects.

A first aspect provides an acoustic wave device (ST1) including a first transmission filter (10) and a second transmission filter (20). In the acoustic wave device (ST1), the first transmission filter (10) and the second transmission filter (20) are stacked with a first functional surface (111) of the first transmission filter (10) and a second functional surface (211) of the second transmission filter (20) being disposed to face each other at a predetermined distance (H1).

The first transmission filter (10) includes a first input terminal (15) and a first acoustic wave resonator (14A) closest to the first input terminal (15). The second transmission filter (20) includes a second input terminal (25) and a second acoustic wave resonator (24A) closest to the second input terminal (25). The first acoustic wave resonator (14A) includes a first functional electrode (18A) formed on the first functional surface (111). The second acoustic wave resonator (24A) includes a second functional electrode (28A) formed on the second functional surface (211). A formation region of the first functional electrode (18A) and a formation region of the second functional electrode (28A) do not overlap each other in plan view in a thickness direction (D3) of the second transmission filter (20).

With the acoustic wave device (ST1) according to the first aspect, it is possible to suppress the deterioration in the filter characteristics of each of the first transmission filter (10) and the second transmission filter (20) due to the temperature rise in the first transmission filter (10) and the second transmission filter (20).

A second aspect provides the acoustic wave device (ST1) according to the first aspect, in which the first transmission filter (10) includes a first acoustic wave filter (10A). The first acoustic wave filter (10A) includes the first acoustic wave resonator (14A) and has a pass band including a frequency band of a first communication band. The second transmission filter (20) includes a second acoustic wave filter (20A). The second acoustic wave filter (20A) includes the second acoustic wave resonator (24A) and has a pass band including a frequency band of a second communication band. The first communication band and the second communication band are communication bands available for simultaneous communication.

With the acoustic wave device (ST1) according to the second aspect, it is possible to suppress the temperature rise in each of the first transmission filter (10) and the second transmission filter (20) when the acoustic wave device (ST1) is used for the simultaneous communication, and it is possible to suppress the deterioration in the filter characteristics of each of the first transmission filter (10) and the second transmission filter (20).

A third aspect provides the acoustic wave device (ST1) according to the second aspect, in which the first communication band is Band 1 of a 3GPP LTE standard, Band 3 of the 3GPP LTE standard, Band 66 of the 3GPP LTE standard, Band 39 of the 3GPP LTE standard, or Band 40 of the 3GPP LTE standard, and the second communication band is Band 41 of the 3GPP LTE standard.

A fourth aspect provides the acoustic wave device (ST1) according to the second aspect, in which the first communication band is Band 1 of a 3GPP LTE standard, Band 66 of the 3GPP LTE standard, Band 39 of the 3GPP LTE standard, or Band 40 of the 3GPP LTE standard, and the second communication band is Band 3 of the 3GPP LTE standard.

A fifth aspect provides the acoustic wave device (ST1) according to any one of the first to fourth aspects, in which the first transmission filter (10) is a ladder filter including a plurality of acoustic wave resonators (14) including the first acoustic wave resonator (14A), and the second transmission filter (20) is a ladder filter including a plurality of acoustic wave resonators (24) including the second acoustic wave resonator (24A).

A sixth aspect provides the acoustic wave device (ST1) according to the fifth aspect, in which the first acoustic wave resonator (14A) of the first transmission filter (10) overlaps at least one acoustic wave resonator (24) other than the second acoustic wave resonator (24A) among the plurality of acoustic wave resonators (24) of the second transmission filter (20) in plan view in the thickness direction (D3) of the second transmission filter (20).

With the acoustic wave device (ST1) according to the sixth aspect, it is possible to suppress the size increase in the second transmission filter (20).

A seventh aspect provides the acoustic wave device (ST1) according to the sixth aspect, in which the second transmission filter (20) includes an output terminal (second output terminal 26). The plurality of acoustic wave resonators (24) of the second transmission filter (20) include a fourth acoustic wave resonator (24B) closest to the output terminal (second output terminal 26) of the second transmission filter (20). The first acoustic wave resonator (14A) and the fourth acoustic wave resonator (24B) overlap each other in plan view in the thickness direction (D3) of the second transmission filter (20).

With the acoustic wave device (ST1) according to the seventh aspect, it is possible to suppress the size increase in the second transmission filter (20).

An eighth aspect provides the acoustic wave device (ST1) according to the fifth aspect, in which the second acoustic wave resonator (24A) of the second transmission filter (20) overlaps at least one acoustic wave resonator (14) other than the first acoustic wave resonator (14A) among the plurality of acoustic wave resonators (14) of the first transmission filter (10) in plan view in the thickness direction (D3) of the second transmission filter (20).

With the acoustic wave device (ST1) according to the eighth aspect, it is possible to suppress the size increase in the second transmission filter (20).

A ninth aspect provides the acoustic wave device (ST1) according to the eighth aspect, in which the first transmission filter (10) includes an output terminal (first output terminal 16). The plurality of acoustic wave resonators (14) of the first transmission filter (10) include a third acoustic wave resonator (14B) closest to the output terminal (first output terminal 16) of the first transmission filter (10). The second acoustic wave resonator (24A) and the third acoustic wave resonator (14B) overlap each other in plan view in the thickness direction (D3) of the second transmission filter (20).

With the acoustic wave device (ST1) according to the ninth aspect, it is possible to suppress the size increase in the first transmission filter (10) and the second transmission filter (20).

A tenth aspect provides the acoustic wave device (ST1) according to the first or second aspect, in which the first transmission filter (10) includes a first output terminal (16). The second transmission filter (20) includes a second output terminal (26). The first transmission filter (10) includes a third acoustic wave resonator (14B) closest to the first output terminal (16) of the first transmission filter (10). The second transmission filter (20) includes a fourth acoustic wave resonator (24B) closest to the second output terminal (26) of the second transmission filter (20). The third acoustic wave resonator (14B) and the fourth acoustic wave resonator (24B) overlap each other in plan view in the thickness direction (D3) of the second transmission filter (20).

With the acoustic wave device (ST1) according to the tenth aspect, it is possible to suppress the size increase in the first transmission filter (10) and the second transmission filter (20).

An eleventh aspect provides the acoustic wave device (ST1) according to any one of the first to tenth aspects, in which each of the first acoustic wave resonator (14A) and the second acoustic wave resonator (24A) is a SAW resonator.

A twelfth aspect provides the acoustic wave device (ST1) according to any one of the first to tenth aspects, in which each of the first acoustic wave resonator (14A) and the second acoustic wave resonator (24A) is a BAW resonator.

A thirteenth aspect provides a radio frequency module (100; 100a; 100b) including a mounting substrate (9), and the acoustic wave device (ST1) according to any one of the first to twelfth aspects. The mounting substrate (9) includes a main surface (91). The acoustic wave device (ST1) is disposed on the main surface (91) of the mounting substrate (9).

With the radio frequency module (100; 100a; 100b) according to the thirteenth aspect, it is possible to suppress the deterioration in the filter characteristics of the first transmission filter (10) and the second transmission filter (20) due to the temperature rise in the first transmission filter (10) and the second transmission filter (20).

A fourteenth aspect provides the radio frequency module (100; 100a; 100b) according to the thirteenth aspect, further including a resin layer (150), and a metal electrode layer (160). The resin layer (150) is disposed on the main surface (91) of the mounting substrate (9). The resin layer (150) covers at least a part of an outer peripheral surface (13) of the first transmission filter (10) and at least a part of an outer peripheral surface (23) of the second transmission filter (20). The metal electrode layer (160) covers at least a part of the resin layer (150). The metal electrode layer (160) is in contact with a main surface (fourth main surface 22) of the second transmission filter (20) on a side opposite to a first transmission filter (10) side.

With the radio frequency modules (100, 100a, and 100b) according to the fourteenth aspect, it is possible to improve the heat dissipation.

A fifteenth aspect provides the radio frequency module (100a) according to the thirteenth or fourteenth aspect, in which the acoustic wave device (ST1) further includes a spacer portion (130), and a shield electrode (135). The spacer portion (130) is interposed between the first transmission filter (10) and the second transmission filter (20) in the thickness direction (D3) of the second transmission filter (20). The shield electrode (135) is disposed in a hollow space (131) surrounded by the first transmission filter (10), the second transmission filter (20), and the spacer portion (130). The first transmission filter (10) includes a first substrate (120) including the first functional surface (111). The second transmission filter (20) includes a second substrate (220) including the second functional surface (211). The shield electrode (135) is disposed between the first transmission filter (10) and the second transmission filter (20) in the thickness direction (D3) of the second transmission filter (20) and overlaps the second functional electrode (28A). The acoustic wave device (ST1) includes a cavity (138) between the shield electrode (135) and the second functional electrode (28A). The mounting substrate (9) further includes a ground electrode (95) to which the shield electrode (135) is connected.

With the radio frequency module (100a) according to the fifteenth aspect, it is possible to improve the isolation between the first transmission filter (10) and the second transmission filter (20).

A sixteenth aspect provides the radio frequency module (100a) according to the fifteenth aspect, in which the ground electrode (95) overlaps the first acoustic wave resonator (14A) in plan view in the thickness direction (D3) of the second transmission filter (20).

With the radio frequency module (100a) according to the sixteenth aspect, it is possible to easily dissipate the heat generated by the first acoustic wave resonator (14A) through the shield electrode (135) and the ground electrode (95), and it is possible to further improve the heat dissipation.

A seventeenth aspect provides the radio frequency module (100a) according to the fifteenth or sixteenth aspect, in which the acoustic wave device (ST1) further includes a ground conductor portion (137). The ground conductor portion (137) is located between the first transmission filter (10) and the second transmission filter (20) in the thickness direction (D3) of the second transmission filter (20). The ground conductor portion (137) connects the first transmission filter (10) and the second transmission filter (20). The second transmission filter (20) further includes a ground terminal (27). The first transmission filter (10) further includes a ground via conductor (V7). The ground via conductor (V7) passes through the first substrate (120) in a thickness direction and connected to the ground terminal (27) of the second transmission filter (20) with the ground conductor portion (137) interposed between the ground via conductor (V7) and the ground terminal (27). The ground via conductor (V7) is connected to the ground electrode (95).

With the radio frequency module (100a) according to the seventeenth aspect, the heat generated by the first acoustic wave resonator (14A) of the first transmission filter (10) is less likely to be transmitted to the second transmission filter (20).

An eighteenth aspect provides a radio frequency module (100c) including a mounting substrate (9), a first transmission filter (10), and a second transmission filter (20). The first transmission filter (10) is disposed on the mounting substrate (9). The second transmission filter (20) is disposed above the first transmission filter (10) by using a conductive connection member (139) connected to the mounting substrate (9). The first transmission filter (10) includes a first input terminal (15) connected to a first power amplifier (101), and a first acoustic wave resonator (14A) closest to the first input terminal (15). The second transmission filter (20) includes a second input terminal (25) connected to a second power amplifier (102), and a second acoustic wave resonator (24A) closest to the second input terminal (25). The first acoustic wave resonator (14A) includes a first functional electrode (18A) formed on a first functional surface (111). The second acoustic wave resonator (24A) includes a second functional electrode (28A) formed on a second functional surface (211). The second transmission filter (20) is disposed to face the first transmission filter (10) in a thickness direction (D3) of the second transmission filter (20). A formation region (112) of the first functional electrode (18A) and a formation region (212) of the second functional electrode (28A) do not overlap each other in plan view in the thickness direction (D3) of the second transmission filter (20).

With the radio frequency module (100c) according to the eighteenth aspect, it is possible to suppress the deterioration in the filter characteristics of the first transmission filter (10) and the second transmission filter (20) due to the temperature rise in the first transmission filter (10) and the second transmission filter (20).

A nineteenth aspect provides the radio frequency module (100c) according to the eighteenth aspect, in which the formation region (112) of the first functional electrode (18A)

and the formation region (212) of the second functional electrode (28A) do not face each other.

With the radio frequency module (100c) according to the nineteenth aspect, since the formation region (112) of the first functional electrode (18A) and the formation region (212) of the second functional electrode (28A) do not face each other, the first acoustic wave resonator (14A) and the second acoustic wave resonator (24A) are less likely to be affected by heat from each other, and it is possible to further suppress the deterioration of the filter characteristics in each of the first transmission filter (10) and the second transmission filter (20) due to the temperature rise in the first acoustic wave resonator (14A) and the second acoustic wave resonator (24A).

A twentieth aspect provides a communication device (300) including the radio frequency module (100; 100a; 100b; 100c) according to any one of the thirteenth to nineteenth aspects, and a signal processing circuit (301). The signal processing circuit (301) is connected to the radio frequency module (100; 100a; 100b; 100c).

With the communication device (300) according to the twentieth aspect, it is possible to suppress the deterioration in the filter characteristics of each of the first transmission filter (10) and the second transmission filter (20) due to the temperature rise in the first transmission filter (10) and the second transmission filter (20).

REFERENCE SIGNS LIST 6 first switch
60 common terminal
61, 62 selection terminal
7 second switch
70 common terminal
71, 72 selection terminal
8 third switch
80A first common terminal
80B second common terminal
81, 82 first selection terminal
83, 84 second selection terminal
9 mounting substrate
91 first main surface
92 second main surface
93 outer peripheral surface
95 ground electrode
10 first transmission filter
10A first acoustic wave filter
11 first main surface
12 second main surface
111 first functional surface
112 formation region
120 first substrate
1201 first main surface
1202 second main surface
121 high acoustic velocity member
122 low acoustic velocity film
123 piezoelectric layer
125 connection terminal
126 connection terminal
13 outer peripheral surface
14 acoustic wave resonator
14A first acoustic wave resonator
14B third acoustic wave resonator
15 first input terminal
16 first output terminal
17 ground terminal
18 functional electrode 18A first functional electrode
181 first electrode finger
182 second electrode finger
183 first busbar
184 second busbar
19 reflector
20 second transmission filter
20A second acoustic wave filter
21 third main surface
22 fourth main surface
211 second functional surface
212 formation region
220 second substrate
2201 third main surface
2202 fourth main surface
221 high acoustic velocity member
222 low acoustic velocity film
223 piezoelectric layer
23 outer peripheral surface
24 acoustic wave resonator
24A second acoustic wave resonator
24B fourth acoustic wave resonator
25 second input terminal
26 second output terminal
27 ground terminal
28 functional electrode
28A second functional electrode
281 first electrode finger
282 second electrode finger
283 first busbar
284 second busbar
29 reflector
30 third transmission filter
35 third input terminal
36 third output terminal
40 first reception filter
50 second reception filter
100, 100a, 100b, 100c radio frequency module
101 first power amplifier
102 second power amplifier
103 first output matching circuit
104 second output matching circuit
105 first matching circuit
106 second matching circuit
107 first low noise amplifier
108 second low noise amplifier
109 first input matching circuit
110 second input matching circuit
124 electrical insulating film
128 resist layer
130 spacer portion
131 hollow space
135 shield electrode
137 ground conductor portion
138 cavity
139 conductive connection member
140 electronic component
141 output terminal
142 output terminal
143 common input terminal
150 resin layer (first resin layer)
160 metal electrode layer
170 second resin layer
177 cavity
178 lower electrode
179 piezoelectric film
180 upper electrode

300 communication device
301 signal processing circuit
302 RF signal processing circuit
303 baseband signal processing circuit
310 antenna
A103 area
A104 area
D0 thickness direction
D1 first direction
D2 second direction
D3 thickness direction
DMS1 longitudinally coupled resonator
DMS2 longitudinally coupled resonator
H1 predetermined distance
L5 inductor
L6 inductor
L9 inductor
L10 inductor
Ru1 signal route (series arm route)
Ru11 route
Ru12 route
Ru13 route
Ru2 signal route (series arm route)
Ru21 route
Ru22 route
Ru23 route
Ru24 route
S11 to S14 series arm resonator
S21 to S25 series arm resonator
P11 to P13 parallel arm resonator
P21 to P24 parallel arm resonator
R1 first connection conductor portion
ST1 acoustic wave device
T0 external connection terminal
T1 first signal input terminal
T2 second signal input terminal
T3 antenna terminal
T4 first signal output terminal
T5 second signal output terminal
T6 third signal output terminal
T7 fourth signal output terminal
T8 external ground terminal
V0 via conductor
V7 ground via conductor
W10 wiring portion
W11 first wiring portion
W12 second wiring portion
W13 third wiring portion
W14 fourth wiring portion
W15 fifth wiring portion
W16 sixth wiring portion
W17 seventh wiring portion
W20 wiring portion
W21 first wiring portion
W22 second wiring portion
W23 third wiring portion
W24 fourth wiring portion
The invention claimed is:

1. An acoustic wave device, comprising:
a first transmission filter; and
a second transmission filter stacked on the first transmission filter so that a first functional surface of the first transmission filter and a second functional surface of the second transmission filter face each other at a predetermined distance, wherein
the first transmission filter includes a first input terminal and a first plurality of acoustic wave resonators, the first plurality of acoustic wave resonators includes a first acoustic wave resonator,
the first acoustic wave resonator includes a first functional electrode on the first functional surface,
the second transmission filter includes a second input terminal, an output terminal and a second plurality of acoustic wave resonators,
the second plurality of acoustic wave resonators includes a second acoustic wave resonator and a third acoustic wave resonator,
the second acoustic wave resonator includes a second functional electrode on the second functional surface,
the third acoustic wave resonator is closer to the output terminal than the second acoustic wave resonator is to the output terminal, and
in a plan view along a thickness direction of the first and second transmission filters:
a first formation region of the first functional electrode and a second formation region of the second functional electrode do not overlap each other, and
the first acoustic wave resonator and the third acoustic wave resonator overlap each other.

2. The acoustic wave device according to claim 1, wherein
the first transmission filter includes a first acoustic wave filter including the first acoustic wave resonator and having a pass band including a frequency band of a first communication band,
the second transmission filter includes a second acoustic wave filter including the second acoustic wave resonator and having a pass band including a frequency band of a second communication band, and
the first communication band and the second communication band are communication bands available for simultaneous communication.

3. The acoustic wave device according to claim 2, wherein
the first communication band is Band 1 of a 3GPP LTE standard, Band 3 of the 3GPP LTE standard, Band 66 of the 3GPP LTE standard, Band 39 of the 3GPP LTE standard, or Band 40 of the 3GPP LTE standard, and
the second communication band is Band 41 of the 3GPP LTE standard.

4. The acoustic wave device according to claim 2, wherein
the first communication band is Band 1 of a 3GPP LTE standard, Band 66 of the 3GPP LTE standard, Band 39 of the 3GPP LTE standard, or Band 40 of the 3GPP LTE standard, and
the second communication band is Band 3 of the 3GPP LTE standard.

5. An acoustic wave device, comprising:
a first transmission filter; and
a second transmission filter stacked on the first transmission filter so that a first functional surface of the first transmission filter and a second functional surface of the second transmission filter face each other at a predetermined distance, wherein
the first transmission filter includes a first input terminal, a first output terminal and a first acoustic wave resonator,
the first acoustic wave resonator includes a first functional electrode on the first functional surface,
the second transmission filter includes a second input terminal, a second output terminal and a second acoustic wave resonator,
the second acoustic wave resonator includes a second functional electrode on the second functional surface,
the first transmission filter further includes a third acoustic wave resonator which is on the first functional surface and is closer to the first output terminal than the first acoustic wave resonator is to the first output terminal, the second transmission filter further includes a fourth acoustic wave resonator which is on the second functional surface and is closer to the second output terminal than the second acoustic wave resonator is to the second output terminal, and in a plan view along a thickness direction of the first and second transmission filters:

a first formation region of the first functional electrode and a second formation region of the second functional electrode do not overlap each other, and the third acoustic wave resonator and the fourth acoustic wave resonator overlap each other.

6. The acoustic wave device according to claim 1, wherein each of the first acoustic wave resonator and the second acoustic wave resonator is a surface acoustic wave (SAW) resonator.

7. The acoustic wave device according to claim 1, wherein each of the first acoustic wave resonator and the second acoustic wave resonator is a bulk acoustic wave (BAW) resonator.

8. A radio frequency module, comprising:

a mounting substrate including a main surface; and the acoustic wave device according to claim 1, which is disposed on the main surface of the mounting substrate.

9. The radio frequency module according to claim 8, further comprising:

a resin layer disposed on the main surface of the mounting substrate and covering at least a part of an outer peripheral surface of the first transmission filter and at least a part of an outer peripheral surface of the second transmission filter; and a metal electrode layer covering at least a part of the resin layer, wherein the metal electrode layer is in contact with a main surface of the second transmission filter on a side opposite to a first transmission filter side.

10. The radio frequency module according to claim 8, wherein the first transmission filter includes a plurality of longitudinally coupled resonators.

11. The radio frequency module according to claim 10, wherein the plurality of longitudinally coupled resonators is connected parallel.

12. The radio frequency module according to claim 8, wherein the acoustic wave device further includes a spacer portion interposed between the first transmission filter and the second transmission filter in the thickness direction, and a shield electrode disposed in a hollow space surrounded by the first transmission filter, the second transmission filter, and the spacer portion, the first transmission filter includes a first substrate including the first functional surface, the second transmission filter includes a second substrate including the second functional surface, the shield electrode overlaps the second functional electrode of the second acoustic wave resonator in the thickness direction, the acoustic wave device includes a cavity between the shield electrode and the second functional electrode, and the mounting substrate further includes a ground electrode to which the shield electrode is connected.

13. The radio frequency module according to claim 12, wherein the ground electrode overlaps the first acoustic wave resonator in the plan view in the thickness direction.

14. The radio frequency module according to claim 12, wherein the acoustic wave device further includes a ground conductor portion located between the first transmission filter and the second transmission filter in the thickness direction and connecting the first transmission filter and the second transmission filter, the second transmission filter further includes a ground terminal, the first transmission filter further includes a via conductor passing through the first substrate in the thickness direction and connected to the ground terminal with the ground conductor portion interposed between the via conductor and the ground terminal, and the via conductor is connected to the ground electrode.

15. The acoustic wave device according to claim 1, wherein in the plan view, an area of the first transmission filter is different than an area of the second transmission filter.

16. A radio frequency module, comprising:

a mounting substrate;

a first transmission filter disposed on the mounting substrate;

a second transmission filter disposed above the first transmission filter; and a conductive connection member connected to the mounting substrate and separating the second transmission filter from the substate, wherein the first transmission filter includes a first input terminal connected to a first power amplifier, and a first plurality of acoustic wave resonators, the first plurality of acoustic wave resonators includes a first acoustic wave resonator, the second transmission filter includes a second input terminal connected to a second power amplifier, an output terminal and a second plurality of acoustic wave resonators, the second plurality of acoustic wave resonators includes a second acoustic wave resonator and a third acoustic wave resonator, the first acoustic wave resonator further includes a first functional electrode on a first functional surface of the first transmission filter, the second acoustic wave resonator further includes a second functional electrode on a second functional surface of the second transmission filter, the second transmission filter is disposed to face the first transmission filter in a thickness direction of the second transmission filter, the third acoustic wave resonator is closer to the output terminal than the second acoustic wave resonator is to the output terminal, and in a plan view along a thickness direction of the first and second transmission filters:

a first formation region of the first functional electrode and a second formation region of the second functional electrode do not overlap each other, and the first acoustic wave resonator and the third acoustic wave resonator overlap each other.

17. The radio frequency module according to claim 16, wherein the first formation region of the first functional electrode and the second formation region of the second functional electrode do not face each other.

* * * * *